(12) United States Patent
Lee et al.

(10) Patent No.: US 11,967,554 B2
(45) Date of Patent: Apr. 23, 2024

(54) SEMICONDUCTOR DEVICES AND METHODS FOR MANUFACTURING THE SAME

(71) Applicant: Samsung Electronics Co., Ltd., Suwon-si (KR)

(72) Inventors: Jongjin Lee, Seoul (KR); Kyungwook Kim, Hwaseong-si (KR); Rakhwan Kim, Suwon-si (KR); Seungyong Yoo, Incheon (KR); Eun-Ji Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 18/053,487

(22) Filed: Nov. 8, 2022

(65) Prior Publication Data

US 2023/0064127 A1 Mar. 2, 2023

Related U.S. Application Data

(63) Continuation of application No. 17/235,984, filed on Apr. 21, 2021, now Pat. No. 11,587,867.

(30) Foreign Application Priority Data

Aug. 25, 2020 (KR) .................. 10-2020-0106870

(51) Int. Cl.
*H01L 23/522* (2006.01)
*H01L 23/532* (2006.01)
*H01L 29/45* (2006.01)

(52) U.S. Cl.
CPC .... *H01L 23/5226* (2013.01); *H01L 23/53238* (2013.01); *H01L 23/53252* (2013.01); *H01L 23/53266* (2013.01); *H01L 29/45* (2013.01)

(58) Field of Classification Search
CPC ..... H01L 23/522; H01L 23/532; H01L 23/48; H01L 23/481; H01L 23/485;
(Continued)

(56) References Cited

U.S. PATENT DOCUMENTS 6,150,268 A 11/2000 Iacoponi et al.
7,595,263 B2 9/2009 Chung et al.
(Continued)

*Primary Examiner* — Chuong A Luu
(74) *Attorney, Agent, or Firm* — Myers Bigel, P.A.

(57) ABSTRACT

Semiconductor devices includes a first interlayer insulating layer, a lower interconnection line in the first interlayer insulating layer, an etch stop layer on the first interlayer insulating layer and the lower interconnection line, a second interlayer insulating layer on the etch stop layer, and an upper interconnection line in the second interlayer insulating layer. The upper interconnection line includes a via portion extending through the etch stop layer and contacting the lower interconnection line. The via portion includes a barrier pattern and a conductive pattern. The barrier pattern includes a first barrier layer between the conductive pattern and the second interlayer insulating layer, and a second barrier layer between the conductive pattern and the lower interconnection line. A resistivity of the first barrier layer is greater than that of the second barrier layer. A nitrogen concentration of the first barrier layer is greater than that of the second barrier layer.

15 Claims, 55 Drawing Sheets

(58) Field of Classification Search
CPC .............. H01L 23/528; H01L 23/5226; H01L 23/53238; H01L 23/53252; H01L 23/53266; H01L 23/5221; H01L 23/5286; H01L 29/45; H01L 29/06; H01L 29/66; H01L 29/78; H01L 29/165; H01L 29/417; H01L 29/786; H01L 29/41766; H01L 29/41791; H01L 29/423; H01L 29/02; H01L 29/42392; H01L 29/66545; H01L 29/7848; H01L 29/78696; H01L 29/7827; H01L 29/0603; H01L 29/0684; H01L 21/768; H01L 21/8234; H01L 21/76805; H01L 21/823431; H01L 21/823475; H01L 21/76829; H01L 21/76844; H01L 21/76846; H01L 21/02; H01L 21/0203; H01L 2221/1063
USPC ........................................................ 257/288
See application file for complete search history.

(56) References Cited

U.S. PATENT DOCUMENTS

| | | |
|---|---|---|
| 8,907,483 B2 | 12/2014 | Zhao et al. |
| 9,425,093 B2 | 8/2016 | Ishizaka et al. |
| 9,793,213 B2 | 10/2017 | Demarest et al. |
| 10,049,921 B2 | 8/2018 | Draeger et al. |
| 10,128,147 B2 | 11/2018 | Clevenger et al. |
| 2011/0290320 A1* | 12/2011 | Ito ...................... H01L 31/1896 438/98 |
| 2021/0202255 A1* | 7/2021 | Luan ............... H01L 21/823431 |

\* cited by examiner

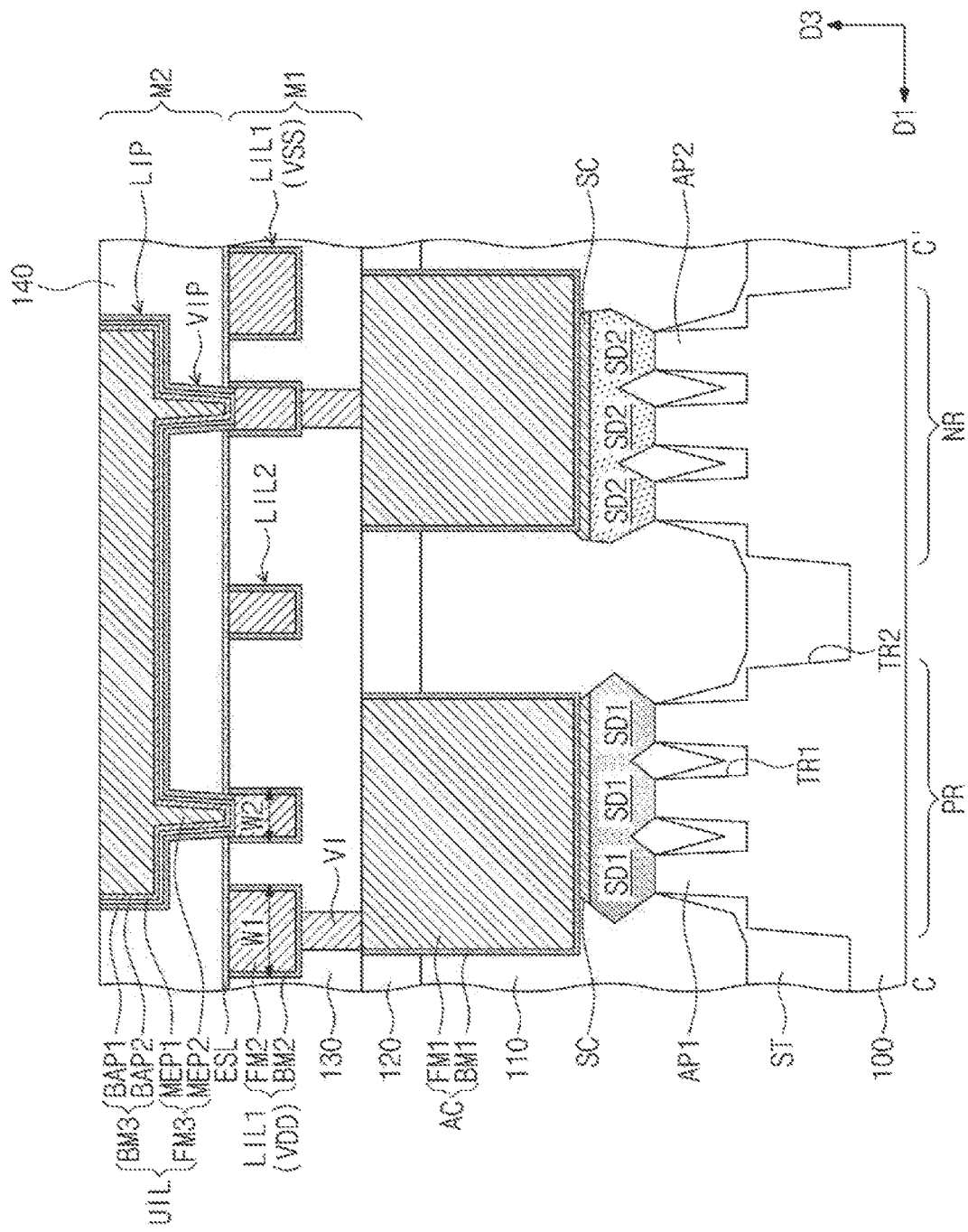

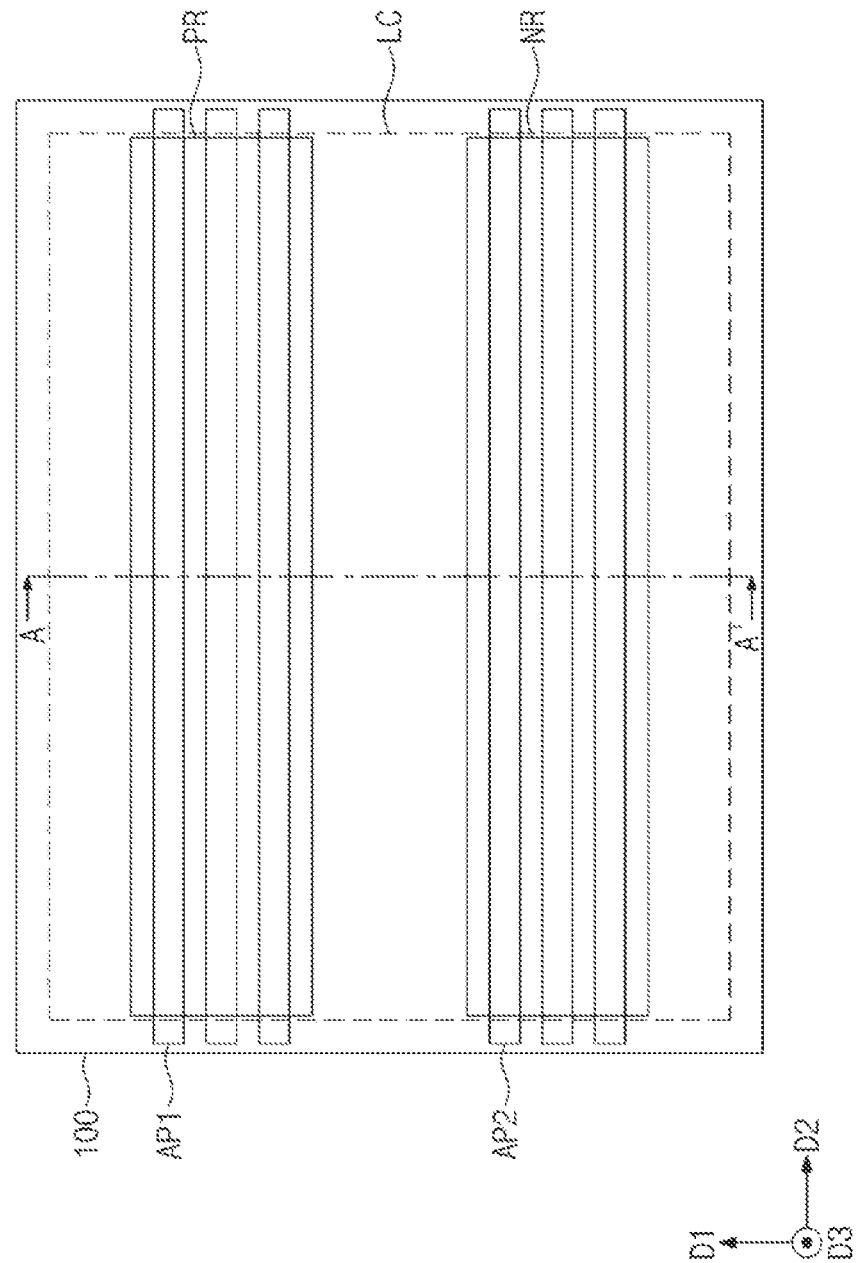

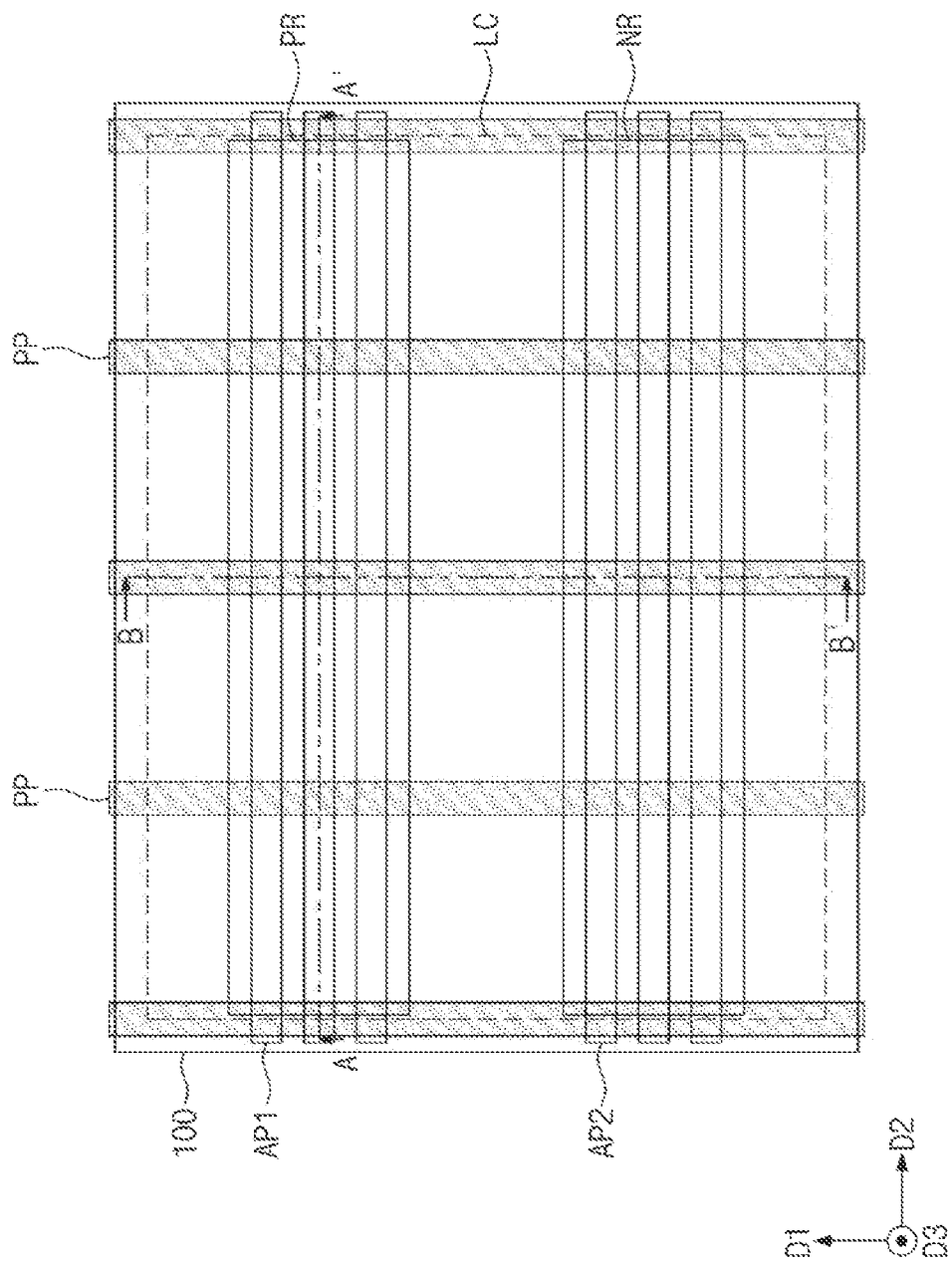

SEMICONDUCTOR DEVICES AND METHODS FOR MANUFACTURING THE SAME

CROSS-REFERENCE TO RELATED APPLICATION

This application is a continuation of U.S. patent application Ser. No. 17/235,984, filed Apr. 21, 2021, which claims priority under 35 U.S.C. § 119 to Korean Patent Application No. 10-2020-0106870, filed on Aug. 25, 2020, in the Korean Intellectual Property Office, the disclosure of which is hereby incorporated by reference in its entirety.

BACKGROUND

Embodiments of the present inventive concepts relate to a semiconductor device and a method for manufacturing the same and, more particularly, to a semiconductor device including a field effect transistor and a method for manufacturing the same.

Semiconductor devices may include integrated circuits including metal-oxide-semiconductor field effect transistors (MOSFETs). As sizes and design rules of semiconductor devices have been reduced, MOSFETs have been scaled down. Operating characteristics of semiconductor devices may be deteriorated by reduction in size of MOSFETs. Accordingly, various methods for forming excellent performance semiconductor devices, while overcoming limitations by the high integration, have been studied.

SUMMARY

Embodiments of the present inventive concepts may provide semiconductor devices with improved electrical characteristics and a method for manufacturing the same.

According to some embodiments of the present inventive concepts, semiconductor devices may include transistors on a substrate, a first interlayer insulating layer on the transistors, a lower interconnection line in the first interlayer insulating layer, an etch stop layer on the first interlayer insulating layer and the lower interconnection line, a second interlayer insulating layer on the etch stop layer, and an upper interconnection line in the second interlayer insulating layer. The upper interconnection line may include a via portion extending through the etch stop layer and contacting the lower interconnection line. The via portion may include a barrier pattern and a conductive pattern on the barrier pattern. The barrier pattern may include a first barrier layer between the conductive pattern and the second interlayer insulating layer, and a second barrier layer between the conductive pattern and the lower interconnection line. An electrical resistivity of the first barrier layer may be greater than an electrical resistivity of the second barrier layer, and a concentration of nitrogen (N) of the first barrier layer may be greater than a concentration of nitrogen (N) of the second barrier layer.

According to some embodiments of the present inventive concepts, semiconductor devices may include transistors on a substrate, a first interlayer insulating layer on the transistors, a lower interconnection line in the first interlayer insulating layer, an etch stop layer on the first interlayer insulating layer and the lower interconnection line, a second interlayer insulating layer on the etch stop layer, and an upper interconnection line in the second interlayer insulating layer. The upper interconnection line may include a via portion extending through the etch stop layer and contacting the lower interconnection line. The via portion may include a barrier pattern and a conductive pattern on the barrier pattern. The barrier pattern may include a first portion that is between the conductive pattern and the second interlayer insulating layer and a second portion that is between the conductive pattern and the lower interconnection line. The first portion of the barrier pattern may have a first nitrogen concentration, and the second portion of the barrier pattern may have a second nitrogen concentration. The first nitrogen concentration may be greater than the second nitrogen concentration. The first portion of the barrier pattern may have a first thickness, and the second portion of the barrier pattern may have a second thickness. The first thickness may be greater than the second thickness.

According to some embodiments of the present inventive concepts, semiconductor devices may include a substrate including an active region, a device isolation layer defining active patterns on the active region, wherein the device isolation layer covers a sidewall of a lower portion of each of the active patterns; and an upper portion of each of the active patterns protrudes above the device isolation layer, a pair of source/drain patterns in the upper portion of each of the active patterns, a channel pattern between the pair of source/drain patterns, a gate electrode intersecting the channel pattern and extending in a first direction, gate spacers on opposing sidewalls of the gate electrode, respectively, and extending together with the gate electrode in the first direction, a gate dielectric pattern between the gate electrode and the channel pattern and between the gate electrode and the gate spacers, a gate capping pattern on a top surface of the gate electrode and extending together with the gate electrode in the first direction, a first interlayer insulating layer on the gate capping pattern, an active contact extending through the first interlayer insulating layer and electrically connected to at least one of the pair of source/drain patterns, a first metal layer in a second interlayer insulating layer that is on the first interlayer insulating layer, a second metal layer in a third interlayer insulating layer that is on the second interlayer insulating layer, and an etch stop layer between the second interlayer insulating layer and the third interlayer insulating layer. The first metal layer may include a lower interconnection line extending in a second direction intersecting the first direction, and the lower interconnection line may be electrically connected to the active contact. The second metal layer may include an upper interconnection line extending in the first direction. The upper interconnection line may include a via portion extending through the etch stop layer and contacting the lower interconnection line. The via portion may include a barrier pattern and a conductive pattern on the barrier pattern. The barrier pattern may include a first portion that is between the conductive pattern and the third interlayer insulating layer and a second portion that is between the conductive pattern and the lower interconnection line. The first portion of the barrier pattern may have a first nitrogen concentration, and the second portion of the barrier pattern may have a second nitrogen concentration. The first nitrogen concentration may be greater than the second nitrogen concentration.

According to some embodiments of the present inventive concepts, methods for manufacturing a semiconductor device may include forming transistors on a substrate, forming a first interlayer insulating layer on the transistors, forming a lower interconnection line in the first interlayer insulating layer, forming an etch stop layer on the first interlayer insulating layer and the lower interconnection line, forming a second interlayer insulating layer on the etch stop layer, and forming an upper interconnection line in the second interlayer insulating layer. The forming of the upper interconnection line may include patterning the second interlayer insulating layer to form an interconnection hole that extends through the second interlayer insulating layer and the etch stop layer to expose a portion of an upper surface (e.g., a top surface) of the lower interconnection line, selectively forming a metal deposition inhibiting layer on the portion of the upper surface of the lower interconnection line, forming a first barrier layer in the interconnection hole, the first barrier layer formed on a sidewall (e.g., an inner sidewall) of the interconnection hole except the metal deposition inhibiting layer, selectively removing the metal deposition inhibiting layer to expose the portion of the upper surface of the lower interconnection line again, forming a second barrier layer having an electrical resistivity lower than that of the first barrier layer in the interconnection hole, the second barrier layer covering the portion of the upper surface of the lower interconnection line, and forming a conductive layer in the interconnection hole (e.g., filling the interconnection hole) on the second barrier layer.

BRIEF DESCRIPTION OF THE DRAWINGS

The present inventive concepts will become more apparent in view of the attached drawings and accompanying detailed description.

FIGS. 2A, 2B, 2C and 2D are cross-sectional views taken along lines A-A', B-B', C-C' and D-D' of FIG. 1, respectively.

FIGS. 5, 7, 9, 11 and 13 are plan views illustrating a method for manufacturing a semiconductor device, according to some embodiments of the present inventive concepts.

DETAILED DESCRIPTION

Figure 1:
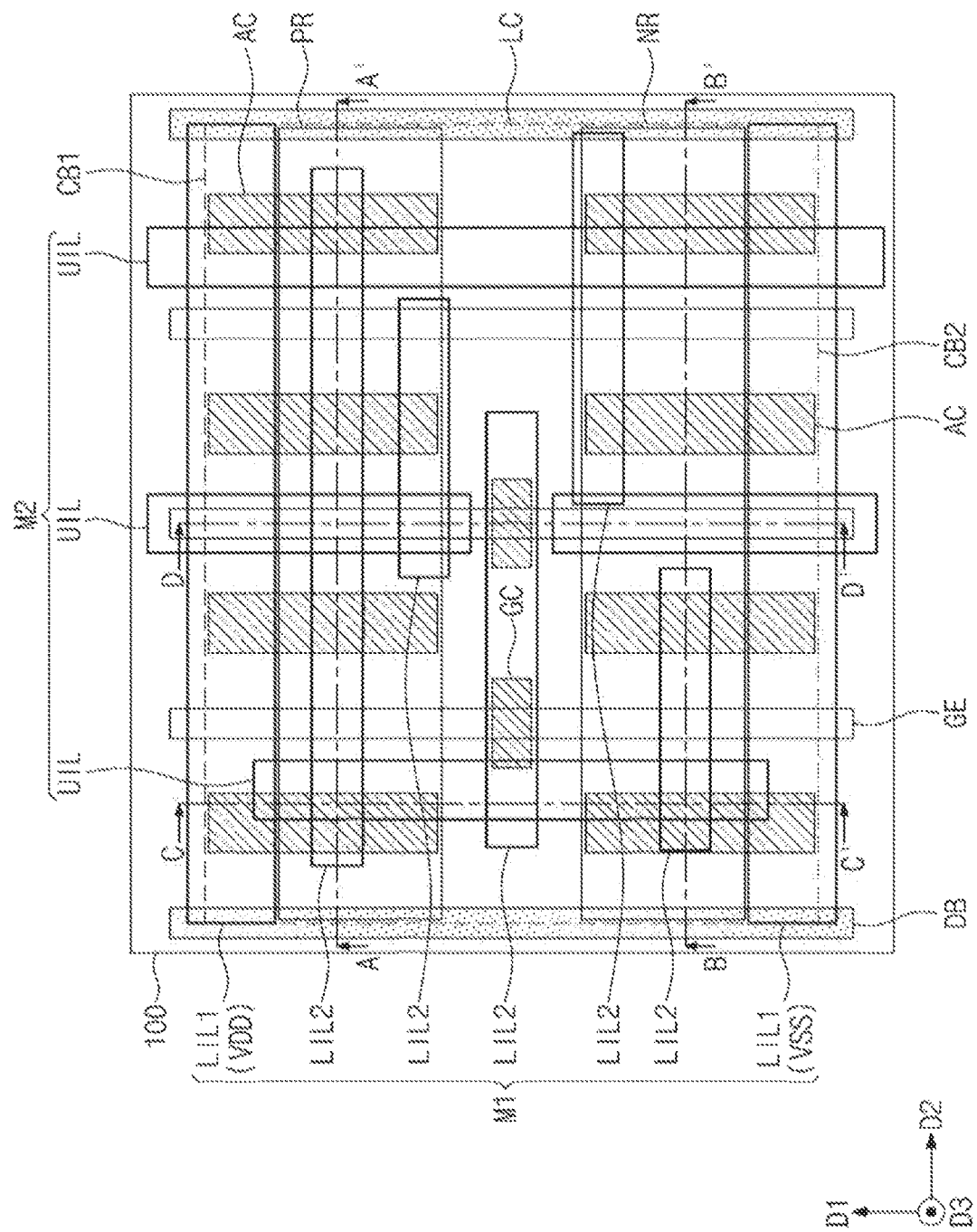
FIG. 1 is a plan view illustrating a semiconductor device according to some embodiments of the present inventive concepts.

FIG. 1 is a plan view illustrating a semiconductor device according to some embodiments of the present inventive concepts. FIGS. 2A, 2B, 2C and 2D are cross-sectional views taken along lines A-A', B-B', C-C' and D-D' of FIG. 1, respectively. FIG. 3 is an enlarged cross-sectional view of a region 'M' of FIG. 2A.

Referring to FIGS. 1 and 2A to 2D, a logic cell LC may be provided on a substrate 100. In the present specification, the logic cell LC may refer to a logic element (e.g., an inverter, a flip-flop, etc.) for performing a specific function. The logic cell LC may refer to a standard cell. In other words, the logic cell LC may include transistors and interconnection lines connecting the transistors to each other, which constitute the logic element.

The substrate 100 may include a first active region PR and a second active region NR. In some embodiments, the first active region PR may be a PMOSFET region, and the second active region NR may be an NMOSFET region. The substrate 100 may be a semiconductor substrate including, for example, silicon, germanium, or silicon-germanium or may be a compound semiconductor substrate. In some embodiments, the substrate 100 may be a silicon substrate.

The first active region PR and the second active region NR may be defined by a second trench TR2 formed in an upper portion of the substrate 100. The second trench TR2 may be disposed between the first active region PR and the second active region NR. The first active region PR and the second active region NR may be spaced apart from each other in a first direction D1 with the second trench TR2 interposed therebetween. Each of the first and second active regions PR and NR may extend in a second direction D2 intersecting the first direction D1. As used herein, "an element A extends in a direction X" (or similar language) means that the element A extends longitudinally in the direction X. The term "intersect" as used herein may be interchangeable with "traverse".

First active patterns AP1 may be provided on the first active region PR, and second active patterns AP2 may be provided on the second active region NR. The first and second active patterns AP1 and AP2 may extend in parallel to each other in the second direction D2. The first and second active patterns AP1 and AP2 may be portions of the substrate 100, which protrude in a vertical direction (i.e., a third direction D3). First trenches TR1 may be defined between the first active patterns AP1 adjacent to each other and between the second active patterns AP2 adjacent to each other. The first trench TR1 may be shallower than the second trench TR2.

A device isolation layer ST may fill the first and second trenches TR1 and TR2. The device isolation layer ST may include, for example, a silicon oxide layer. Upper portions of the first and second active patterns AP1 and AP2 may vertically protrude above the device isolation layer ST (see FIG. 2D). Each of the upper portions of the first and second active patterns AP1 and AP2 may have a fin shape. The device isolation layer ST may not cover the upper portions of the first and second active patterns AP1 and AP2. The device isolation layer ST may cover sidewalls of lower portions of the first and second active patterns AP1 and AP2. As used herein, "an element A covers an element B" (or similar language) means that the element A is on and/or overlaps the element B but does not necessarily mean that the element A covers the element B entirely.

First source/drain patterns SD1 may be provided in the upper portions of the first active patterns AP1. The first source/drain patterns SD1 may be dopant regions (i.e., regions including dopants) having a first conductivity type (e.g., a P-type). A first channel pattern CH1 may be disposed between a pair of the first source/drain patterns SD1. Second source/drain patterns SD2 may be provided in the upper portions of the second active patterns AP2. The second source/drain patterns SD2 may be dopant regions (i.e., regions including dopants) having a second conductivity type (e.g., an N-type). A second channel pattern CH2 may be disposed between a pair of the second source/drain patterns SD2.

The first and second source/drain patterns SD1 and SD2 may include epitaxial patterns formed by, for example, a selective epitaxial growth (SEG) process. In some embodiments, top surfaces of the first and second source/drain patterns SD1 and SD2 may be coplanar with top surfaces of the first and second channel patterns CH1 and CH2. In some embodiments, the top surfaces of the first and second source/drain patterns SD1 and SD2 may be higher than the top surfaces of the first and second channel patterns CH1 and CH2. As used herein, "an element A is higher than an element B" (or similar language) means that the element A is higher than the element B relative to a substrate, and thus the substrate is closer to the element B than the element A.

The first source/drain patterns SD1 may include a semiconductor element (e.g., SiGe) of which a lattice constant is greater than that of a semiconductor element of the substrate 100. Thus, the first source/drain patterns SD1 may provide compressive stress to the first channel patterns CH1. For example, the second source/drain patterns SD2 may include the same semiconductor element (e.g., silicon) as the substrate 100.

Gate electrodes GE may extend in the first direction D1 to intersect the first and second active patterns AP1 and AP2. The gate electrodes GE may be arranged in the second direction D2 at a certain pitch. In some embodiments, the gate electrodes GE may be spaced apart from each other by a uniform distance in the second direction D2 as illustrated in FIG. 1. The gate electrodes GE may vertically overlap the first and second channel patterns CH1 and CH2. Each of the gate electrodes GE may surround or extend on a top surface and both sidewalls of each of the first and second channel patterns CH1 and CH2. As used herein, "an element A vertically overlaps an element B" (or similar language) means that at least one vertical line can be drawn that intersects both elements A and B. Further, "an element A surrounds an element B" (or similar language) means that the element A is at least partially around the element B but does not necessarily mean that the element A completely encloses the element B.

Referring again to FIG. 2D, the gate electrode GE may be provided on a first top surface TS1 of the first channel pattern CH1 and at least one first sidewall SW1 of the first channel pattern CH1. The gate electrode GE may be provided on a second top surface TS2 of the second channel pattern CH2 and at least one second sidewall SW2 of the second channel pattern CH2. In other words, the transistors according to some embodiments of the present inventive concepts may be three-dimensional (3D) field effect transistors (e.g., FinFETs) in which the gate electrode GE three-dimensionally surrounds the channel patterns CH1 and CH2.

Still referring to FIGS. 1 and 2A to 2D, a pair of gate spacers GS may be disposed on opposing sidewalls of each of the gate electrodes GE, respectively. The gate spacers GS may extend along the gate electrodes GE in the first direction D1. Top surfaces of the gate spacers GS may be higher than top surfaces of the gate electrodes GE. The top surfaces of the gate spacers GS may be coplanar with a top surface of a first interlayer insulating layer 110 to be described later. The gate spacers GS may include, for example, SiCN, SiCON, and/or SiN. In some embodiments, each of the gate spacers GS may have a multi-layered structure formed of at least two of SiCN, SiCON, or SiN. As used herein the term "and/or" includes any and all combinations of one or more of the associated listed items.

A gate capping pattern GP may be provided on each of the gate electrodes GE. The gate capping pattern GP may extend along the gate electrode GE in the first direction D1. The gate capping pattern GP may include, for example, a material having an etch selectivity with respect to first and second interlayer insulating layers 110 and 120 to be described later. For example, the gate capping patterns GP may include, for example, SiON, SiCN, SiCON, and/or SiN.

A gate dielectric pattern GI may be disposed between the gate electrode GE and the first active pattern AP1 and between the gate electrode GE and the second active pattern AP2. The gate dielectric pattern GI may extend along a bottom surface of the gate electrode GE thereon. For example, the gate dielectric pattern GI may cover the first top surface TS1 and the first sidewall SW1 of the first channel pattern CH1. The gate dielectric pattern GI may cover the second top surface TS2 and the second sidewall SW2 of the second channel pattern CH2. The gate dielectric pattern GI may cover a top surface of the device isolation layer ST under the gate electrode GE (see FIG. 2D).

In some embodiments, the gate dielectric pattern GI may include, for example, a high-k dielectric material of which a dielectric constant is higher than that of silicon oxide (e.g., silicon dioxide). For example, the high-k dielectric material may include hafnium oxide, hafnium-silicon oxide, hafnium-zirconium oxide, hafnium-tantalum oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, and/or lead-zinc niobate.

The gate electrode GE may include a first metal pattern and a second metal pattern on the first metal pattern. The first metal pattern may be provided on the gate dielectric pattern GI and may be adjacent to the first and second channel patterns CH1 and CH2. The first metal pattern may include a work function metal for adjusting a threshold voltage of the transistor. A desired threshold voltage may be obtained by adjusting a thickness and a composition of the first metal pattern.

The first metal pattern may include a metal nitride layer. For example, the first metal pattern may include nitrogen (N) and at least one metal selected from a group consisting of titanium (Ti), tantalum (Ta), aluminum (Al), tungsten (W), and molybdenum (Mo). In some embodiments, the first metal pattern may include titanium (Ti), tantalum (Ta), aluminum (Al), tungsten (W), and/or molybdenum (Mo) in addition to nitrogen (N). In some embodiments, the first metal pattern may further include carbon (C). In some embodiments, the first metal pattern may include a plurality of stacked work function metal layers.

The second metal pattern may include a metal having a resistance lower than that of the first metal pattern. For example, the second metal pattern may include tungsten (W), aluminum (Al), titanium (Ti), and/or tantalum (Ta).

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with top surfaces of the gate capping patterns GP and the top surfaces of the gate spacers GS. A second interlayer insulating layer 120 may be provided on the first interlayer insulating layer 110 and the gate capping patterns GP. A third interlayer insulating layer 130 may be provided on the second interlayer insulating layer 120. A fourth interlayer insulating layer 140 may be provided on the third interlayer insulating layer 130. For example, each of the first to fourth interlayer insulating layers 110 to 140 may include a silicon oxide layer.

A pair of isolation structures DB may be respectively provided at or adjacent opposing sides of the logic cell LC, which are spaced apart from each other in the second direction D2. The isolation structure DB may extend in the first direction D1 in parallel to the gate electrodes GE. A pitch between the isolation structure DB and the gate electrode GE adjacent thereto may be equal to the pitch between the gate electrodes GE. In some embodiments, the isolation structure DB may be spaced apart from the closest gate electrode GE by a distance in the second direction D2, and that distance may be equal to a distance between two adjacent gate electrodes GE as illustrated in FIG. 1.

The isolation structure DB may penetrate the first and second interlayer insulating layers 110 and 120 and may extend into the first and second active patterns AP1 and AP2. The isolation structure DB may penetrate the upper portions of the first and second active patterns AP1 and AP2. The isolation structure DB may isolate the first and second active regions PR and NR of the logic cell LC from an active region of an adjacent logic cell.

Active contacts AC may penetrate the second and first interlayer insulating layers 120 and 110 so as to be electrically connected to the first and second source/drain patterns SD1 and SD2. Each of the active contacts AC may be provided between a pair of the gate electrodes GE.

In some embodiments, the active contact AC may be a self-aligned contact. In other words, the active contact AC may be formed to be self-aligned using the gate capping pattern GP and the gate spacer GS. For example, the active contact AC may cover at least a portion of a sidewall of the gate spacer GS. Even though not shown in the drawings, the active contact AC may cover a portion of the top surface of the gate capping pattern GP.

Silicide patterns SC may be disposed between the active contact AC and the first source/drain pattern SD1 and between the active contact AC and the second source/drain pattern SD2, respectively. The active contact AC may be electrically connected to the source/drain pattern SD1 or SD2 through the silicide pattern SC. The silicide pattern SC may include a metal silicide and may include, for example, titanium silicide, tantalum silicide, tungsten silicide, nickel silicide, and/or cobalt silicide.

A gate contact GC may penetrate the second interlayer insulating layer 120 and the gate capping pattern GP so as to be connected (e.g., electrically connected) to the gate electrode GE. In some embodiments, gate contact GC may contact the gate electrode GE as illustrated in FIG. 2D. The gate contact GC may be provided between the first and second active regions PR and NR when viewed in a plan view as illustrated in FIG. 1. A bottom surface of the gate contact GC may be in contact with the top surface of the gate electrode GE. A top surface of the gate contact GC may be coplanar with a top surface of the second interlayer insulating layer 120.

Each of the active contact AC and the gate contact GC may include a first conductive pattern FM1 and a first barrier pattern BM1 surrounding the first conductive pattern FM1. For example, the first conductive pattern FM1 may include aluminum, copper, tungsten, molybdenum, ruthenium, and/or cobalt. The first barrier pattern BM1 may cover a bottom surface and sidewalls of the first conductive pattern FM1. The first barrier pattern BM1 may include a metal layer/a metal nitride layer (e.g., a metal layer and a metal nitride layer stacked on the metal layer). The metal layer may include, for example, a titanium layer, a tantalum layer, a tungsten layer, a nickel layer, a cobalt layer, and/or a platinum layer. The metal nitride layer may include, for example, a titanium nitride (TiN) layer, a tantalum nitride (TaN) layer, a tungsten nitride (WN) layer, a nickel nitride (NiN) layer, a cobalt nitride (CoN) layer, and/or a platinum nitride (PtN) layer.

A first metal layer M1 may be provided in the third interlayer insulating layer 130. The first metal layer M1 may include first lower interconnection lines LIL1, second lower interconnection lines LIL2, and lower vias VI. The lower vias VI may be provided under the first and second lower interconnection lines LIL1 and LIL2.

The first lower interconnection lines LIL1 may intersect the logic cell LC and may extend in the second direction D2. Each of the first lower interconnection lines LIL1 may be a power interconnection line. For example, a drain voltage VDD or a source voltage VSS may be applied to the first lower interconnection line LIL1.

Referring to FIG. 1, a first cell boundary CB1 extending in the second direction D2 may be defined at the logic cell LC. At the logic cell LC, a second cell boundary CB2 extending in the second direction D2 may be defined at an opposite side of the first cell boundary CB1. The first lower interconnection line LIL1 to which the drain voltage VDD (i.e., a power voltage) is applied may be disposed on the first cell boundary CB1. The first lower interconnection line LIL1 to which the drain voltage VDD is applied may extend along the first cell boundary CB1 in the second direction D2. The first lower interconnection line LIL1 to which the source voltage VSS (i.e., a ground voltage) is applied may be disposed on the second cell boundary CB2. The first lower interconnection line LIL1 to which the source voltage VSS is applied may extend along the second cell boundary CB2 in the second direction D2.

The second lower interconnection lines LIL2 may be disposed between the first lower interconnection line LIL1 to which the drain voltage VDD is applied and the first lower interconnection line LIL1 to which the source voltage VSS is applied. The second lower interconnection lines LIL2 may extend in the second direction D2 in parallel to each other. Each of the second lower interconnection lines LIL2 may have a line or bar shape when viewed in a plan view. The second lower interconnection lines LIL2 may be arranged at a certain pitch in the first direction D1. In some embodiments, the second lower interconnection lines LIL2 may be spaced apart from each other by a uniform distance in the first direction D1 as illustrated in FIG. 1.

Referring again to FIG. 2C, a line width of each of the first lower interconnection lines LIL1 may be a first width W1 in the first direction D1. A line width of each of the second lower interconnection lines LIL2 may be a second width W2 in the first direction D1. The second width W2 may be less than the first width W1. For example, the second width W2 may be less than 12 nm. The first width W1 may be greater than 12 nm.

Each of the first and second lower interconnection lines LIL1 and LIL2 may include a second conductive pattern FM2 and a second barrier pattern BM2 surrounding the second conductive pattern FM2. A cross section of the second barrier pattern BM2 may have a U shape. A top surface of the second barrier pattern BM2 may be substantially coplanar with a top surface of the third interlayer insulating layer 130. In some embodiments, the top surface of the second barrier pattern BM2 may be lower than the top surface of the third interlayer insulating layer 130.

The second barrier pattern BM2 may improve adhesion between the lower interconnection line LIL1 or LIL2 and the third interlayer insulating layer 130. The second barrier pattern BM2 may function as a barrier for reducing or possibly preventing diffusion of a metal element of the second conductive pattern FM2 into the third interlayer insulating layer 130. The second barrier pattern BM2 may include, for example, a tantalum nitride (TaN) layer, a titanium nitride (TiN) layer, a tantalum oxide (TaO) layer, a titanium oxide (TiO) layer, a manganese nitride (MnN) layer, and/or a manganese oxide (MnO) layer.

The second conductive pattern FM2 may be provided on the second barrier pattern BM2. The second barrier pattern BM2 may cover a bottom surface and sidewalls of the second conductive pattern FM2. The second conductive pattern FM2 may have the greatest volume among metal patterns constituting each of the lower interconnection line LIL1 or LIL2. For example, the second conductive pattern FM2 may include copper (Cu), ruthenium (Ru), cobalt (Co), tungsten (W), or molybdenum (Mo).

Even though not shown in the drawings, a metal capping pattern may further be provided on the second conductive pattern FM2. The metal capping pattern may be a thin layer which covers a top surface of the second conductive pattern FM2 and has a uniform thickness. The metal capping pattern may include ruthenium (Ru), cobalt (Co), or graphene.

Some of the lower vias VI may be disposed between the active contacts AC and the first and second lower interconnection lines LIL1 and LIL2. Others of the lower vias VI may be disposed between the gate contacts GC and the second lower interconnection lines LIL2.

An etch stop layer ESL may be disposed between the third and fourth interlayer insulating layers 130 and 140. The etch stop layer ESL may directly cover the first and second lower interconnection lines LIL1 and LIL2. The etch stop layer ESL may cover the top surface of the third interlayer insulating layer 130. In some embodiments, the etch stop layer ESL may contact upper surfaces of some of the first and second lower interconnection lines LIL1 and LIL2 and an upper surface of the third interlayer insulating layer 130 as illustrated in FIG. 2C.

The etch stop layer ESL may include a single layer or a plurality of stacked layers. In some embodiments, the etch stop layer ESL may include a metal oxide layer and/or metal nitride layer containing, for example, Al, Zr, Y, Hf, and/or Mo. In some embodiments, the etch stop layer ESL may include a silicon oxide layer and/or a silicon nitride layer.

A second metal layer M2 may be provided in the fourth interlayer insulating layer 140. The second metal layer M2 may include upper interconnection lines UIL. The upper interconnection lines UIL may extend in the first direction D1 and may extend parallel to each other. Each of the upper interconnection lines UIL may have a line or bar shape when viewed in a plan view as illustrated in FIG. 1. The upper interconnection lines UIL may be arranged in the second direction D2.

The upper interconnection line UIL may include a line portion LIP and a via portion VIP. The line portion LIP may be provided in an upper portion of the fourth interlayer insulating layer 140 and may extend in the first direction D1. The via portion VIP may be provided in a lower portion of the fourth interlayer insulating layer 140 and may extend from the line portion LIP toward the first metal layer M1. In some embodiments, the via portion VIP may be a via disposed between the line portion LIP and the first metal layer M1 to connect the line portion LIP to the first metal layer M1. The via portion VIP may penetrate the fourth interlayer insulating layer 140 and the etch stop layer ESL to extend toward the first metal layer M1.

The line portion LIP and the via portion VIP may be connected to each other in one body to constitute a single conductor, i.e., a single upper interconnection line UIL. The line portion LIP and the via portion VIP may be formed into the single upper interconnection line UIL through a dual damascene process.

The upper interconnection line UIL will be described in more detail with reference to FIG. 3. The upper interconnection line UIL may include a third barrier pattern BM3 and a third conductive pattern FM3 on the third barrier pattern BM3.

The third barrier pattern BM3 may function as a barrier for reducing or possibly preventing diffusion of a metal element of the third conductive pattern FM3 into the fourth interlayer insulating layer 140. The third barrier pattern BM3 may include a first barrier layer BAP1 and a second barrier layer BAP2.

Referring to FIG. 3, first barrier layer BAP1 may be disposed between the third conductive pattern FM3 and the fourth interlayer insulating layer 140 and may extend in a vertical direction (i.e., the third direction D3). The first barrier layer BAP1 may not be disposed between the third conductive pattern FM3 and the second lower interconnection line LIL2. In other words, the first barrier layer BAP1 may not include a portion extending in the second direction D2 between the third conductive pattern FM3 and the second lower interconnection line LIL2.

The second barrier layer BAP2 may be disposed between the first barrier layer BAP1 and the third conductive pattern FM3 and may include a portion extending in the third direction D3. In addition, the second barrier layer BAP2 may be disposed between the third conductive pattern FM3 and the second lower interconnection line LIL2 and may extend in the second direction D2. In other words, a cross section of the second barrier layer BAP2 may have a U shape. The second barrier layer BAP2 may cover a second top surface TOS2 of the second lower interconnection line LIL2. In other words, the third conductive pattern FM3 may be electrically connected to the second lower interconnection line LIL2 through the second barrier layer BAP2. In some embodiments, the second barrier layer BAP2 may contact the second top surface TOS2 of the second lower interconnection line LIL2.

The first barrier layer BAP1 may include, for example, a tantalum nitride (TaN) layer, a titanium nitride (TiN) layer, a tantalum oxide (TaO) layer, a titanium oxide (TiO) layer, a manganese nitride (MnN) layer, and/or a manganese oxide (MnO) layer. The second barrier layer BAP2 may include a material of which a resistivity is lower than that of the first barrier layer BAP1. The second barrier layer BAP2 may include, for example, a tantalum layer, a titanium layer, a tungsten layer, a nickel layer, a cobalt layer, a platinum layer, and/or a graphene layer. For example, in some embodiments, the first barrier layer BAP1 may be a tantalum nitride (TaN) layer, and the second barrier layer BAP2 may be a tantalum (Ta) layer. As used herein, the term "resistivity" may be interchangeable with "electrical resistivity."

Figure 4A:
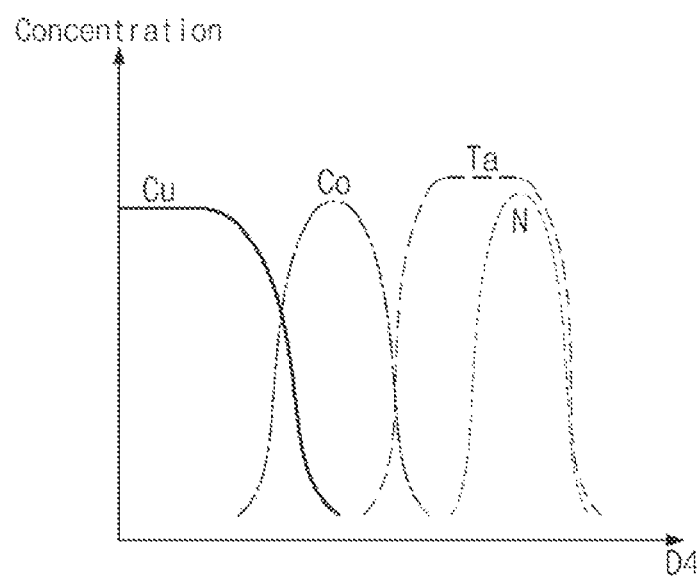
FIG. 4A is a graph showing results of elemental analysis in a fourth direction of a via portion of an upper interconnection line of FIG. 3.

In some embodiments, the first barrier layer BAP1 may contain a relatively high concentration of nitrogen (N) as shown in FIG. 4A to be described later. The concentration of nitrogen (N) of the first barrier layer BAP1 may range from 10 at % to 60 at %. In some embodiments, the concentration of nitrogen (N) of the first barrier layer BAP1 may range from 40 at % to 60 at %.

Figure 4B:
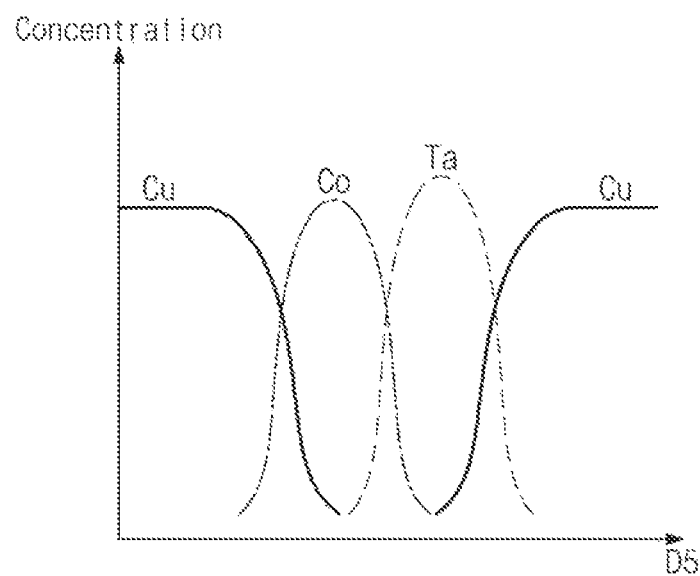
FIG. 4B is a graph showing results of elemental analysis in a fifth direction of the via portion of the upper interconnection line of FIG. 3.

As shown in FIG. 4B to be described later, the second barrier layer BAP2 may contain a relatively low concentration of nitrogen (N) or may not contain nitrogen (N) at all. The concentration of nitrogen (N) of the second barrier layer BAP2 may range from 0 at % to 5 at %. In other words, the second barrier layer BAP2 may not contain nitrogen (N) or may contain nitrogen (N) having a concentration less than 5 at %. Since the second barrier layer BAP2 does not contain nitrogen (N) or contains a small amount of nitrogen (N), a resistivity of the second barrier layer BAP2 may be less than a resistivity of the first barrier layer BAP1.

The third conductive pattern FM3 may include a first conductive layer MEP1 and a second conductive layer MEP2. The first conductive layer MEP1 may be disposed between the third barrier pattern BM3 and the second conductive layer MEP2. A cross section of the first conductive layer MEP1 may have a U shape. The first conductive layer MEP1 may improve adhesion between the second conductive layer MEP2 and the third barrier pattern BM3.

The second conductive layer MEP2 may have the greatest volume among conductive layers constituting the upper interconnection line UIL. The second conductive layer MEP2 may contain a metal having a relatively low resistivity. The first conductive layer MEP1 and the second conductive layer MEP2 may include different metals selected from a group consisting of copper (Cu), cobalt (Co), ruthenium (Ru), tungsten (W), molybdenum (Mo), aluminum (Al), silver (Ag), and gold (Au). For example, in some embodiments, the first conductive layer MEP1 may include cobalt (Co), and the second conductive layer MEP2 may include copper (Cu).

The first barrier layer BAP1 may have a first thickness T1 in the second direction D2. The second barrier layer BAP2 may have a second thickness T2 in the third direction D3 on the second top surface TOS2 of the second lower interconnection line LIL2. The first conductive layer MEP1 may have a third thickness T3 in the third direction D3 on the second top surface TOS2 of the second lower interconnection line LIL2. The first thickness T1 may be greater than the second thickness T2. The third thickness T3 may be greater than the first thickness T1. For example, the first thickness T1 may range from 1 nm to 2 nm. The second thickness T2 may be less than 1 nm. The third thickness T3 may range from 2 nm to 3 nm.

A top surface of the second lower interconnection line LIL2 may include a first top surface TOS1 and the second top surface TOS2. The first top surface TOS1 may be located at a first level LV1, and the second top surface TOS2 may be located at a second level LV2 lower than the first level LV1. Since the second top surface TOS2 is lower than the first top surface TOS1, a first recess RS1 may be defined in an upper portion of the second lower interconnection line LIL2. In other words, a bottom of the first recess RS1 may be the second top surface TOS2. The etch stop layer ESL may cover the first top surface TOS1 of the second lower interconnection line LIL2.

A lower portion of the via portion VIP of the upper interconnection line UIL may penetrate the etch stop layer ESL and may be provided in the first recess RS1. The first barrier layer BAP1 may have a first bottom surface BS1. The first bottom surface BS1 may be spaced apart from the second top surface TOS2 in the third direction D3. The first bottom surface BS1 may be higher than the second top surface TOS2.

The second barrier layer BAP2 may fill the first recess RS1. The second barrier layer BAP2 may have a second bottom surface BS2. The second bottom surface BS2 may be located at the same level LV2 as the second top surface TOS2. In other words, the second bottom surface BS2 may completely cover the second top surface TOS2. The second barrier layer BAP2 may cover an inner sidewall of the first recess RS1. The second barrier layer BAP2 may cover the first bottom surface BS1 of the first barrier layer BAP1.

According to the embodiments of the present inventive concepts, the upper interconnection line UIL and the lower interconnection line LIL1 or LIL2 may be electrically connected to each other through the second barrier layer BAP2 having the relatively low resistivity (e.g., the second barrier layer BAP2 having a resistivity lower than a resistivity of the first barrier layer BAP1), not the first barrier layer BAP1 having the relatively high resistivity (e.g., the first barrier layer BAP1 having a resistivity higher than a resistivity of the second barrier layer BAP2). As a result, a contact resistance between the upper interconnection line UIL and the lower interconnection line LIL1 or LIL2 may be reduced to improve electrical characteristics of the semiconductor device.

Meanwhile, the first barrier layer BAP1 capable of effectively inhibiting or possibly blocking diffusion of a metal may be disposed between the upper interconnection line UIL and the fourth interlayer insulating layer 140, thereby effectively reducing or possibly preventing diffusion of the metal of the upper interconnection line UIL into the fourth interlayer insulating layer 140.

FIG. 4A is a graph showing results of elemental analysis along a fourth direction D4 of the via portion VIP of the upper interconnection line UIL of FIG. 3. FIG. 4B is a graph showing results of elemental analysis along a fifth direction D5 of the via portion VIP of the upper interconnection line UIL of FIG. 3. FIGS. 4A and 4B show the results when the first barrier layer BAP1 is a tantalum nitride (TaN) layer, and the second barrier layer BAP2 is a tantalum (Ta) layer, the first conductive layer MEP1 is a cobalt (Co) layer, the second conductive layer MEP2 is a copper (Cu) layer, and the second conductive pattern FM2 is a copper (Cu) layer. The fourth direction D4 is a direction from the second conductive layer MEP2 to the fourth interlayer insulating layer 140 and is perpendicular to the third direction D3. The fifth direction D5 is a direction from the second conductive layer MEP2 to the second lower interconnection line LIL2 and is parallel to the third direction D3.

Referring to FIG. 4A, copper (Cu), cobalt (Co), tantalum (Ta) and nitrogen (N) are sequentially detected from a center of the via portion VIP in the fourth direction D4. This means that elements of the second conductive layer MEP2, the first conductive layer MEP1, the second barrier layer BAP2 and the first barrier layer BAP1 are sequentially detected.

Referring to FIG. 4B, copper (Cu), cobalt (Co), tantalum (Ta) and copper (Cu) are sequentially detected from the center of the via portion VIP in the fifth direction D5. This means that elements of the second conductive layer MEP2, the first conductive layer MEP1, the second barrier layer BAP2 and the second conductive pattern FM2 of the second lower interconnection line LIL2 are sequentially detected. Since the first barrier layer BAP1 does not exist along the fifth direction D5, tantalum (Ta) and nitrogen (N) are not detected together as shown in FIG. 4B. Since the nitrogen (N) element does not exist along in the fifth direction D5, a resistivity of a first portion of the via portion VIP corresponding to FIG. 4B may be lower than a resistivity of a second portion of the via portion VIP corresponding to FIG. 4A.

Figure 10A:
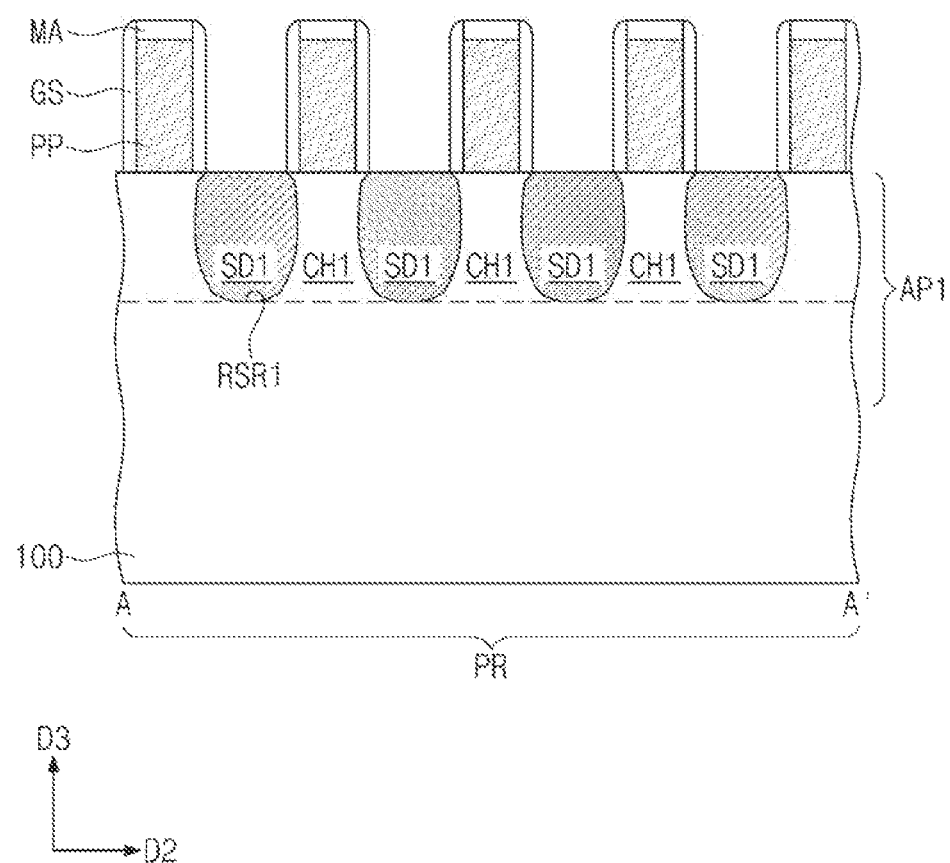
Figure 10B:
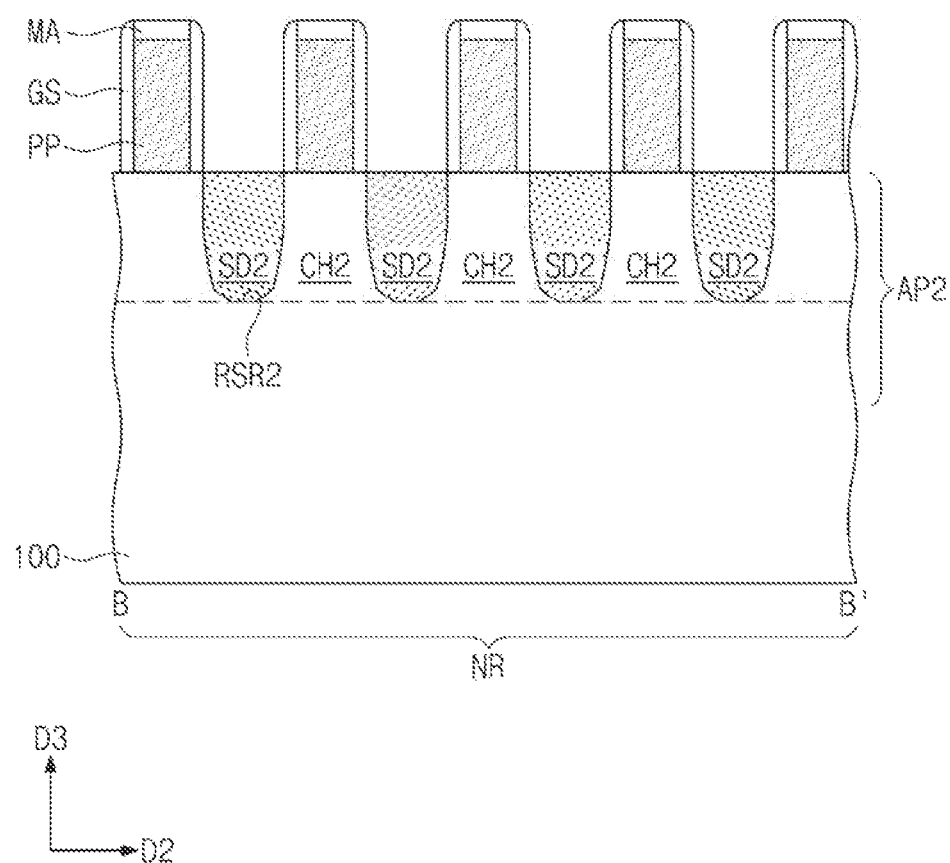
Figure 10C:
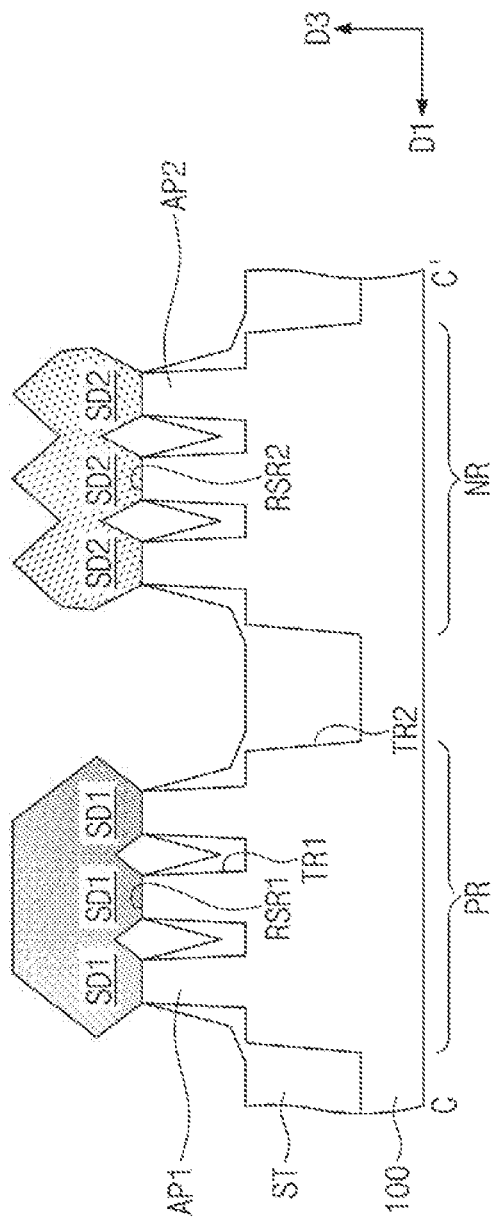
FIGS. 10C, 12C and 14C are cross-sectional views taken along lines C-C' of FIGS. 9, 11 and 13, respectively.
Figure 10D:
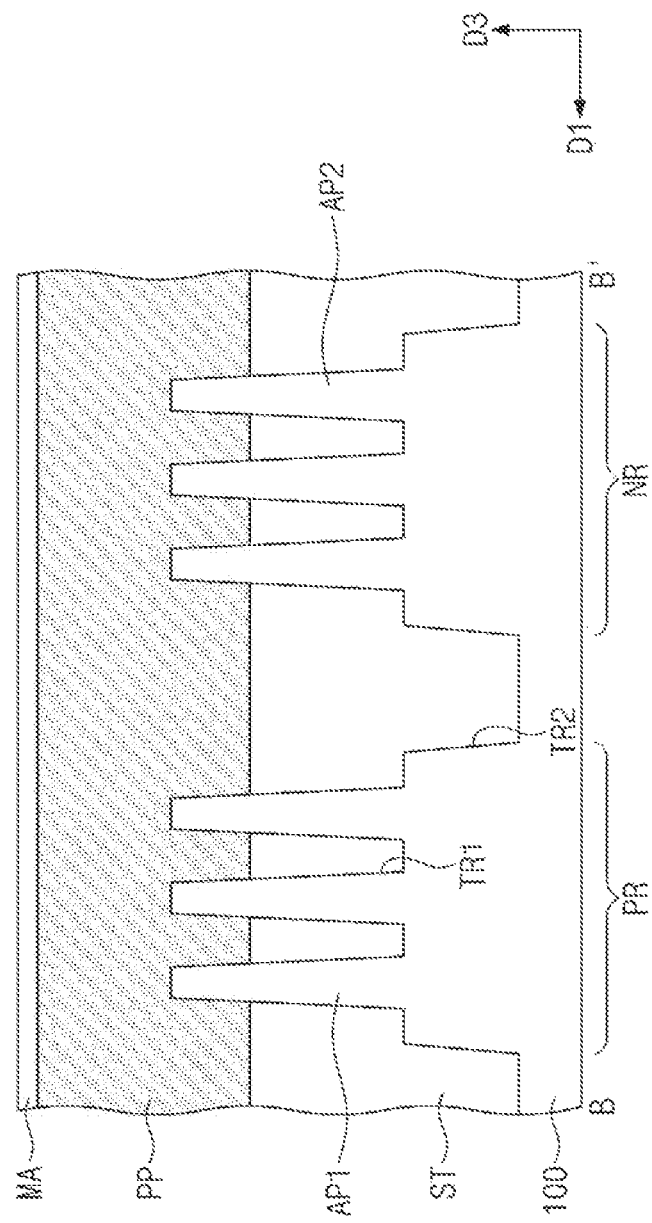
FIGS. 10D, 12D and 14D are cross-sectional views taken along lines D-D' of FIGS. 9, 11 and 13, respectively.
Figure 11:
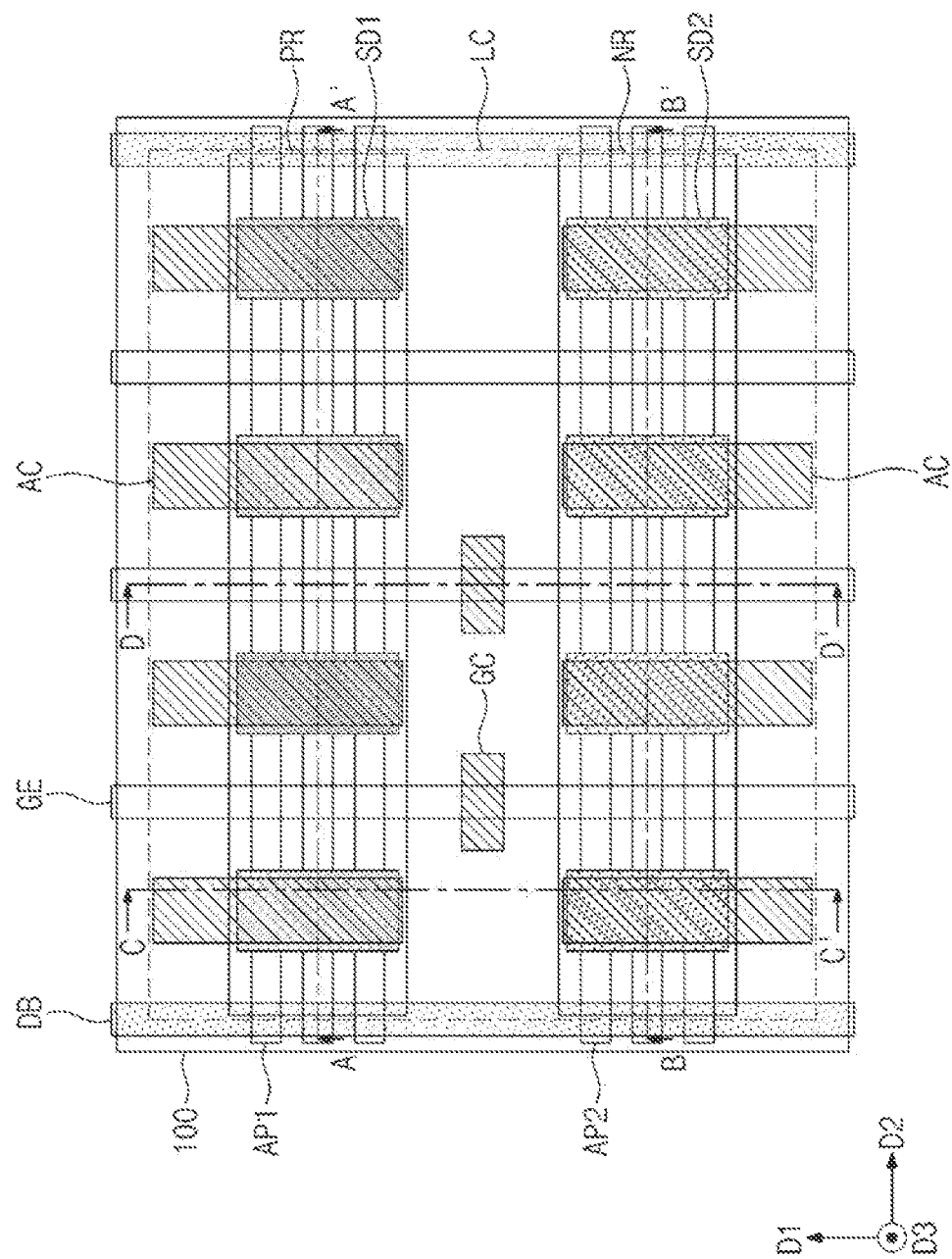
Figure 12A:
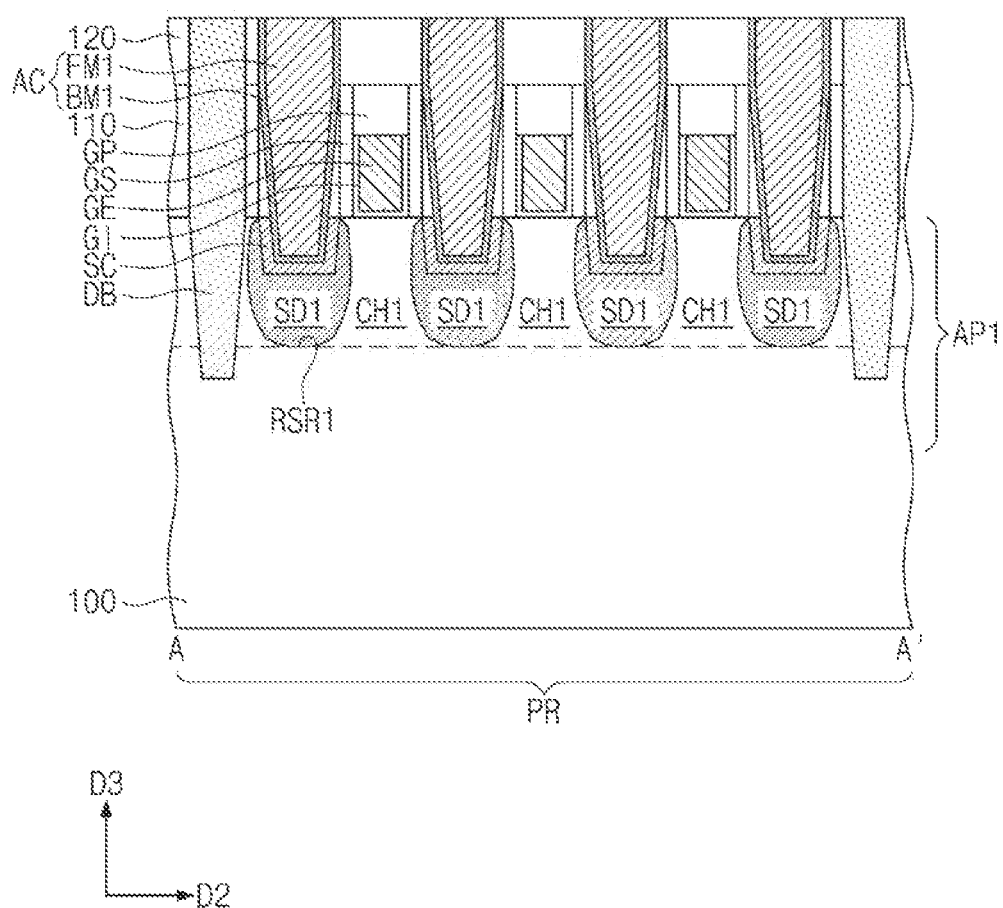
Figure 12B:
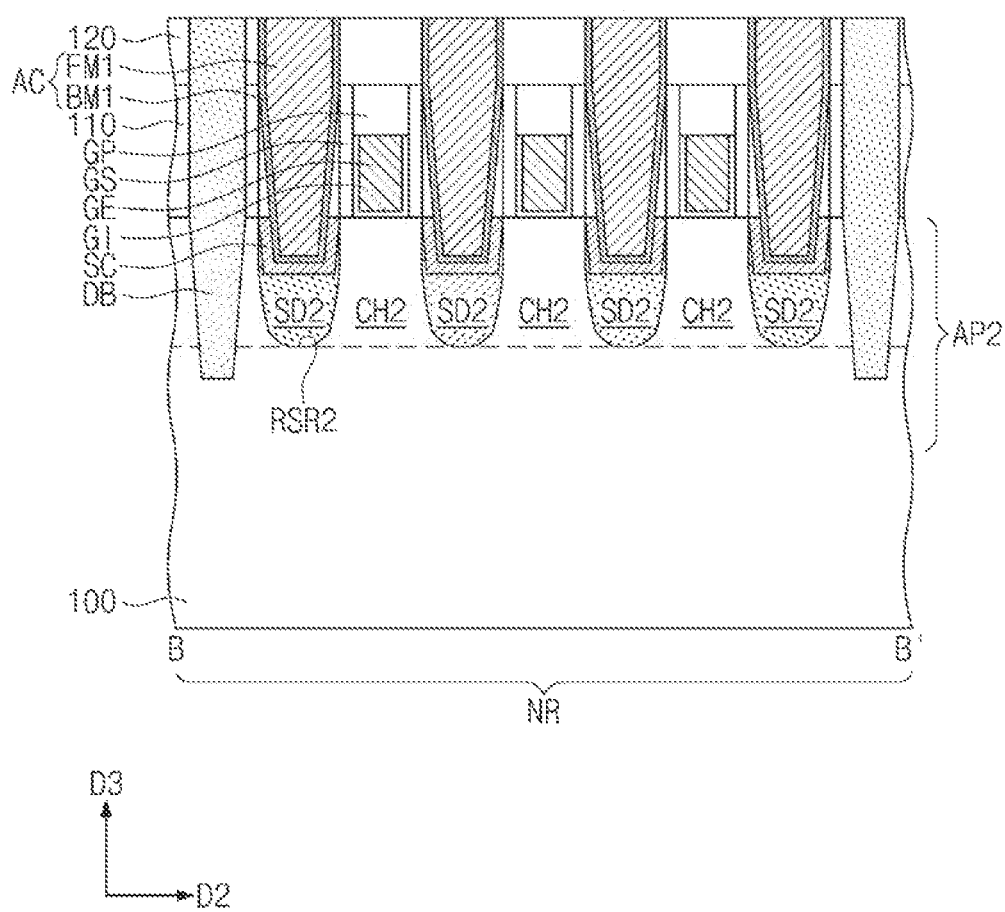
Figure 12C:
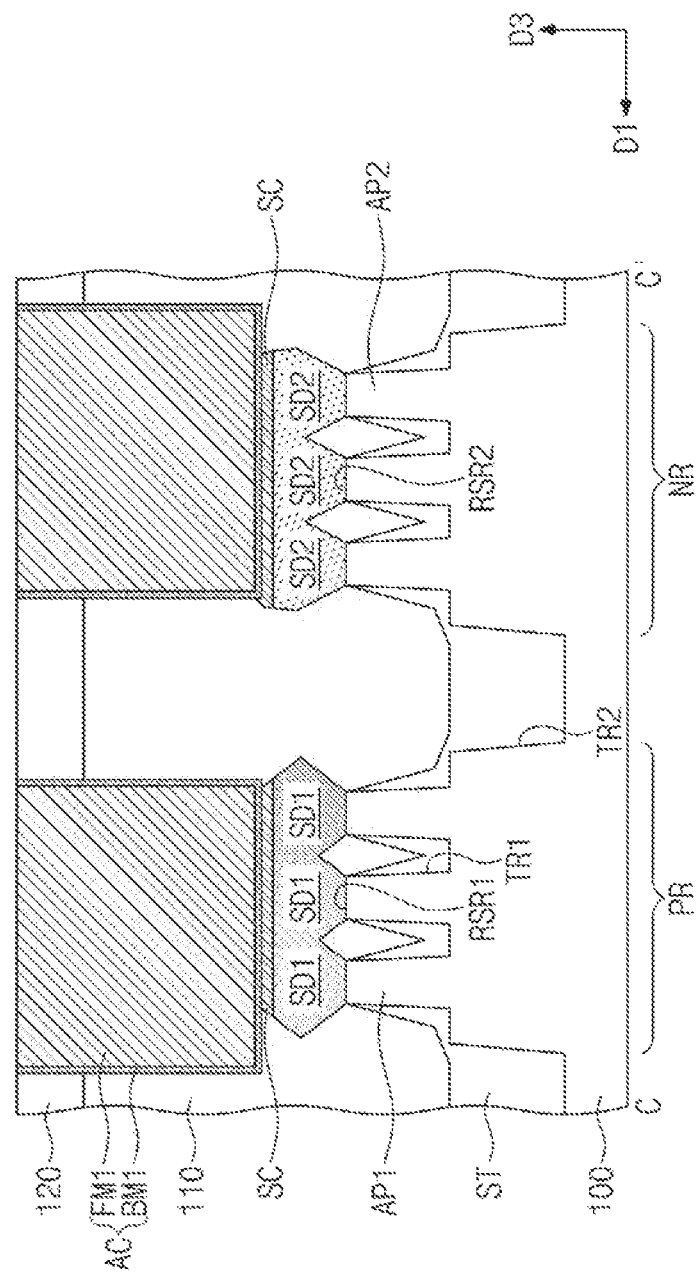
Figure 12D:
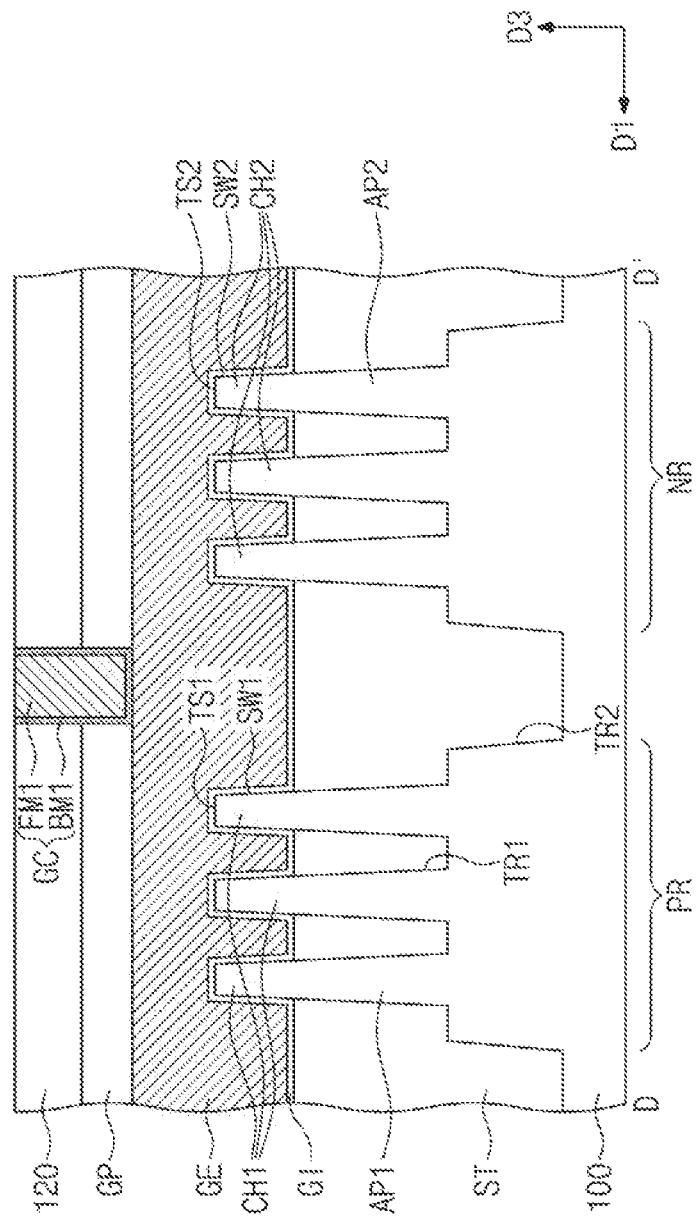
Figure 13:
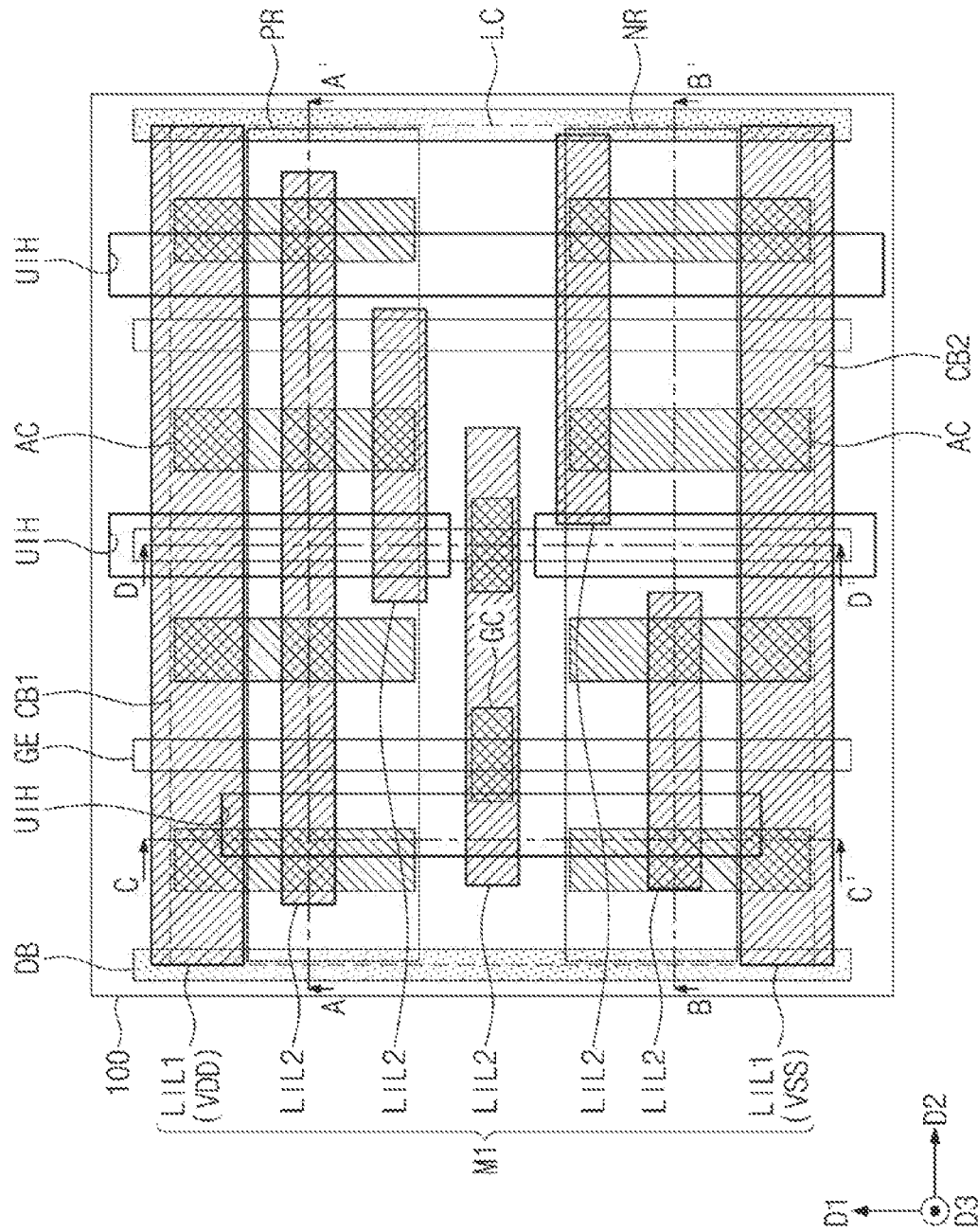
Figure 14A:
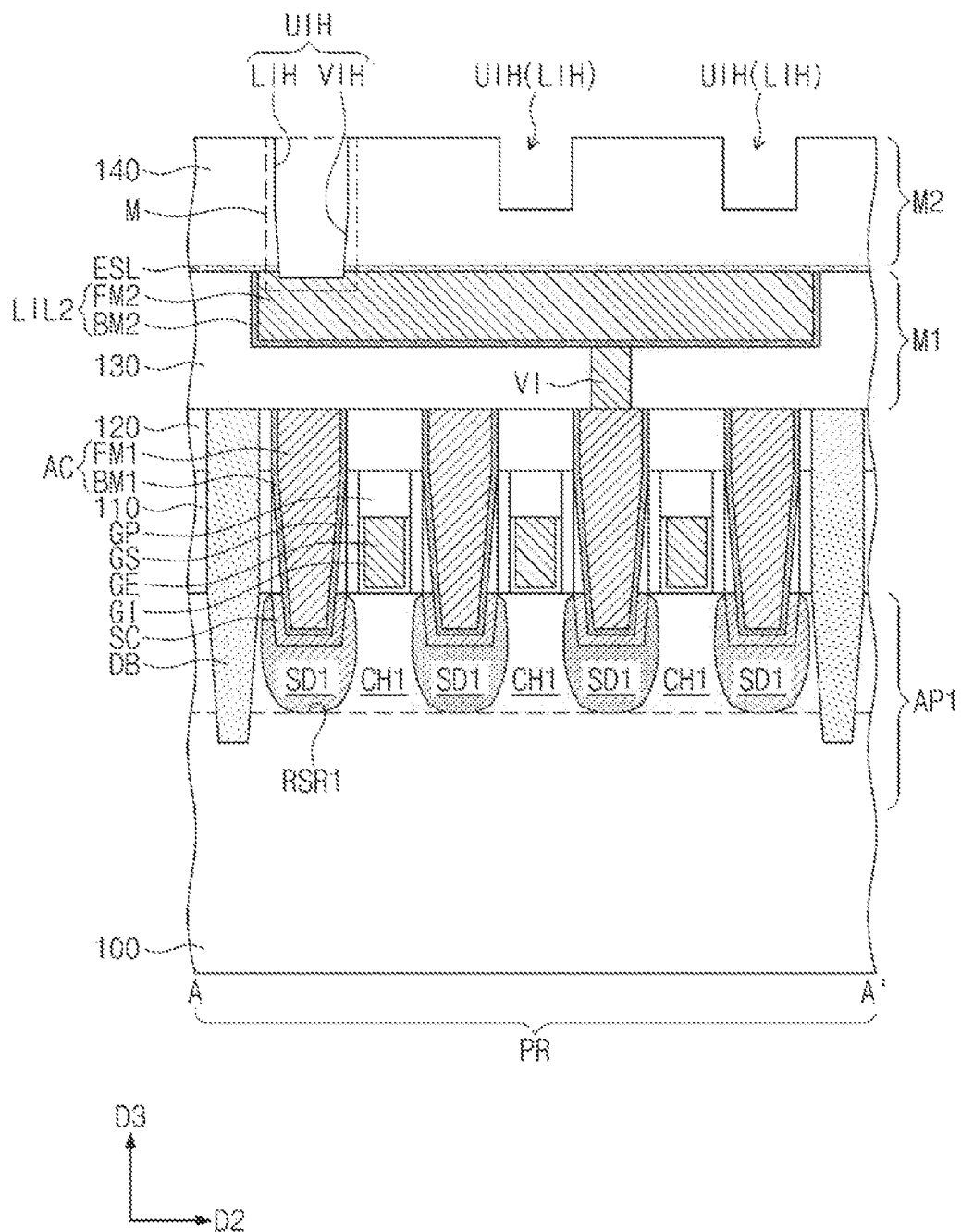
Figure 14B:
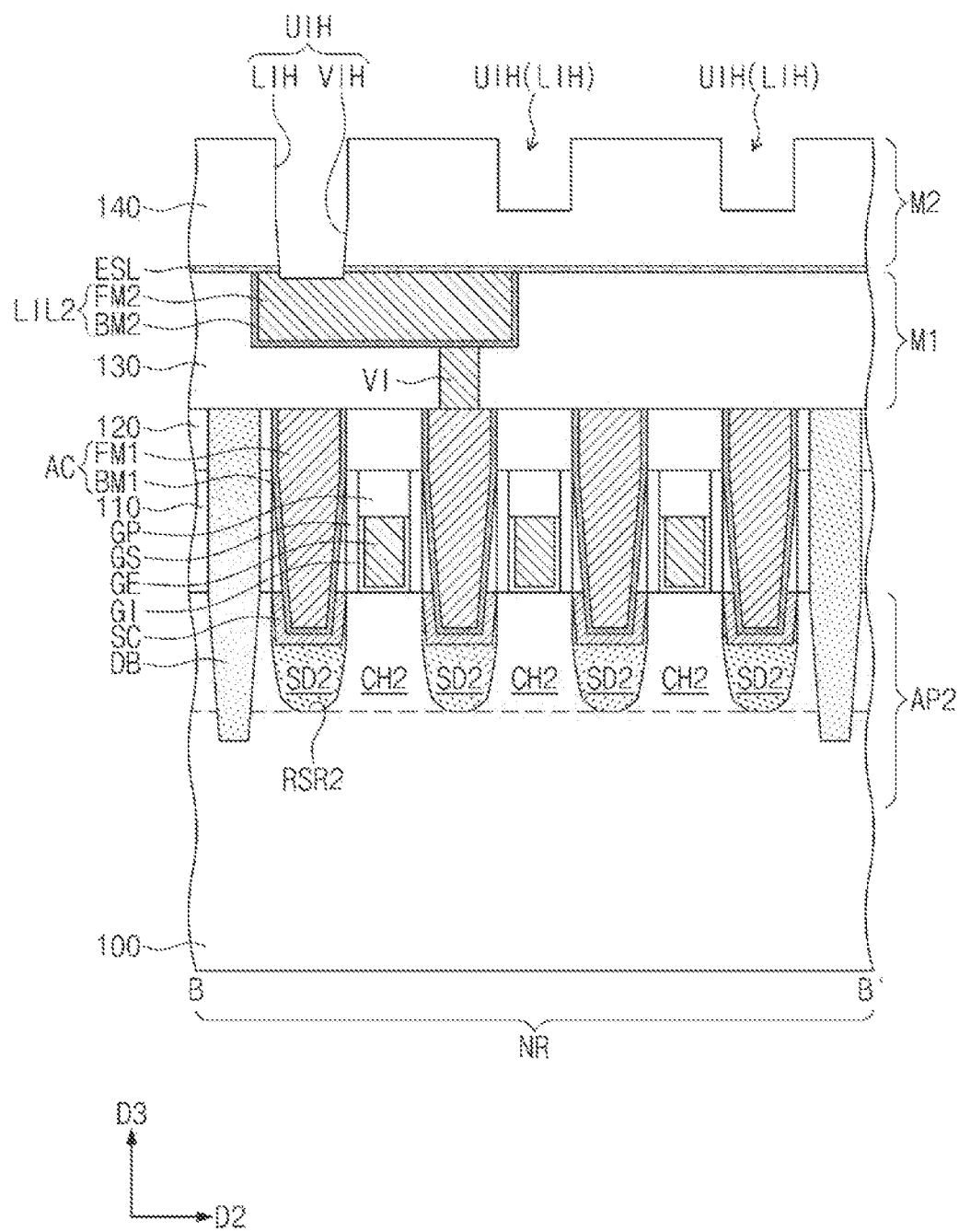
Figure 14C:
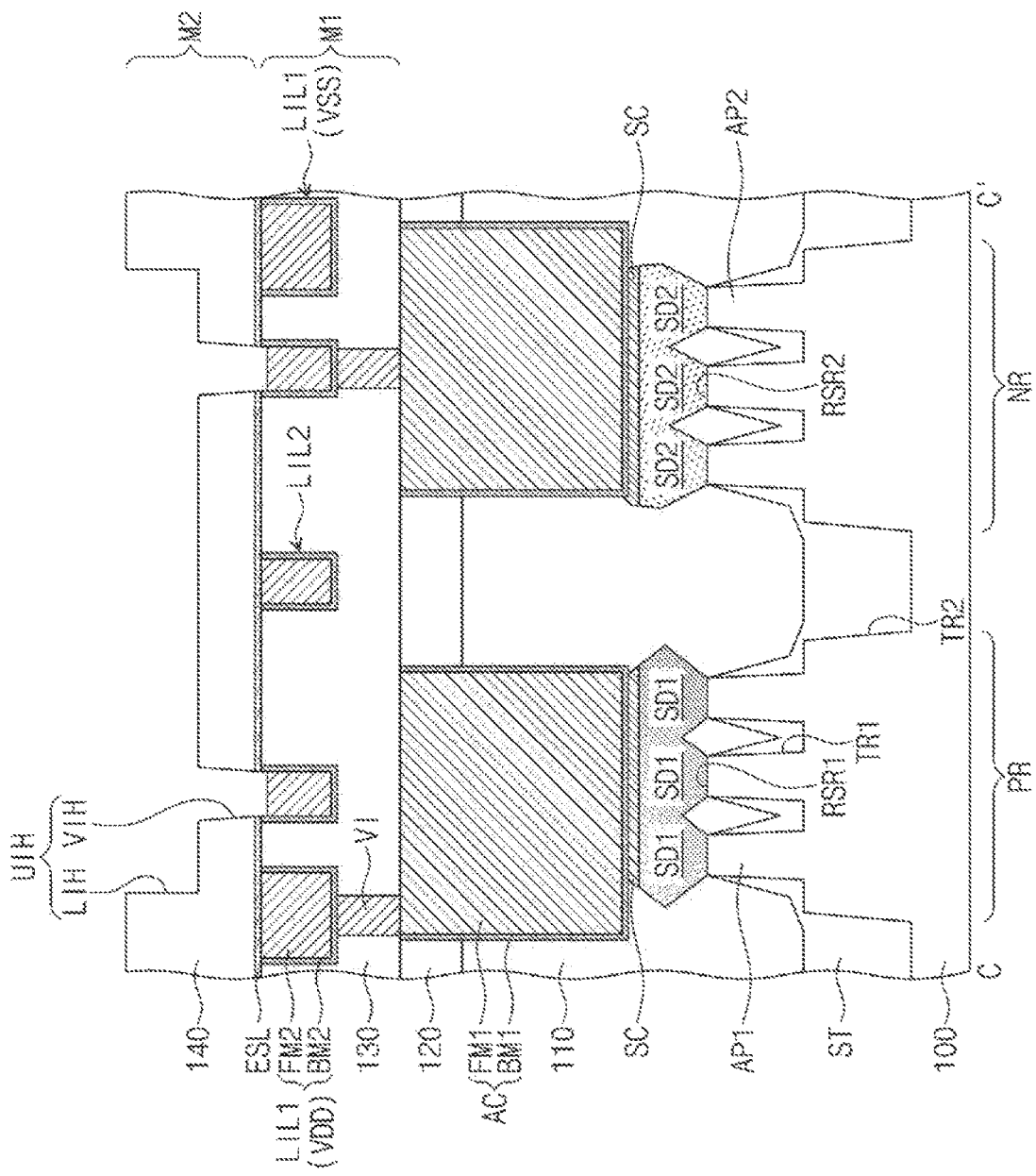
Figure 14D:
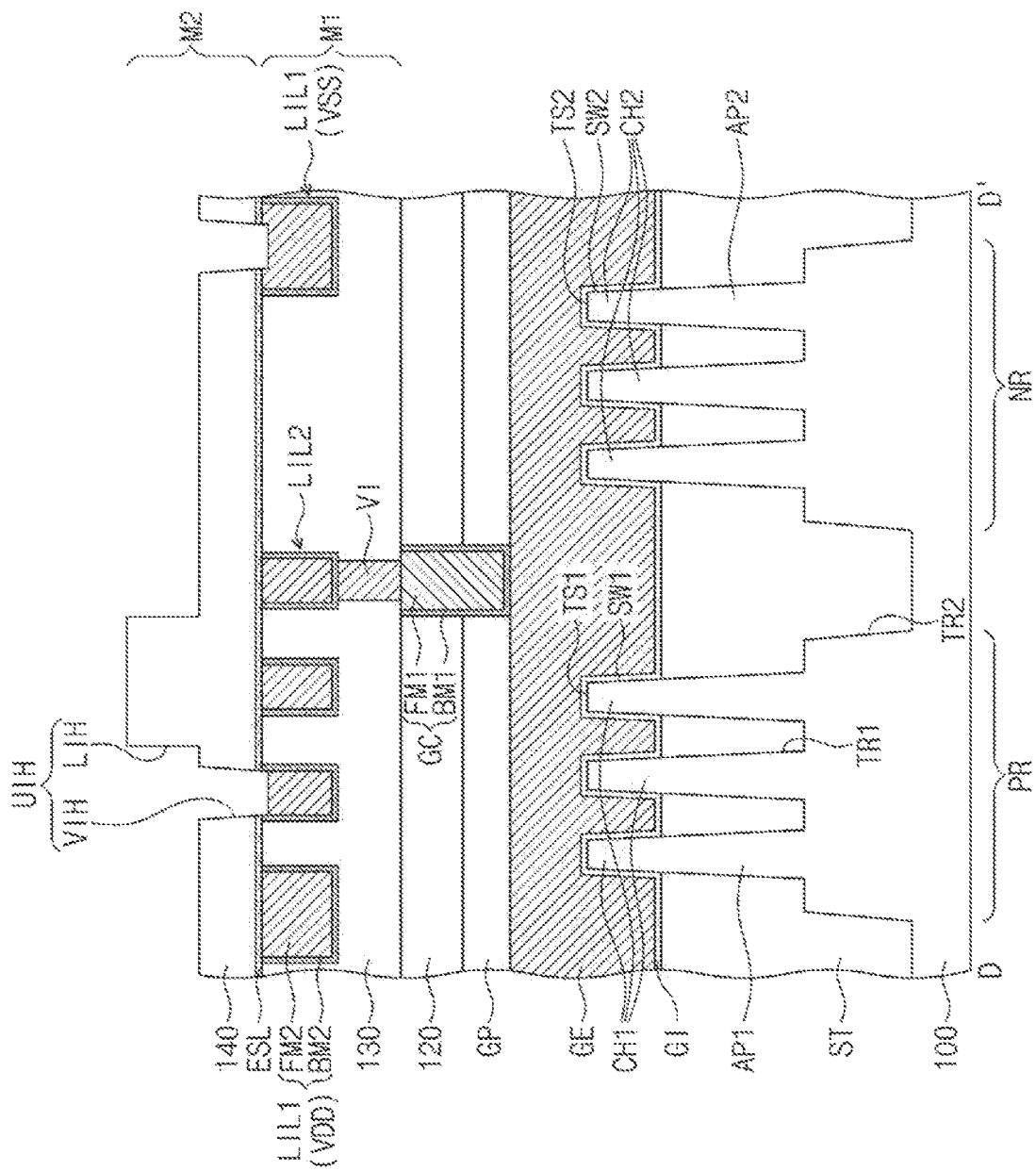

FIGS. 5, 7, 9, 11 and 13 are plan views illustrating a method for manufacturing a semiconductor device, according to some embodiments of the present inventive concepts. FIGS. 6, 8A, 10A, 12A and 14A are cross-sectional views taken along lines A-A' of FIGS. 5, 7, 9, 11 and 13, respectively. FIGS. 8B, 10B, 12B and 14B are cross-sectional views taken along lines B-B' of FIGS. 7, 9, 11 and 13, respectively. FIGS. 10C, 12C and 14C are cross-sectional views taken along lines C-C' of FIGS. 9, 11 and 13, respectively. FIGS. 10D, 12D and 14D are cross-sectional views taken along lines D-D' of FIGS. 9, 11 and 13, respectively. FIGS. 15 to 19 are enlarged cross-sectional views of a region 'M' of FIG. 14A to illustrate a method of forming an upper interconnection line according to some embodiments of the present inventive concepts.

Figure 6:
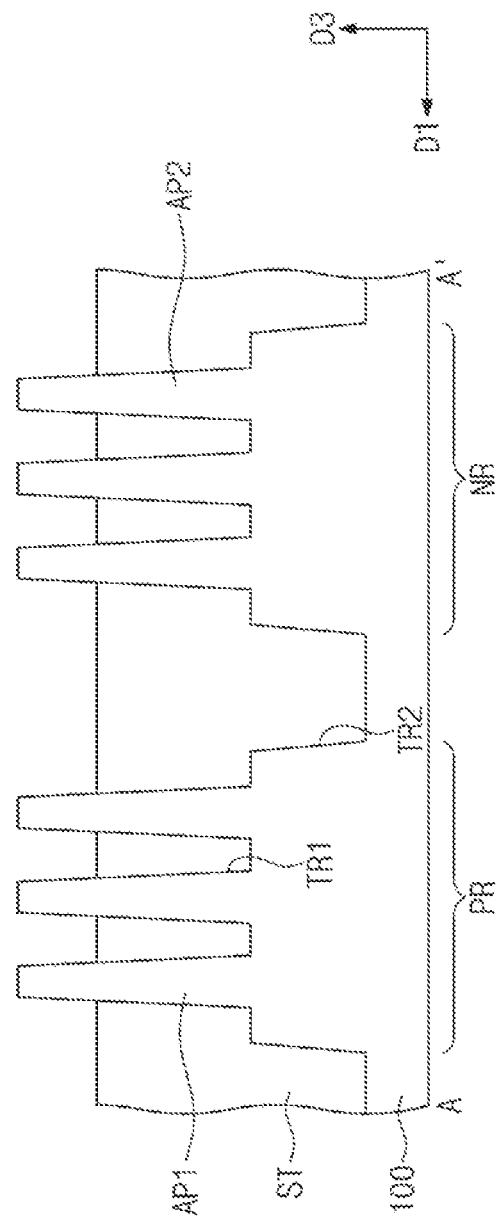
FIGS. 6, 8A, 10A, 12A and 14A are cross-sectional views taken along lines A-A' of FIGS. 5, 7, 9, 11 and 13, respectively.

Referring to FIGS. 5 and 6, a substrate 100 including a first active region PR and a second active region NR may be provided. The first active region PR and the second active region NR may define a logic cell LC on the substrate 100.

The substrate 100 may be patterned to form first and second active patterns AP1 and AP2. The first active patterns AP1 may be formed on the first active region PR, and the second active patterns AP2 may be formed on the second active region NR. First trenches TR1 may be formed between the first active patterns AP1 and between the second active patterns AP2. The substrate 100 may be patterned to form a second trench TR2 between the first active region PR and the second active region NR. The second trench TR2 may be deeper than the first trench TR1.

A device isolation layer ST may be formed on the substrate 100 to fill the first and second trenches TR1 and TR2. The device isolation layer ST may include an insulating material such as a silicon oxide layer. The device isolation layer ST may be recessed until upper portions of the first and second active patterns AP1 and AP2 are exposed. Thus, the upper portions of the first and second active patterns AP1 and AP2 may vertically protrude above the device isolation layer ST.

Figure 8A:
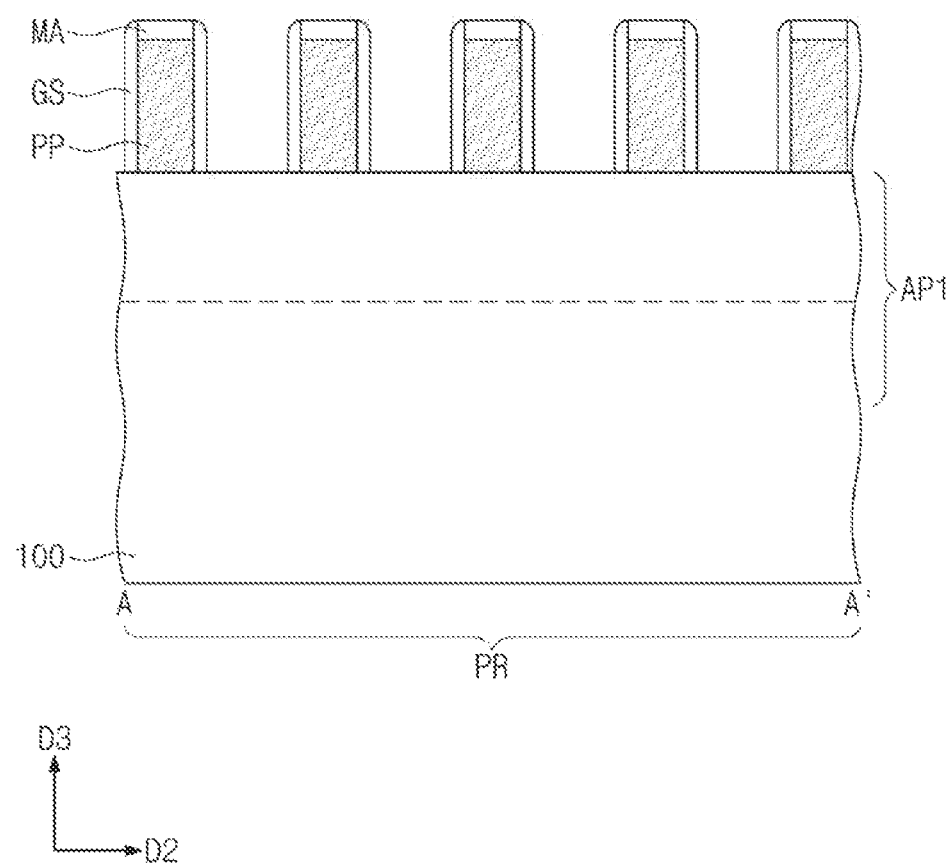
Figure 8B:
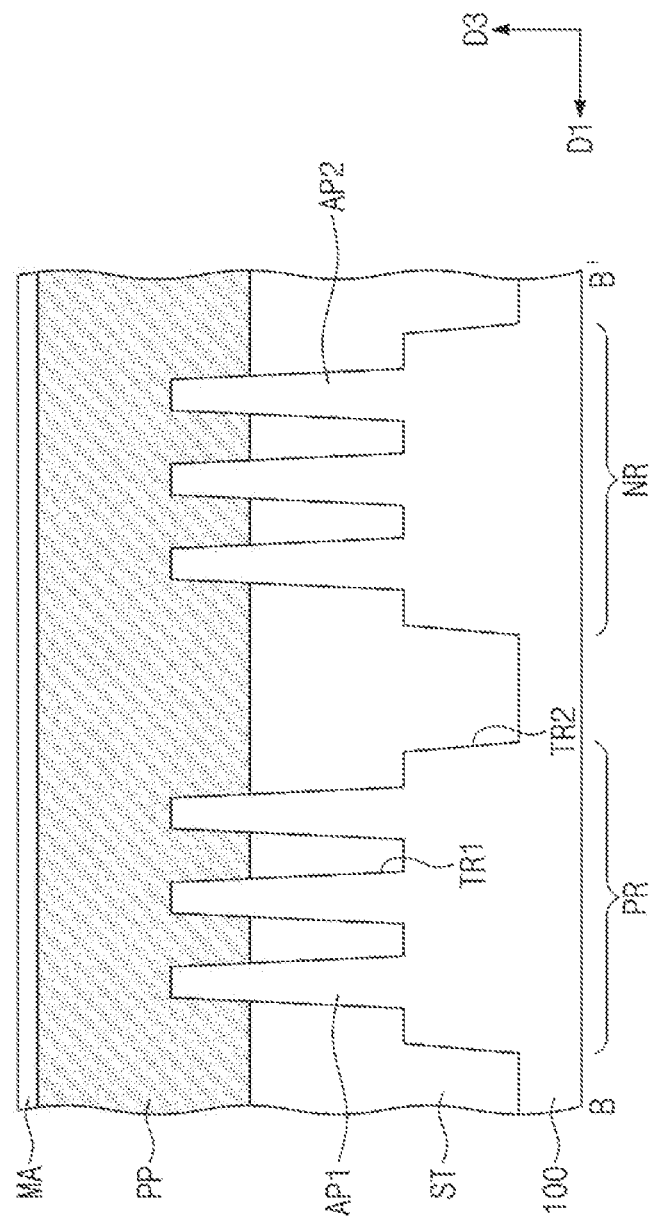
FIGS. 8B, 10B, 12B and 14B are cross-sectional views taken along lines B-B' of FIGS. 7, 9, 11 and 13, respectively.
Figure 9:
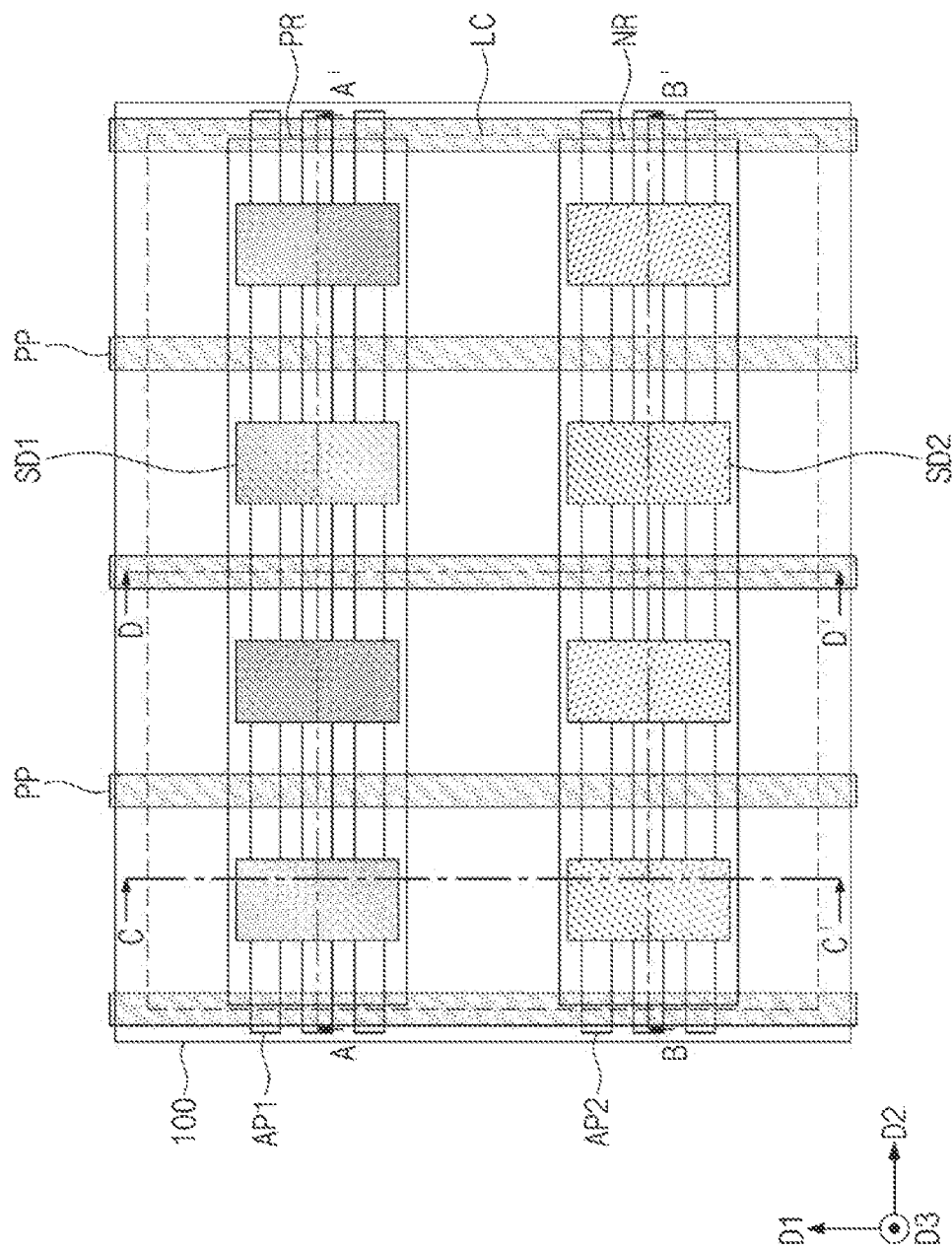

Referring to FIGS. 7, 8A and 8B, sacrificial patterns PP may be formed to intersect the first and second active patterns AP1 and AP2. The sacrificial patterns PP may have line shapes or bar shapes, which extend in the first direction D1. The sacrificial patterns PP may be arranged at a certain pitch in the second direction D2. In some embodiments, the sacrificial patterns PP may be spaced apart from each other by a uniform distance in the second direction D2 as illustrated in FIG. 7.

For example, the formation of the sacrificial patterns PP may include forming a sacrificial layer on an entire top surface of the substrate 100, forming hard mask patterns MA on the sacrificial layer, and patterning the sacrificial layer using the hard mask patterns MA as etch masks. The sacrificial layer may include, for example, poly-silicon.

A pair of gate spacers GS may be formed on opposing sidewalls of each of the sacrificial patterns PP, respectively. The formation of the gate spacers GS may include conformally forming a gate spacer layer on an entire top surface of the substrate 100 and anisotropically etching the gate spacer layer. For example, the gate spacer layer may include SiCN, SiCON, and/or SiN. In some embodiments, the gate spacer layer may be formed of a multi-layer including at least two of SiCN, SiCON, or SiN.

Referring to FIGS. 9 and 10A to 10D, first source/drain patterns SD1 may be formed in the upper portion of the first active pattern AP1. A pair of the first source/drain patterns SD1 may be formed at or adjacent opposing sides of each of the sacrificial patterns PP, respectively.

In detail, the upper portion of the first active pattern AP1 may be etched using the hard mask patterns MA and the gate spacers GS as etch masks to form first recess regions RSR1. The device isolation layer ST between the first active patterns AP1 may be recessed while the upper portions of the first active patterns AP1 are etched (see FIG. 10C).

In some embodiments, the first source/drain patterns SD1 may be formed by performing a selective epitaxial growth (SEG) process using inner surfaces of the first recess regions RSR1 of the first active pattern AP1 as a seed layer. Since the first source/drain patterns SD1 are formed, a first channel pattern CH1 may be defined between the pair of first source/drain patterns SD1. For example, the SEG process may include a chemical vapor deposition (CVD) process and/or a molecular beam epitaxy (MBE) process. The first source/drain patterns SD1 may include a semiconductor element (e.g., SiGe) of which a lattice constant is greater than that of a semiconductor element of the substrate 100. In some embodiments, each of the first source/drain patterns SD1 may be formed of a plurality of stacked semiconductor layers.

In some embodiments, dopants may be added (e.g., injected or implanted) in-situ into the first source/drain patterns SD1 during the SEG process for forming the first source/drain patterns SD1. In some embodiments, the dopants may be injected or implanted into the first source/drain patterns SD1 after the SEG process for forming the first source/drain patterns SD1. The first source/drain patterns SD1 may be doped with the dopants to have a first conductivity type (e.g., a P-type).

Second source/drain patterns SD2 may be formed in the upper portion of the second active pattern AP2. A pair of the second source/drain patterns SD2 may be formed at or adjacent opposing sides of each of the sacrificial patterns PP, respectively.

In detail, the upper portion of the second active pattern AP2 may be etched using the hard mask patterns MA and the gate spacers GS as etch masks to form second recess regions RSR2. In some embodiments, the second source/drain patterns SD2 may be formed by performing a SEG process using inner surfaces of the second recess regions RSR2 of the second active pattern AP2 as a seed layer. Since the second source/drain patterns SD2 are formed, a second channel pattern CH2 may be defined between the pair of second source/drain patterns SD2. For example, the second source/drain patterns SD2 may include the same semiconductor element (e.g., silicon) as the substrate 100. The second source/drain patterns SD2 may be doped with dopants to have a second conductivity type (e.g., an N-type).

The first source/drain patterns SD1 and the second source/drain patterns SD2 may be sequentially formed by different processes from each other. In other words, the first source/drain patterns SD1 may not be formed simultaneously with the second source/drain patterns SD2.

Referring to FIGS. 11 and 12A to 12D, a first interlayer insulating layer 110 may be formed to cover the first and second source/drain patterns SD1 and SD2, the hard mask patterns MA, and the gate spacers GS. For example, the first interlayer insulating layer 110 may include a silicon oxide layer.

The first interlayer insulating layer 110 may be planarized until top surfaces of the sacrificial patterns PP are exposed. The planarization process of the first interlayer insulating layer 110 may be performed using, for example, an etch-back process and/or a chemical mechanical polishing (CMP) process. The hard mask patterns MA may be completely removed during the planarization process. As a result, a top surface of the first interlayer insulating layer 110 may be substantially coplanar with the top surfaces of the sacrificial patterns PP and top surfaces of the gate spacers GS.

The sacrificial patterns PP may be replaced with gate electrodes GE, respectively. In detail, the exposed sacrificial patterns PP may be selectively removed. Empty spaces may be formed by the removal of the sacrificial patterns PP. A gate dielectric pattern GI, a gate electrode GE and a gate capping pattern GP may be formed in each of the empty spaces. The gate electrode GE may include a first metal pattern and a second metal pattern on the first metal pattern. The first metal pattern may be formed of a work function metal capable of adjusting a threshold voltage of a transistor, and the second metal pattern may be formed of a low-resistance metal.

A second interlayer insulating layer 120 may be formed on the first interlayer insulating layer 110. The second interlayer insulating layer 120 may include, for example, a silicon oxide layer. Active contacts AC may be formed in the second and first interlayer insulating layers 120 and 110. The active contacts AC may penetrate the second and first interlayer insulating layers 120 and 110 so as to be electrically connected to the first and second source/drain patterns SD1 and SD2. A gate contact GC may be formed. The gate contact GC may penetrate the second interlayer insulating layer 120 and the gate capping pattern GP so as to be electrically connected to the gate electrode GE.

A pair of isolation structures DB may be respectively formed at or adjacent opposing sides of the logic cell LC, which are spaced apart from each other in the second direction D2. The isolation structures DB may be formed where two gate electrodes GE at or adjacent opposing sides of the logic cell LC are formed. For example, the formation of the isolation structures DB may include forming holes which penetrate the first and second interlayer insulating layers 110 and 120 and the gate electrodes GE and extend into the first and second active patterns AP1 and AP2, and filling the holes with an insulating layer.

Referring to FIGS. 13 and 14A to 14D, a third interlayer insulating layer 130 may be formed on the second interlayer insulating layer 120. A first metal layer M1 may be formed in the third interlayer insulating layer 130. The formation of the first metal layer M1 may include forming first lower interconnection lines LIL1, second lower interconnection lines LIL2, and lower vias VI.

An etch stop layer ESL may be formed on the first metal layer M1. A fourth interlayer insulating layer 140 may be formed on the etch stop layer ESL. The fourth interlayer insulating layer 140 may be patterned to form interconnection holes UIH. The interconnection holes UIH may be formed using, for example, a photolithography process.

Each of the interconnection holes UIH may include a line hole LIH and a via hole VIH. The line hole LIH may be formed by recessing an upper portion of the fourth interlayer insulating layer 140. An etching process may be additionally performed on the line hole LIH to form the via hole VIH extending from the line hole LIH toward the first metal layer M1. The via hole VIE may expose a top surface of the lower interconnection line LIL1 and LIL2.

Referring again to FIGS. 1 and 2A to 2D, upper interconnection lines UIL may be formed by filling the interconnection holes UIH with a conductive material. For example, the formation of the upper interconnection line UIL may include forming a third barrier pattern BM3 in the interconnection hole UIH, and forming a third conductive pattern FM3 filling (e.g., completely filling) the interconnection hole UIH on the third barrier pattern BM3. For example, the upper interconnection lines UIL may be formed by a dual damascene process.

Figure 15:
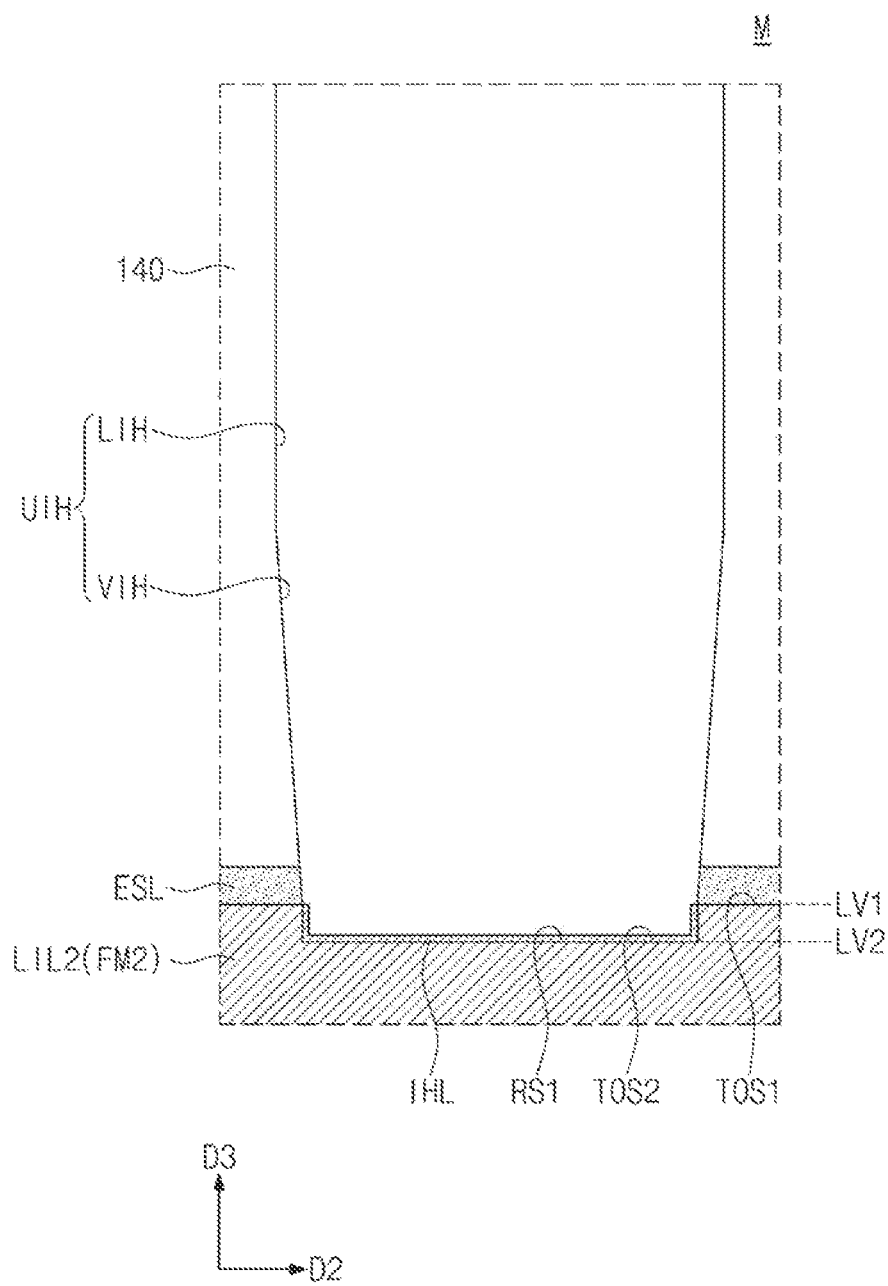
FIGS. 15 to 19 are enlarged cross-sectional views of a region 'M' of FIG. 14A to illustrate a method of forming an upper interconnection line according to some embodiments of the present inventive concepts.

The method of forming the upper interconnection line UIL according to the present inventive concepts will be described in detail with reference to FIGS. 15 to 19. Referring to FIG. 15, the via hole VIH may be formed to extend from the line hole LIH toward the second lower interconnection line LIL2. In the etching process for forming the via hole VIH, an upper portion of the second lower interconnection line LIL2 may be over-etched to form a first recess RS1. Thus, the second lower interconnection line LIL2 may include a first top surface TOS1 covered by the etch stop layer ESL, and a second top surface TOS2 exposed by the via hole VIH.

A metal deposition inhibiting layer IHL may be formed on an inner surface of the first recess RS1. The formation of the metal deposition inhibiting layer IHL may include providing an inhibitor into the interconnection hole UIH. The inhibitor may include an organic compound containing carbon (C) as a main element. The inhibitor may be selectively adsorbed on a metal layer and may not be adsorbed on an inorganic layer such as a silicon oxide layer or a silicon nitride layer. Thus, the metal deposition inhibiting layer IHL may be selectively formed on only the exposed surface of the second lower interconnection line LIL2. The metal deposition inhibiting layer IHL may not be formed on an exposed surface of the etch stop layer ESL and an exposed surface of the fourth interlayer insulating layer 140.

The metal deposition inhibiting layer IHL may be formed of a monolayer or a layer having a thickness less than 1 nm. As described above, the metal deposition inhibiting layer IHL may be selectively formed in only the first recess RS1. The metal deposition inhibiting layer IHL may cover the second top surface TOS2 of the second lower interconnection line LIL2.

Figure 16:
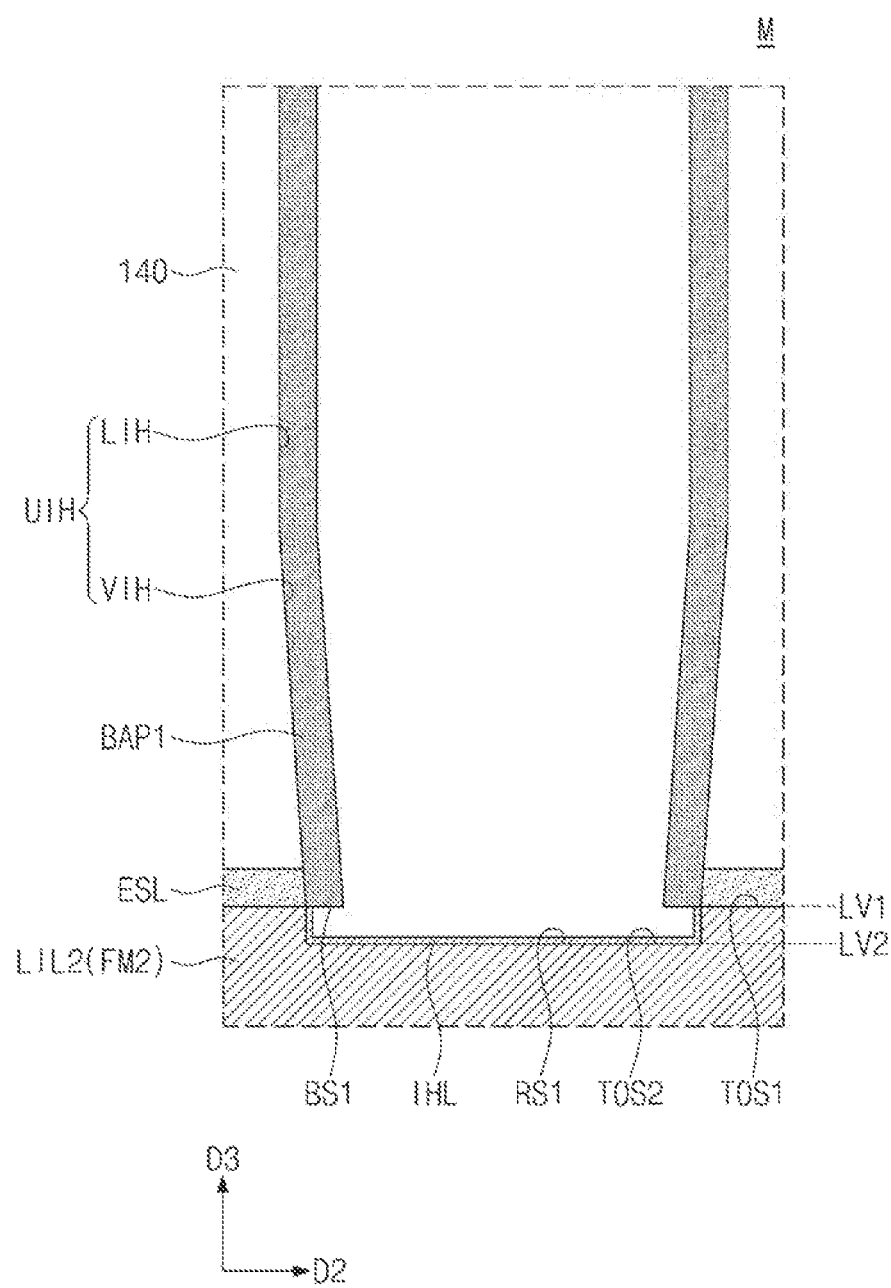

Referring to FIG. 16, a first barrier layer BAP1 may be formed in the interconnection hole UIH. The first barrier layer BAP1 may not be formed on the metal deposition inhibiting layer IHL. In other words, due to the metal deposition inhibiting layer IHL, the first barrier layer BAP1 may be selectively formed on only the exposed surface of the etch stop layer ESL and the exposed surface of the fourth interlayer insulating layer 140. The first barrier layer BAP1 may not be formed on the second lower interconnection line LIL2.

For example, the formation of the first barrier layer BAP1 may include providing a precursor of the first barrier layer BAP1 into the interconnection hole UIH. The formation of the first barrier layer BAP1 may include, for example, performing an atomic layer deposition (ALD) and/or chemical vapor deposition (CVD) process using the precursor. The precursor may not be adsorbed on the metal deposition inhibiting layer IHL. The precursor may be selectively adsorbed on only the etch stop layer ESL and the fourth interlayer insulating layer 140. Thus, the first barrier layer BAP1 may be selectively formed on an inner sidewall of the interconnection hole UIH except the first recess RS1. For example, the first barrier layer BAP1 may include a tantalum nitride (TaN) layer, a titanium nitride (TiN) layer, a tantalum oxide (TaO) layer, a titanium oxide (TiO) layer, a manganese nitride (MnN) layer, and/or a manganese oxide (MnO) layer.

Figure 17:
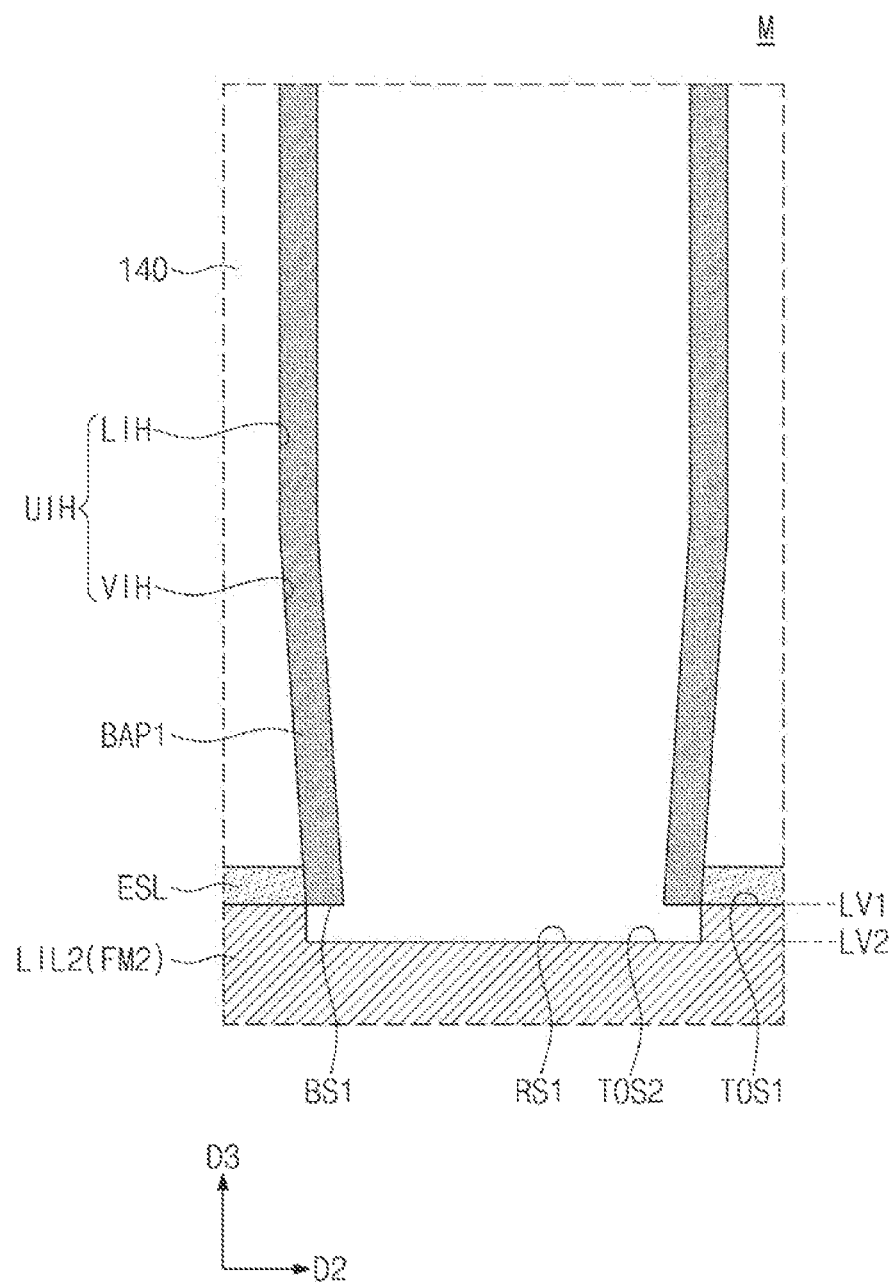

Referring to FIG. 17, the metal deposition inhibiting layer IHL may be selectively removed. For example, the metal deposition inhibiting layer IHL may include the organic compound capable of being burned at a relatively low temperature. Thus, the metal deposition inhibiting layer IHL may be removed by an ash process performed at a high temperature. A surface of the second lower interconnection line LIL2, which defines the first recess RS1, may be exposed by the removal of the metal deposition inhibiting layer IHL. In other words, the second top surface TOS2 of the second lower interconnection line LIL2 may be exposed.

Figure 18:
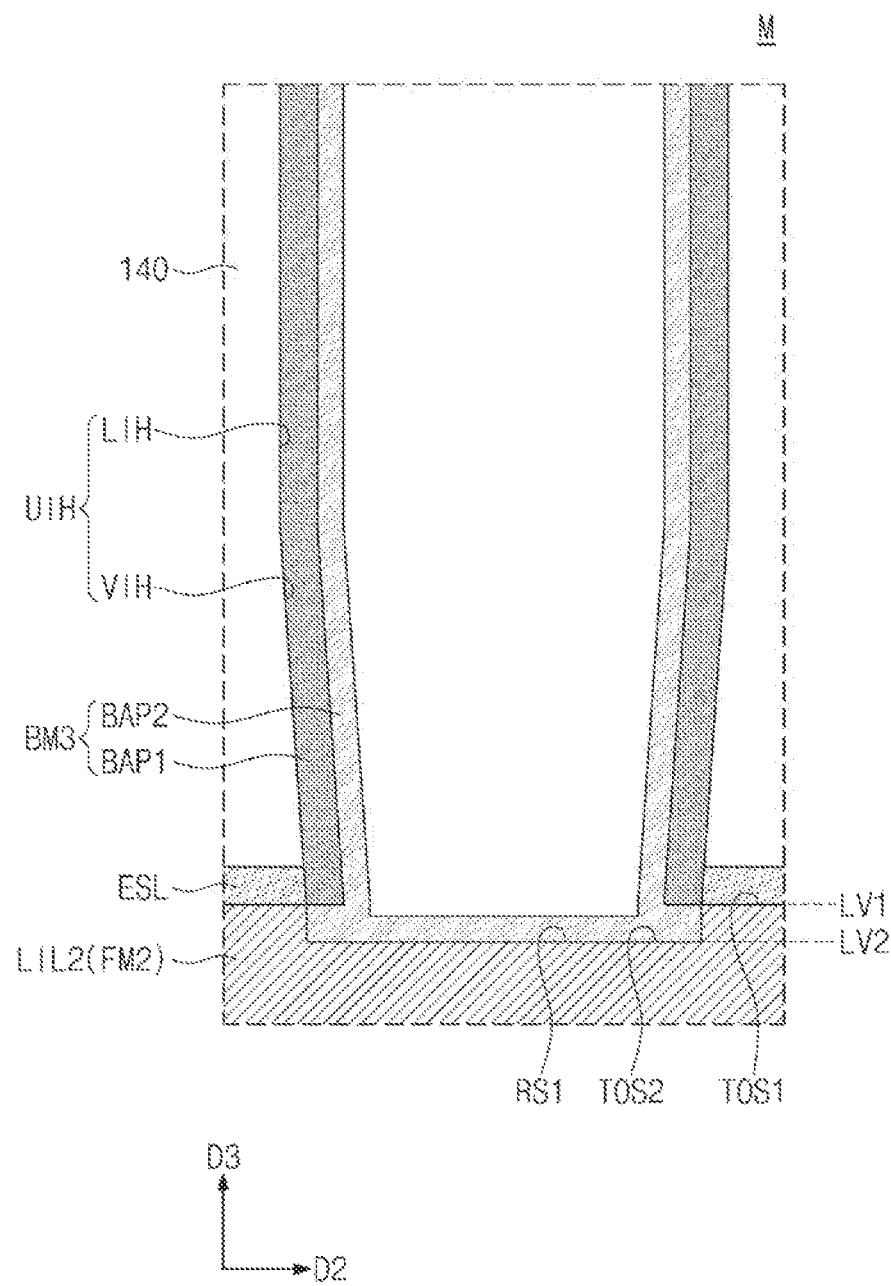

Referring to FIG. 18, a second barrier layer BAP2 may be formed in the interconnection hole UIH. The second barrier layer BAP2 may be conformally formed on the first barrier layer BAP1. The second barrier layer BAP2 may also be formed on the surface of the second lower interconnection line LIL2 exposed by the removal of the metal deposition inhibiting layer IHL. In other words, the second barrier layer BAP2 may be formed to directly cover the exposed surface (e.g., the second top surface TOS2) of the second lower interconnection line LIL2. Meanwhile, the inner sidewall of the interconnection hole UIH may be covered by the first barrier layer BAP1. The first barrier layer BAP1 and the second barrier layer BAP2 may constitute the third barrier pattern BM3.

The second barrier layer BAP2 may be formed of a material of which a resistivity is lower than that of the first barrier layer BAP1. For example, the second barrier layer BAP2 may include tantalum, titanium, tungsten, nickel, cobalt, platinum, and/or graphene. In other words, the exposed surface of the second lower interconnection line LIL2 may be covered by a metal having a low resistivity (e.g., a resistivity lower than a resistivity of the first barrier layer BAP1).

Figure 19:
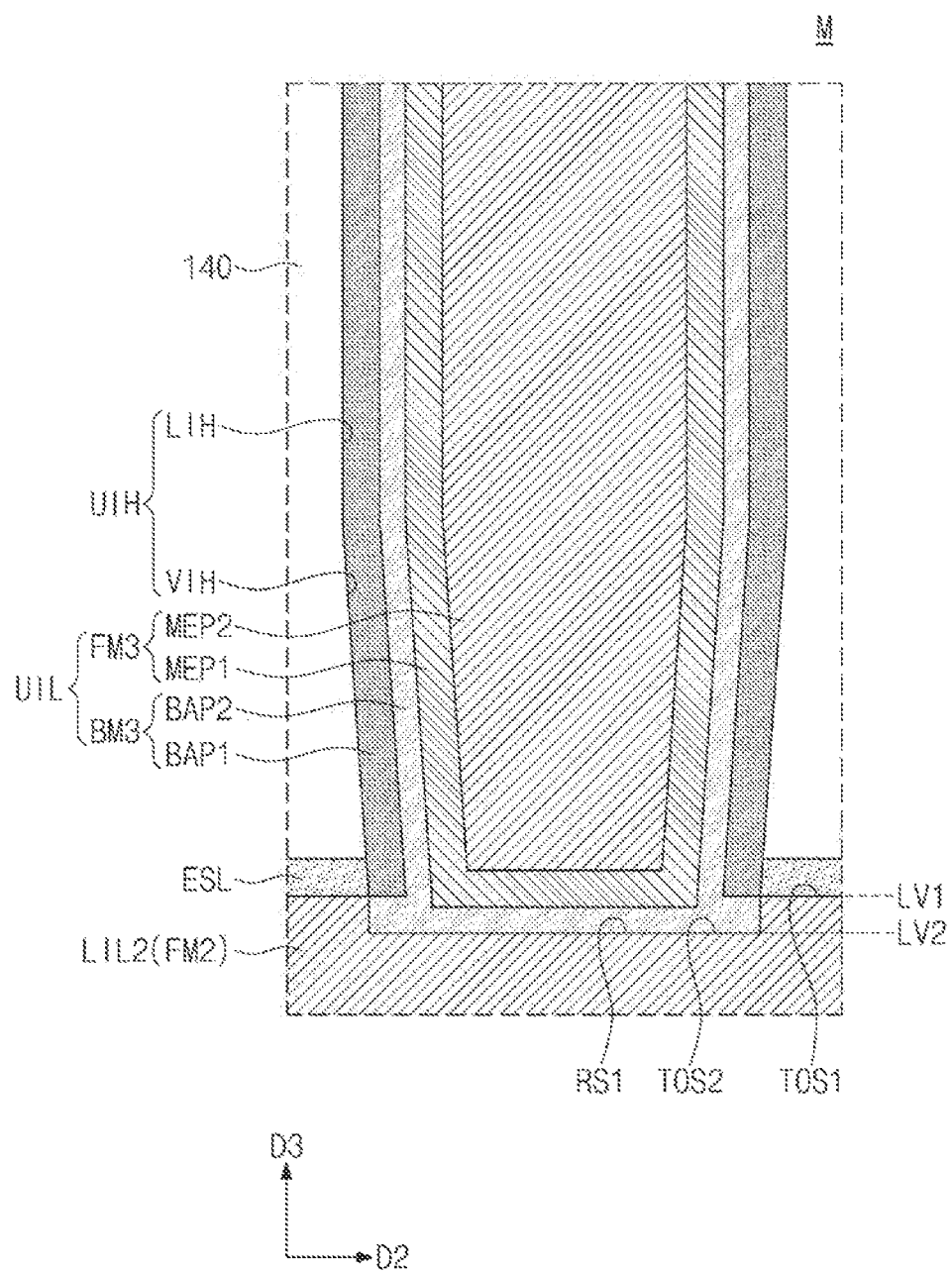

Referring to FIG. 19, the third conductive pattern FM3 completely filling the interconnection hole UIH may be formed on the second barrier layer BAP2. The formation of the third conductive pattern FM3 may include conformally forming a first conductive layer MEP1 on the second barrier layer BAP2, and forming a second conductive layer MEP2 on the first conductive layer MEP1. For example, the first conductive layer MEP1 and the second conductive layer MEP2 may include different metals selected from a group consisting of copper (Cu), cobalt (Co), ruthenium (Ru), tungsten (W), molybdenum (Mo), aluminum (Al), silver (Ag), and gold (Au).

Figure 2A:
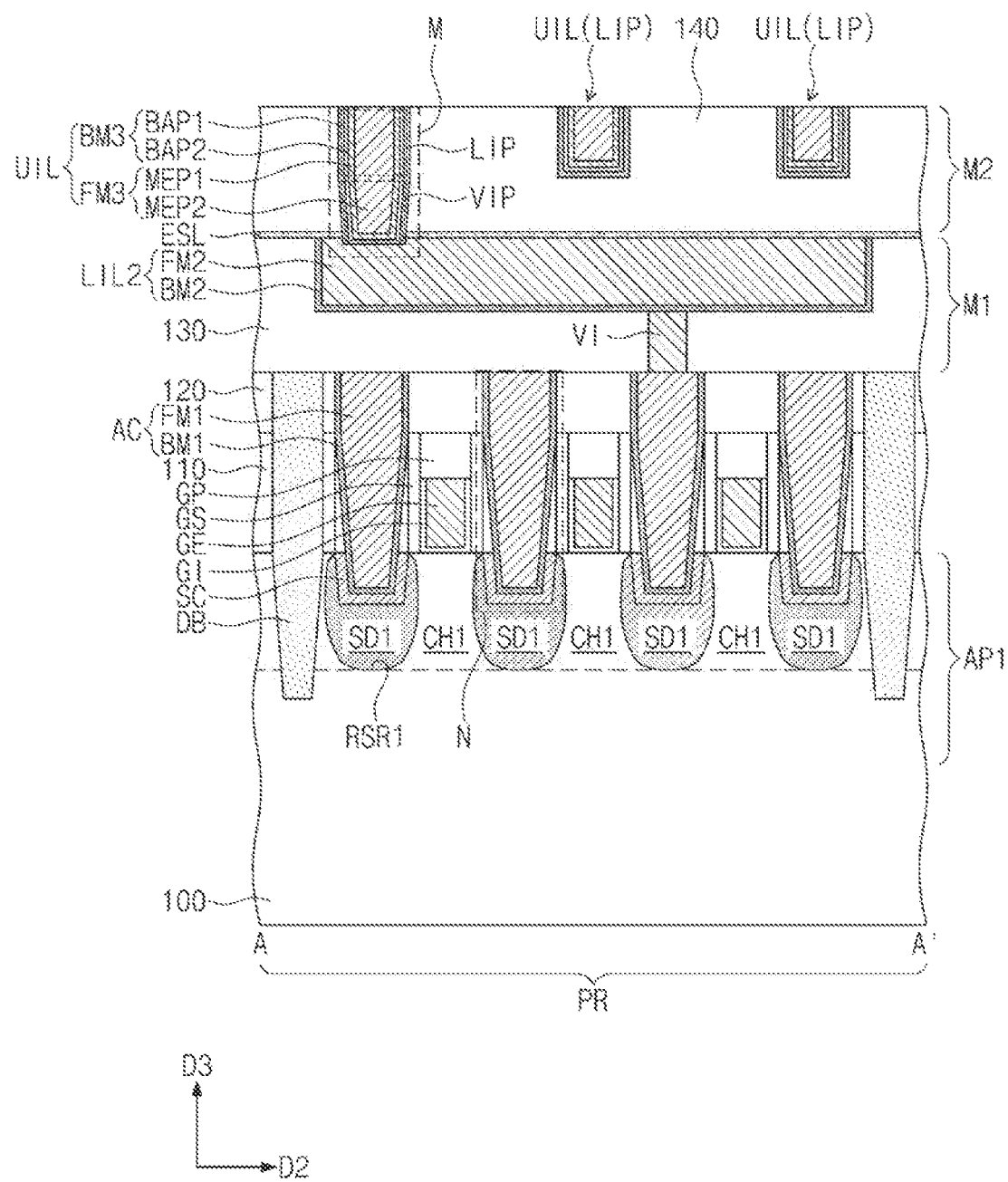
Figure 2B:
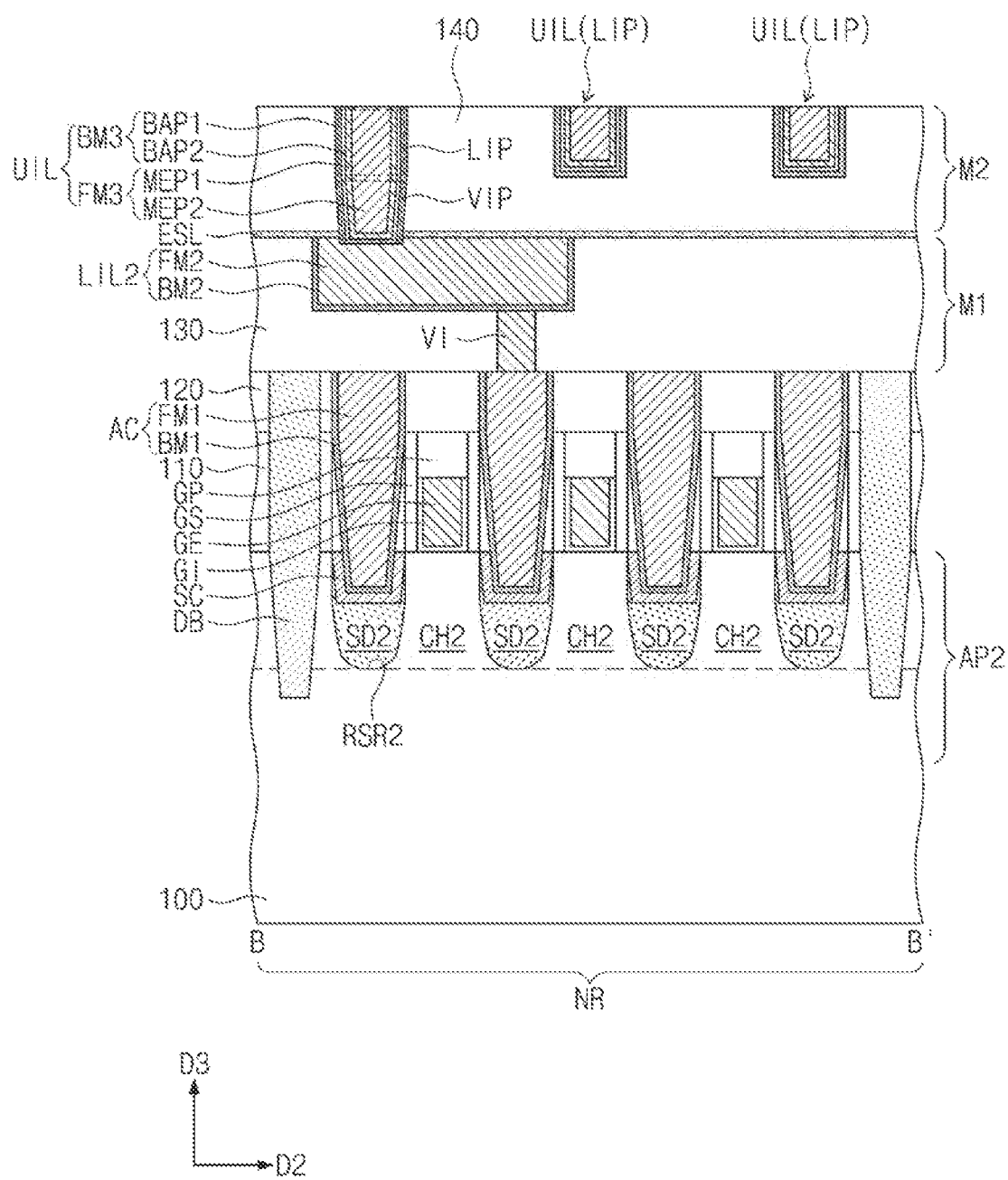
Figure 2D:
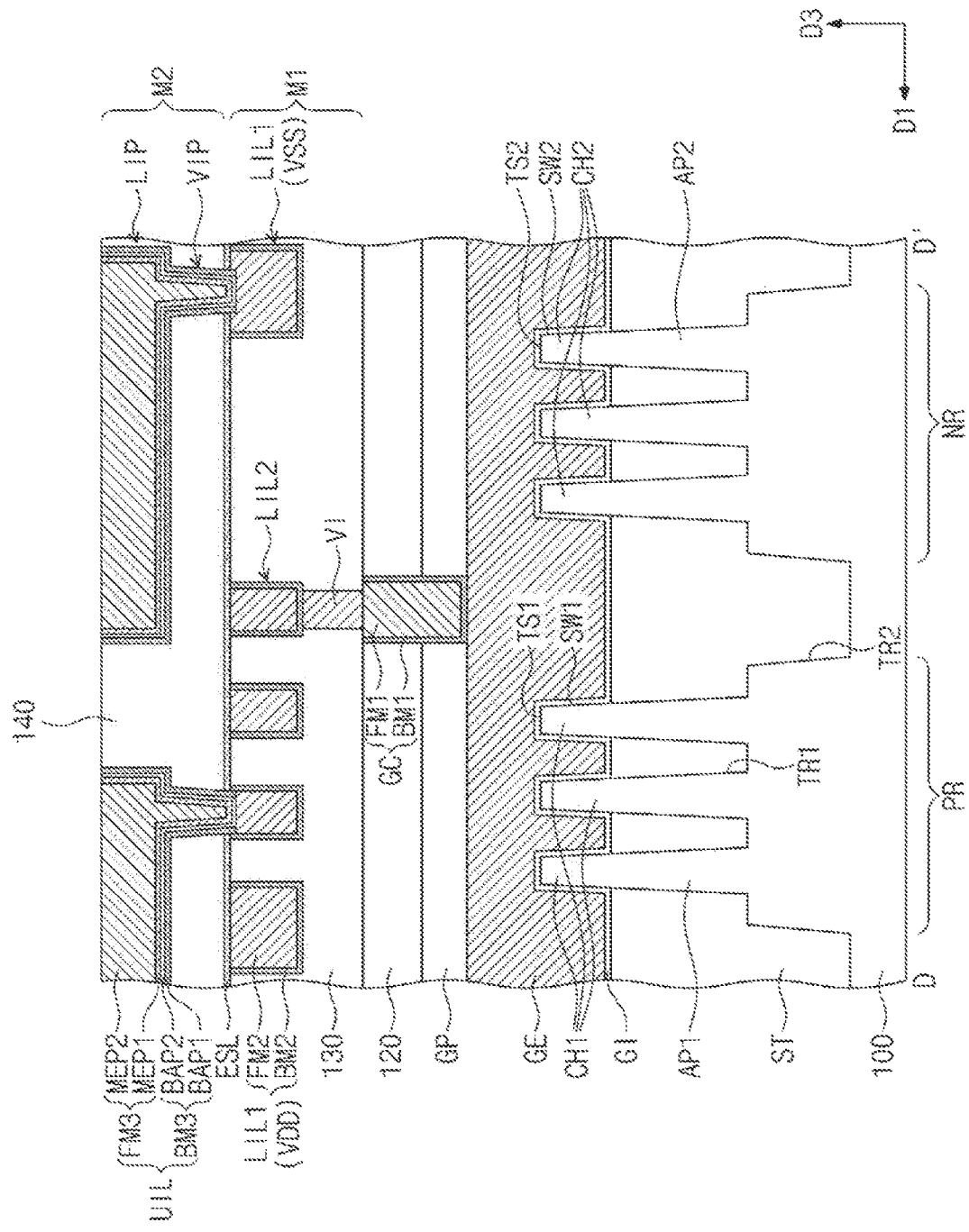
Figure 3:
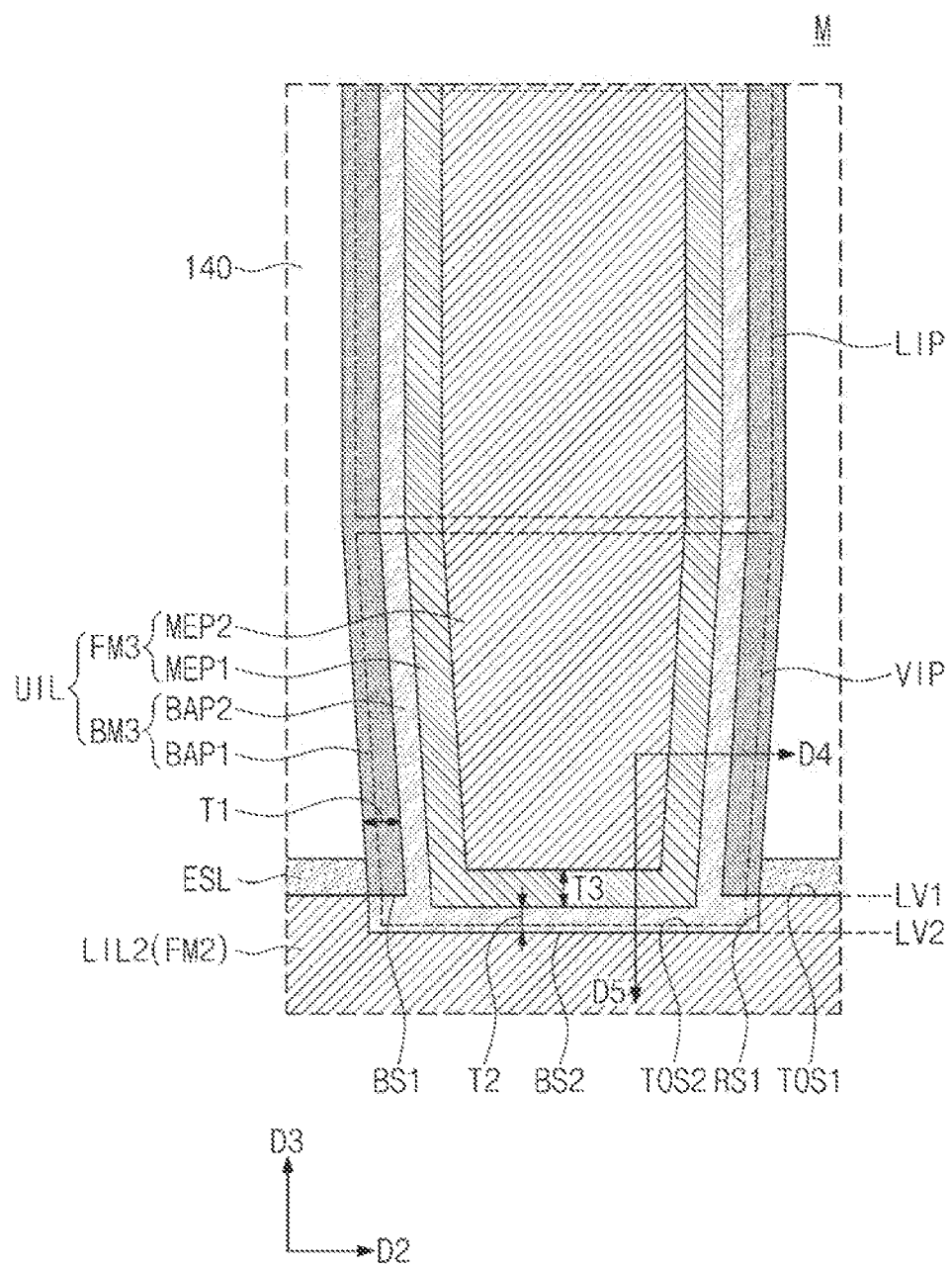
FIG. 3 is an enlarged cross-sectional view of a region 'M' of FIG. 2A.

FIGS. 20 to 29 are enlarged cross-sectional views of the region 'M' of FIG. 2A illustrating semiconductor devices according to some embodiments of the present inventive concepts. The descriptions provided with reference to FIGS. 1, 2A to 2D and 3 may be omitted for the purpose of ease and convenience in explanation. In other words, differences between the present embodiments and the embodiments of FIGS. 1, 2A to 2D and 3 will be mainly described hereinafter.

Figure 20:
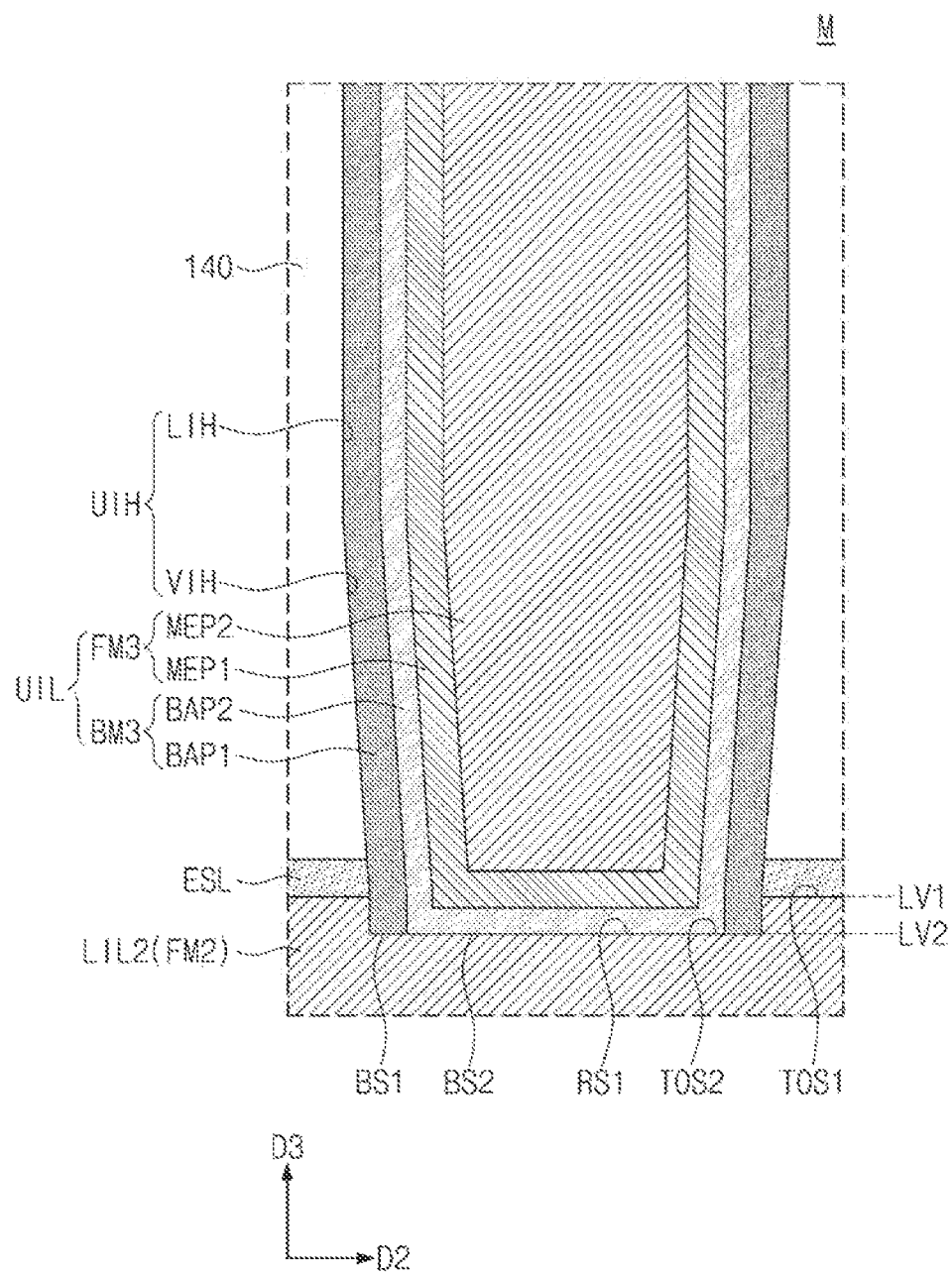
FIGS. 20 to 29 are enlarged cross-sectional views of the region 'M' of FIG. 2A to illustrate semiconductor devices according to some embodiments of the present inventive concepts.

Referring to FIG. 20, the first barrier layer BAP1 may have a first bottom surface BS1. The first bottom surface BS1 may be in contact with at least a portion of the second top surface TOS2 of the second lower interconnection line LIL2. The second barrier layer BAP2 may have a second bottom surface BS2. The second barrier layer BAP2 may cover a remaining portion of the second top surface TOS2 except the at least a portion being in contact with the first bottom surface BS1. The second barrier layer BAP2 may cover 80% or more of an area of the second top surface TOS2. The first bottom surface BS1 and the second bottom surface BS2 may be located at substantially the same level. For example, the first bottom surface BS1 and the second bottom surface BS2 may be located at the second level LV2 lower than the first level LV1. In some embodiments, the first bottom surface BS1 and the second bottom surface BS2 may be coplanar with each other.

Figure 21:
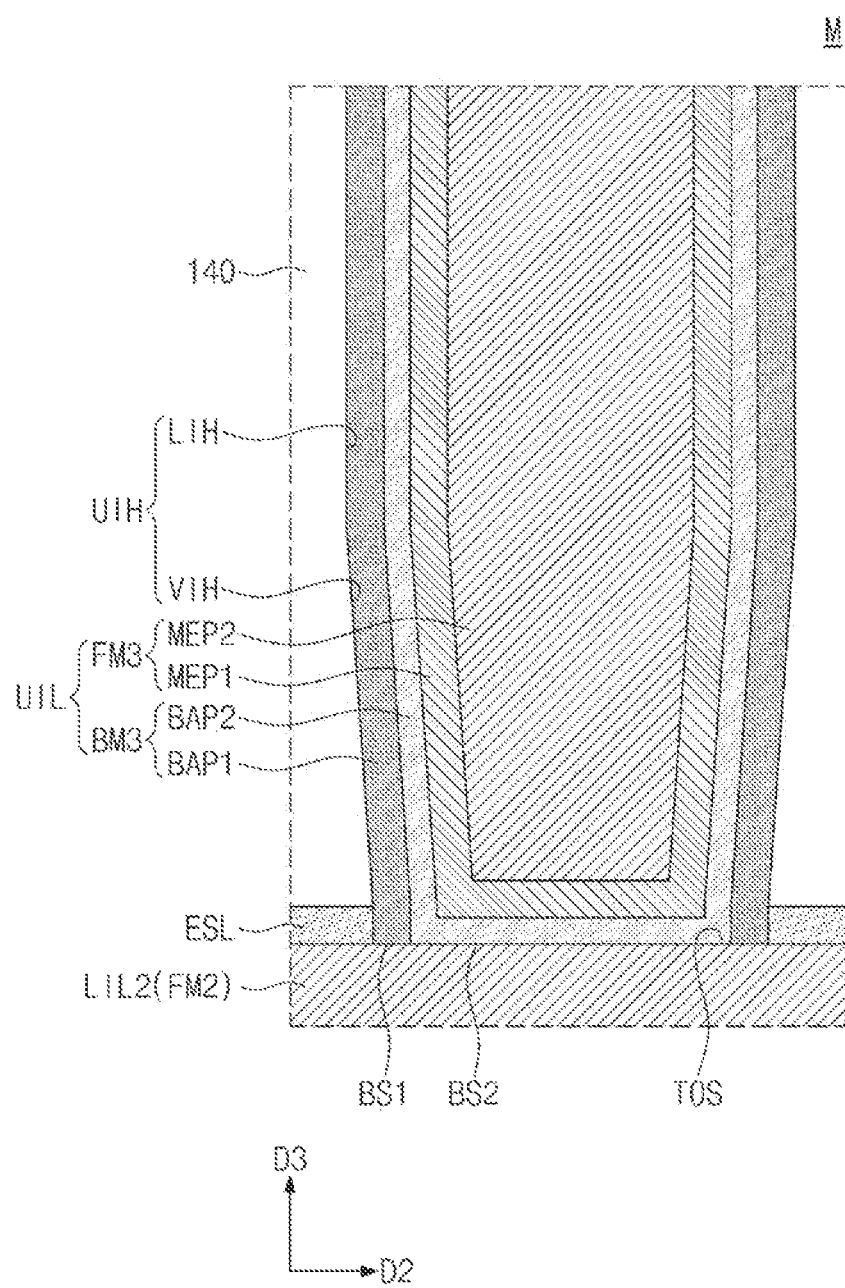

Referring to FIG. 21, like FIG. 20, the first bottom surface BS1 of the first barrier layer BAP1 and the second bottom surface BS2 of the second barrier layer BAP2 may cover a top surface TOS of the second lower interconnection line LIL2. The second barrier layer BAP2 may cover 80% or more of an area of the top surface TOS exposed by the via hole VIH. According to the present embodiments, the first recess RS1 may be omitted. Thus, the first bottom surface BS1 and the second bottom surface BS2 may be located at substantially the same level as a bottom surface of the etch stop layer ESL.

Figure 22:
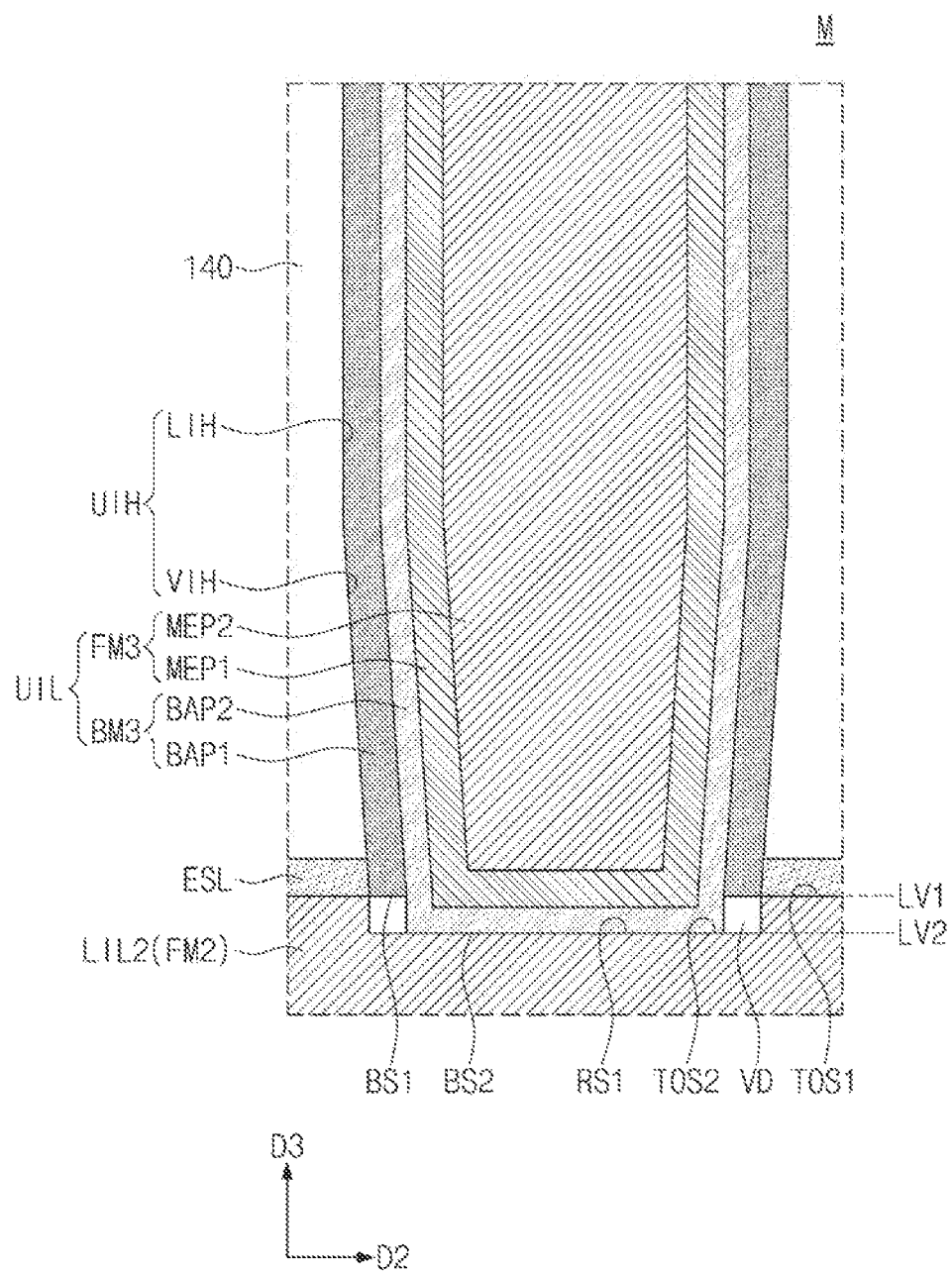

Referring to FIG. 22, the first bottom surface BS1 of the first barrier layer BAP1 may be spaced apart from the second top surface TOS2 of the second lower interconnection line LIL2 in the third direction D3. A void VD may be provided between the first bottom surface B Si of the first barrier layer BAP1 and the second top surface TOS2 of the second lower interconnection line LIL2. The second barrier layer BAP2 may not cover the first bottom surface BS1 of the first barrier layer BAP1. The void VD may be formed in a remaining region of the first recess RS1, which is not filled with the second barrier layer BAP2.

Figure 23:
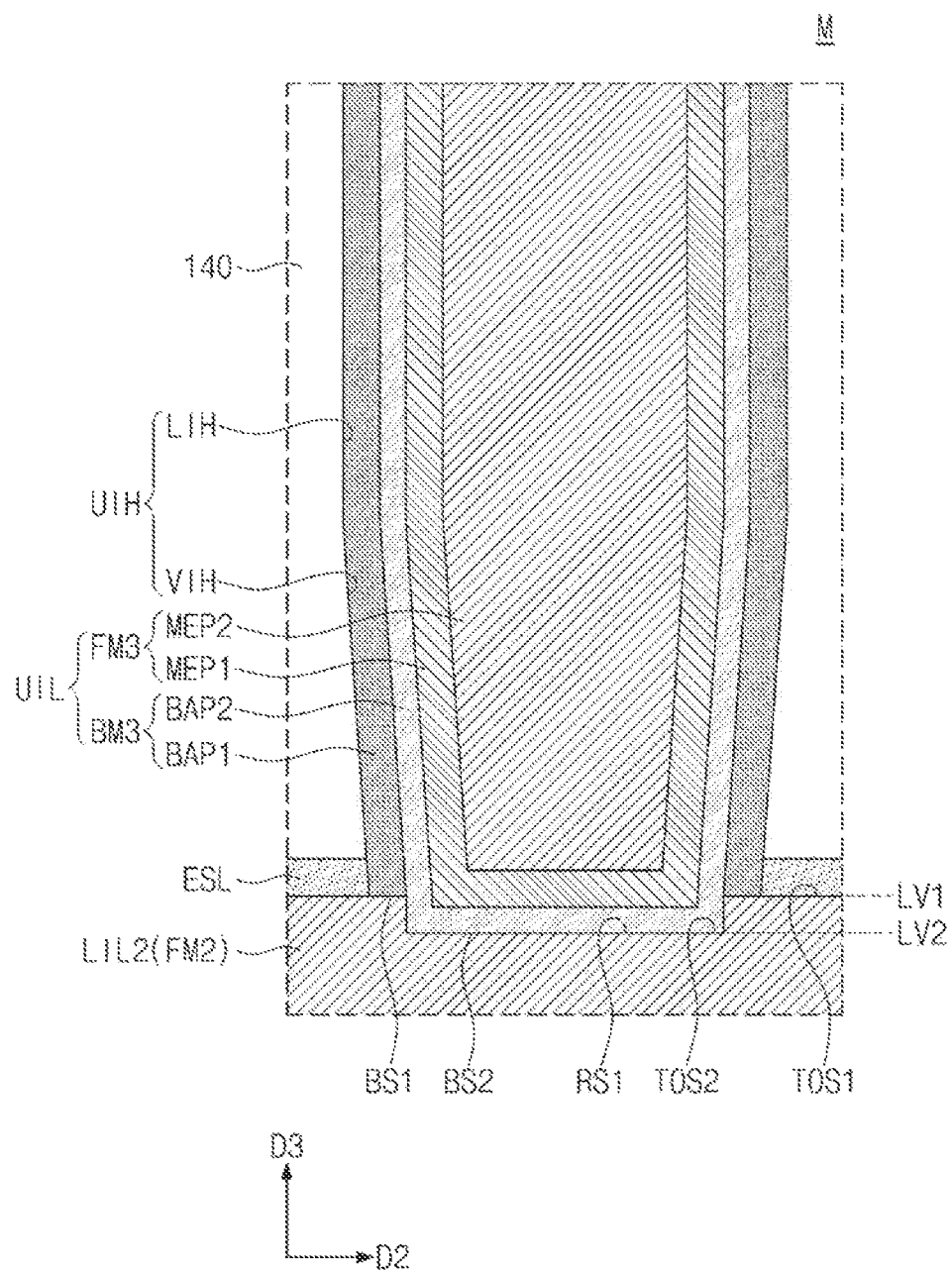

Referring to FIG. 23, the first bottom surface BS1 of the first barrier layer BAP1 may be in contact with the first top surface TOS1 of the second lower interconnection line LIL2. In other words, the first bottom surface BS1 of the first barrier layer BAP1 may be located at the first level LV1. The second bottom surface BS2 of the second barrier layer BAP2 may be in contact with the second top surface TOS2 of the second lower interconnection line LIL2. The second bottom surface BS2 of the second barrier layer BAP2 may be lower than the first bottom surface BS1.

Figure 24:
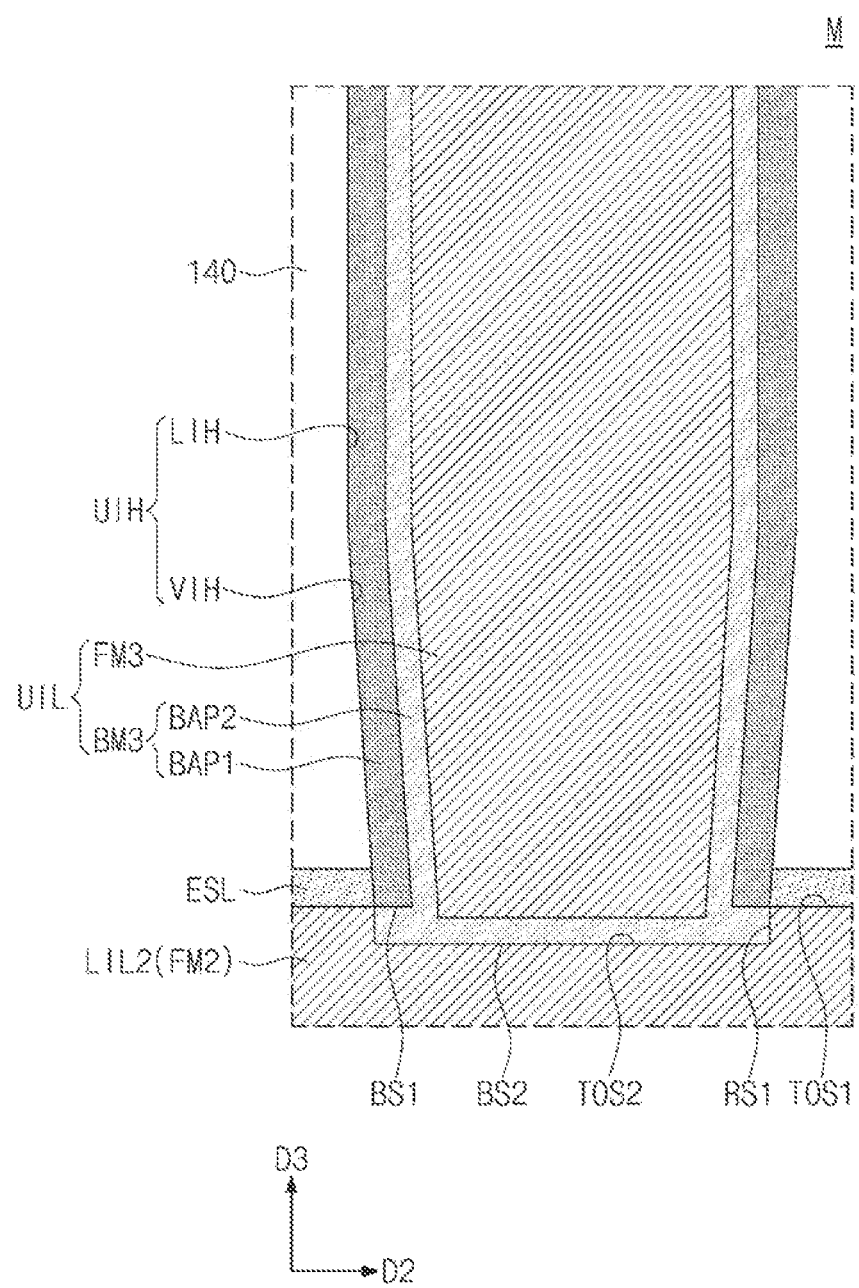

Referring to FIG. 24, the third conductive pattern FM3 of the upper interconnection line UIL may be formed of a single metal layer. In other words, the first conductive layer MEP1 of the first and second conductive layers MEP1 and MEP2 constituting the third conductive pattern FM3 of FIG. 3 may be omitted. The third conductive pattern FM3 may include a metal selected from a group consisting of copper (Cu), cobalt (Co), ruthenium (Ru), tungsten (W), molybdenum (Mo), aluminum (Al), silver (Ag), and gold (Au). For example, the third conductive pattern FM3 may include copper (Cu).

Figure 25:
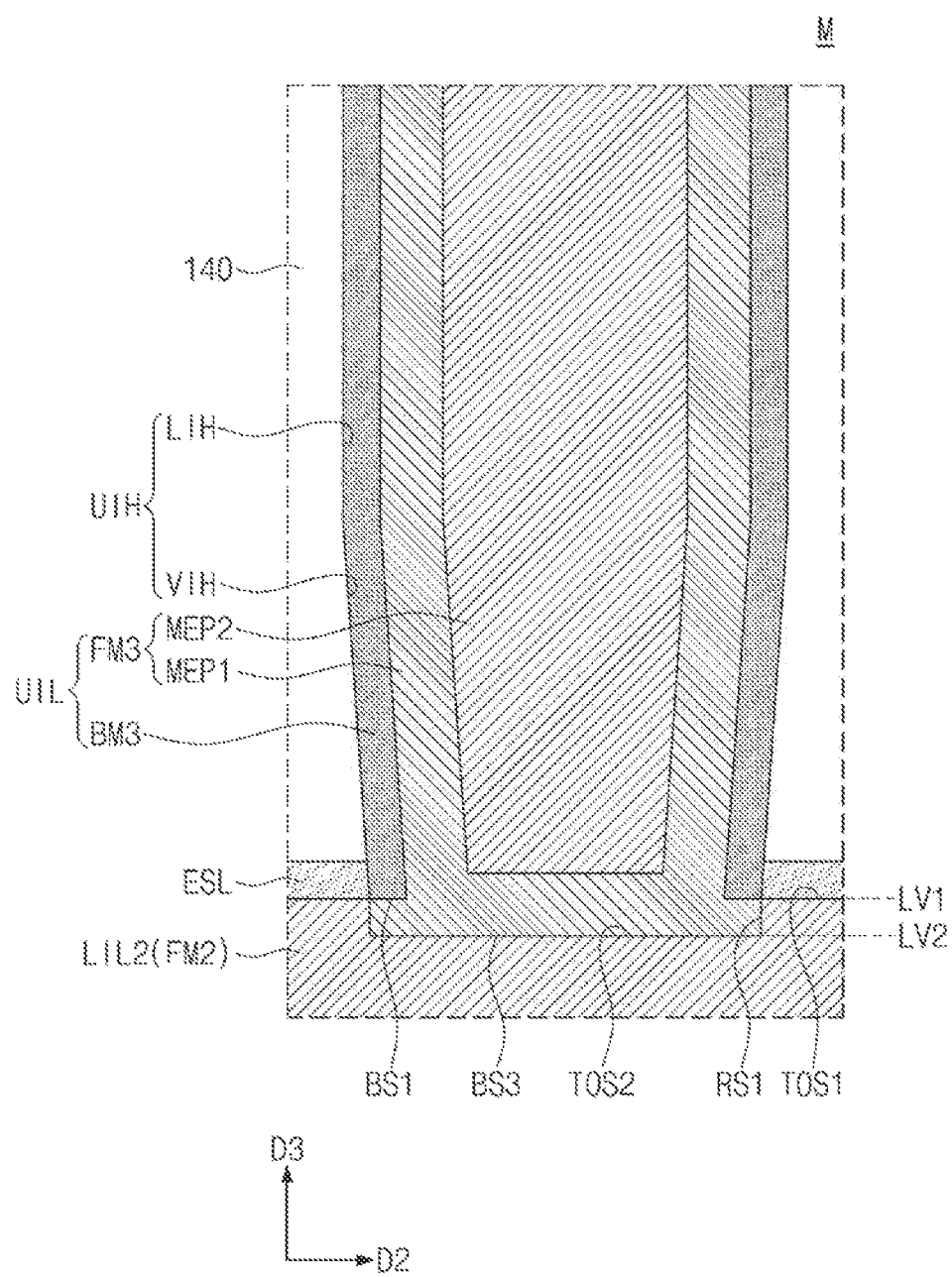

Referring to FIG. 25, the second barrier layer BAP2 of the first and second barrier layers BAP1 and BAP2 constituting the third barrier pattern BM3 of FIG. 3 may be omitted. The third barrier pattern BM3 may not cover the surface of the second lower interconnection line LIL2. The third barrier pattern BM3 may selectively cover only the inner sidewall of the interconnection hole UIH (i.e., sidewalls of the etch stop layer ESL and the fourth interlayer insulating layer 140).

The first conductive layer MEP1 on the third barrier pattern BM3 may fill the first recess RS1. A third bottom surface BS3 of the first conductive layer MEP1 may cover the second top surface TOS2 of the second lower interconnection line LIL2. The third bottom surface BS3 of the first conductive layer MEP1 may be lower than the first top surface TOS1 of the second lower interconnection line LIL2.

According to the present embodiments, the second conductive layer MEP2 may be electrically connected to the second lower interconnection line LIL2 through the first conductive layer MEP1. Since the resistivity of the first conductive layer MEP1 is lower than that of the third barrier pattern BM3, a contact resistance between the upper interconnection line UIL and the lower interconnection line LIL1 or LIL2 may be reduced.

Figure 26:
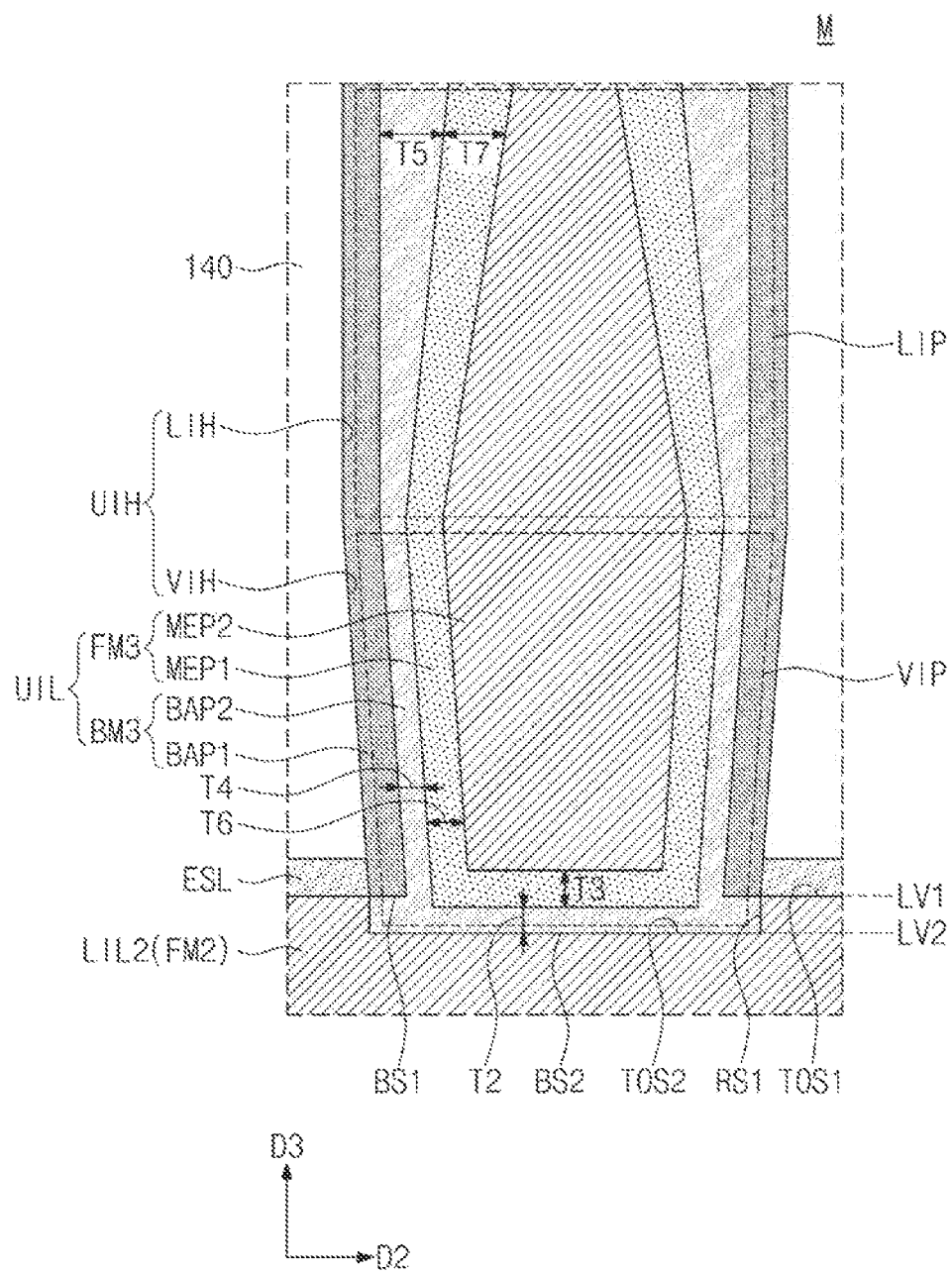

Referring to FIG. 26, the second barrier layer BAP2 of the via portion VIP may have a fourth thickness T4 in the second direction D2. The fourth thickness T4 may be substantially equal to or greater than the second thickness T2. A portion of the second barrier layer BAP2 of the line portion LIP (e.g., an upper portion of the second barrier layer BAP2 of the line portion LIP) may have a fifth thickness T5 in the second direction D2. The fifth thickness T5 may be greater than the fourth thickness T4. In some embodiments, the second barrier layer BAP2 of the via portion VIP may have a uniform thickness in the second direction D2, and the second barrier layer BAP2 of the line portion LIP may have a varying thickness in the second direction D2 that increases along the third direction D3 as illustrated in FIG. 26.

The first conductive layer MEP1 of the via portion VIP may have a sixth thickness T6 in the second direction D2. The sixth thickness T6 may be substantially equal to or greater than the third thickness T3. A portion of the first conductive layer MEP1 of the line portion LIP (e.g., an upper portion of the first conductive layer MEP1 of the line portion LIP) may have a seventh thickness T7 in the second direction D2. The seventh thickness T7 may be greater than the sixth thickness T6. In some embodiments, the first conductive layer MEP1 of the via portion VIP may have a uniform thickness in the second direction D2, and the first conductive layer MEP1 of the line portion LIP may have a varying thickness in the second direction D2 that increases along the third direction D3 as illustrated in FIG. 26.

Figure 27:
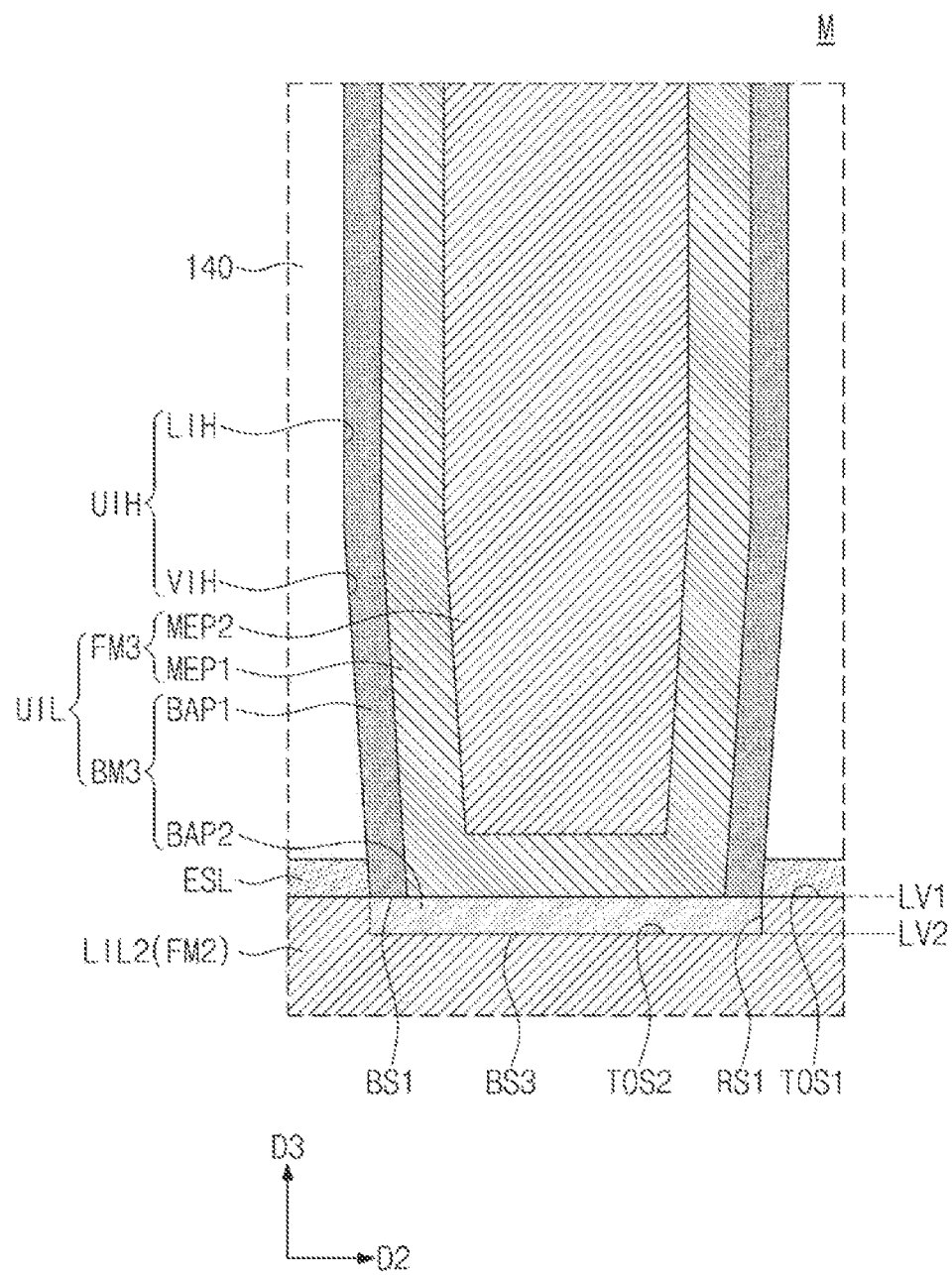

Referring to FIG. 27, the second barrier layer BAP2 may be selectively formed only in the first recess RS1. For example, a top surface TOS1 of the second barrier layer BAP2 may be located at the first level LV1. The second barrier layer BAP2 may not extend along the first barrier layer BAP1 in the third direction D3. The first conductive layer MEP1 may be in direct contact with the first barrier layer BAP1. The first conductive layer MEP1 may be in direct contact with the top surface TOS1 of the second barrier layer BAP2.

Figure 28:
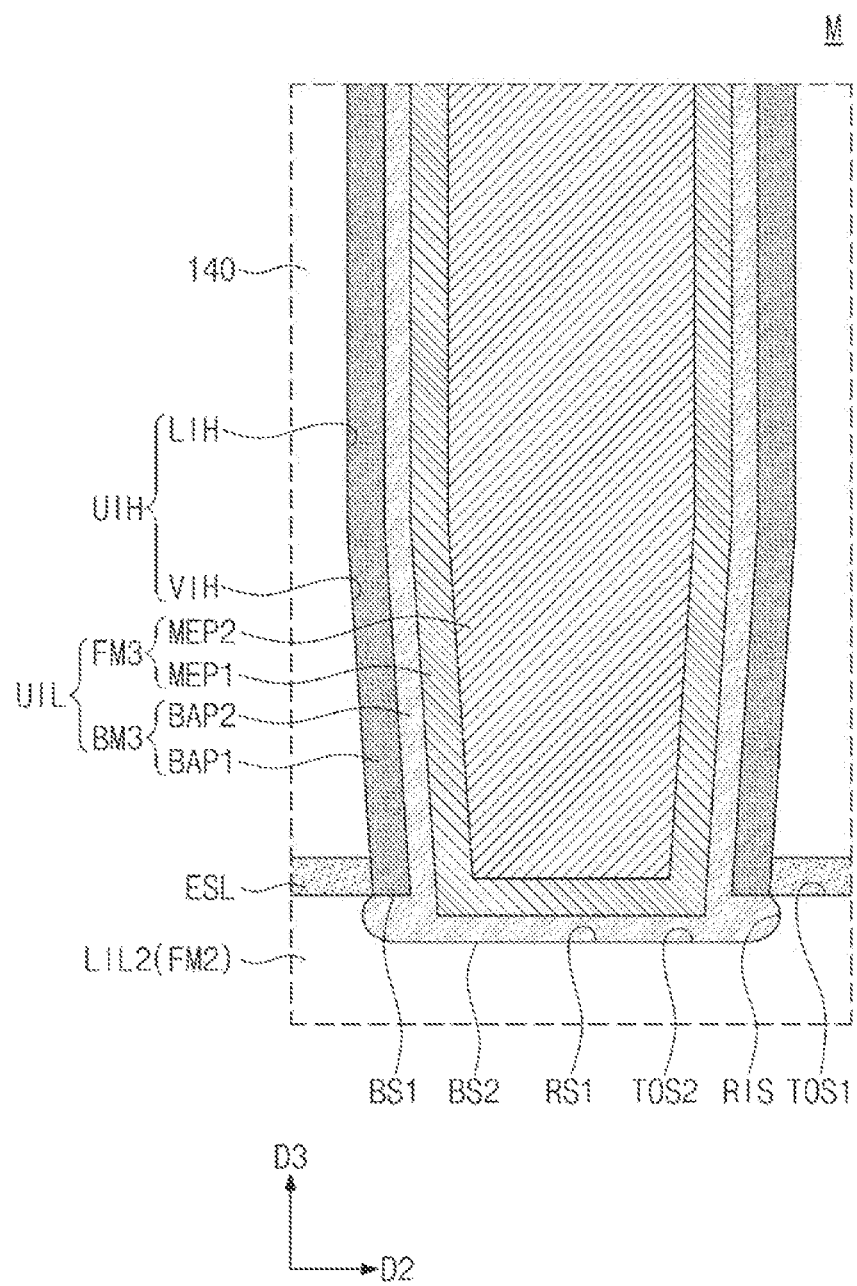

Referring to FIG. 28, the first recess RS1 may further expand into the second lower interconnection line LIL2, as compared with FIG. 3. An inner sidewall RIS of the first recess RS1 may have a convex profile. The second barrier layer BAP2 may be provided in the first recess RS1. Since the first recess RS1 further expands, a contact area between the second barrier layer BAP2 and the second lower interconnection line LIL2 may be further increased. As a result, the contact resistance between the upper interconnection line UIL and the lower interconnection line LIL1 or LIL2 may be reduced to improve electrical characteristics of the semiconductor device.

Figure 29:
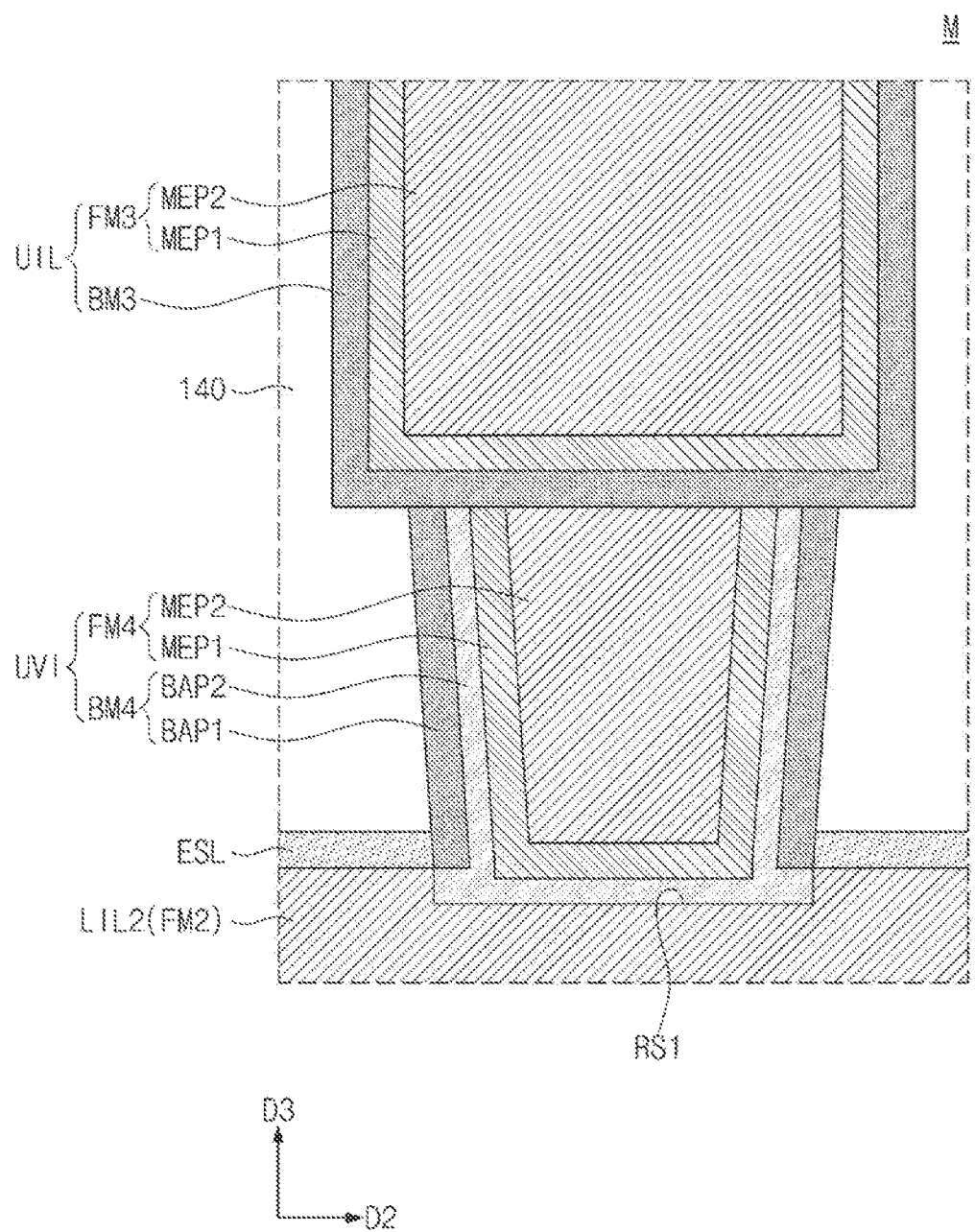

Referring to FIG. 29, an upper interconnection line UIL may be formed by a single damascene process. Particularly, an upper via UVI may be provided under the upper interconnection line UIL. The upper via UVI may connect the upper interconnection line UIL and the second lower interconnection line LIL2 to each other.

The upper via UVI may include a fourth barrier pattern BM4 and a fourth conductive pattern FM4 on the fourth barrier pattern BM4. The fourth barrier pattern BM4 may include the first barrier layer BAP1 and the second barrier layer BAP2. The fourth conductive pattern FM4 may include the first conductive layer MEP1 and the second conductive layer MEP2. The fourth barrier pattern BM4 and the fourth conductive pattern FM4 of the upper via UVI may be substantially the same as the via portion VIP of the upper interconnection line UIL of FIG. 3.

The upper interconnection line UIL on the upper via UVI may include the third barrier pattern BM3 and the third conductive pattern FM3. Unlike the upper via UVI, the second barrier layer BAP2 in the third barrier pattern BM3 may be omitted.

Figure 30:
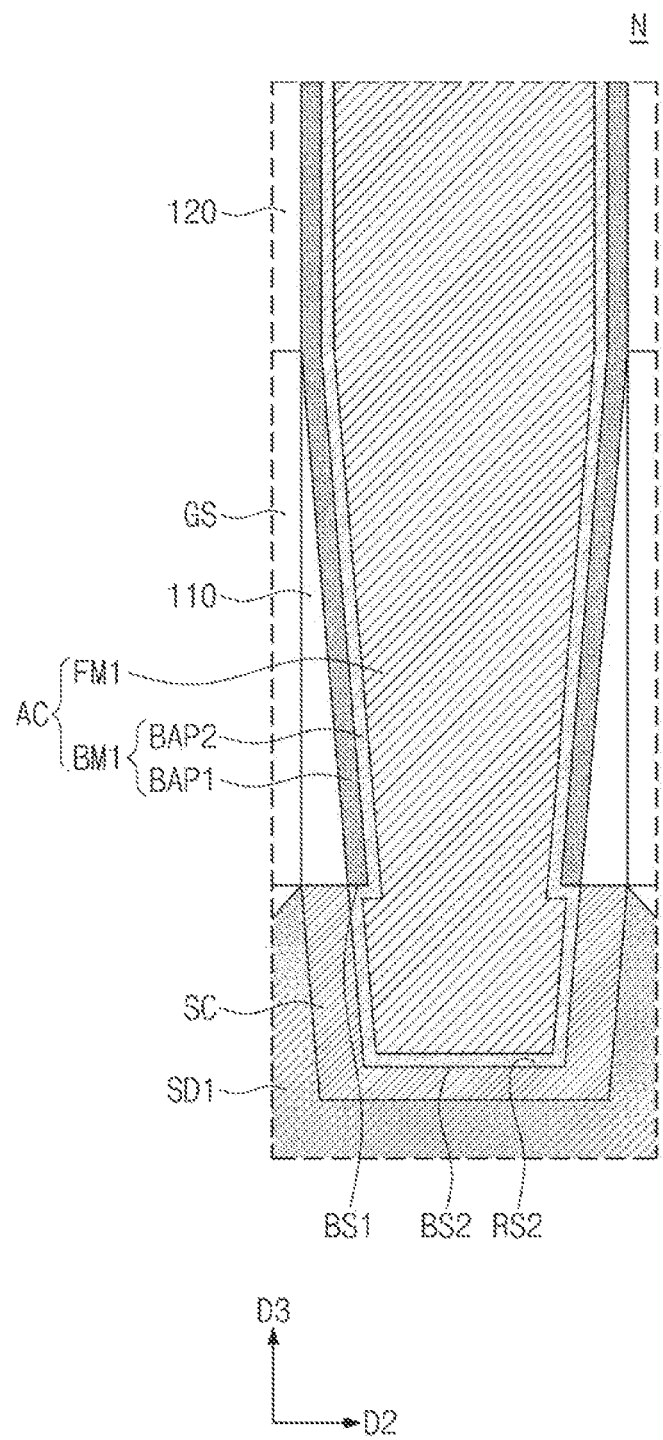
FIG. 30 is an enlarged cross-sectional view of a region 'N' of FIG. 2A to illustrate a semiconductor device according to some embodiments of the present inventive concepts.

FIG. 30 is an enlarged cross-sectional view of a region 'N' of FIG. 2A to illustrate a semiconductor device according to some embodiments of the present inventive concepts. Referring to FIG. 30, the first barrier pattern BM1 of the active contact AC may include a first barrier layer BAP1 and a second barrier layer BAP2. A second recess RS2 may be defined by the silicide pattern SC on the first source/drain pattern SD1. The second barrier layer BAP2 may be provided in the second recess RS2 to directly cover (e.g., to directly contact) the silicide pattern SC. The first barrier layer BAP1 may not be provided in the second recess RS2. The first barrier layer BAP1 may be disposed between the first conductive pattern FM1 and the interlayer insulating layers 110 and 120 but may not be in contact with the silicide pattern SC. Other features of the first and second barrier layers BAP1 and BAP2 of the active contact AC may be substantially the same as corresponding features of the first and second barrier layers BAP1 and BAP2 of FIG. 3 described above.

According to the present embodiments, the active contact AC and the source/drain pattern SD1 or SD2 may be connected to each other through the second barrier layer BAP2 having a relatively low resistivity. In addition, even though not shown in the drawings, the gate contact GC and the gate electrode GE may also be connected to each other through the second barrier layer BAP2 having the relatively low resistivity, like the active contact AC.

FIGS. 31A, 31B, 31C and 31D are cross-sectional views taken along the lines A-A', B-B', C-C' and D-D' of FIG. 1, respectively, to illustrate a semiconductor device according to some embodiments of the present inventive concepts. In the present embodiments, the descriptions to the same technical features as in the embodiments of FIGS. 1 and 2A to 2D may be omitted for the purpose of ease and convenience in explanation. In other words, differences between the present embodiments and the embodiments of FIGS. 1 and 2A to 2D may be mainly described hereinafter.

Referring to FIGS. 1 and 31A to 31D, a substrate 100 including a first active region PR and a second active region NR may be provided. A device isolation layer ST may be provided on the substrate 100. The device isolation layer ST may define a first active pattern AP1 and a second active pattern AP2 in an upper portion of the substrate 100. The first active pattern AP1 and the second active pattern AP2 may be defined on the first active region PR and the second active region NR, respectively.

The first active pattern AP1 may include first channel patterns CH1 which are vertically stacked. The stacked first channel patterns CH1 may be spaced apart from each other in the third direction D3. The stacked first channel patterns CH1 may vertically overlap with each other. The second active pattern AP2 may include second channel patterns CH2 which are vertically stacked. The stacked second channel patterns CH2 may be spaced apart from each other in the third direction D3. The stacked second channel patterns CH2 may vertically overlap with each other. The first and second channel patterns CH1 and CH2 may include, for example, silicon (Si), germanium (Ge), and/or silicon-germanium (SiGe).

The first active pattern AP1 may further include first source/drain patterns SD1. The stacked first channel patterns CH1 may be disposed between a pair of the first source/drain patterns SD1 adjacent to each other. The stacked first channel patterns CH1 may connect the pair of first source/drain patterns SD1 adjacent to each other.

The second active pattern AP2 may further include second source/drain patterns SD2. The stacked second channel patterns CH2 may be disposed between a pair of the second source/drain patterns SD2 adjacent to each other. The stacked second channel patterns CH2 may connect the pair of second source/drain patterns SD2 adjacent to each other.

Gate electrodes GE may extend in the first direction D1 to intersect the first and second channel patterns CH1 and CH2. The gate electrode GE may vertically overlap with the first and second channel patterns CH1 and CH2. A pair of gate spacers GS may be disposed on opposing sidewalls of the gate electrode GE, respectively. A gate capping pattern GP may be provided on the gate electrode GE.

Figure 31A:
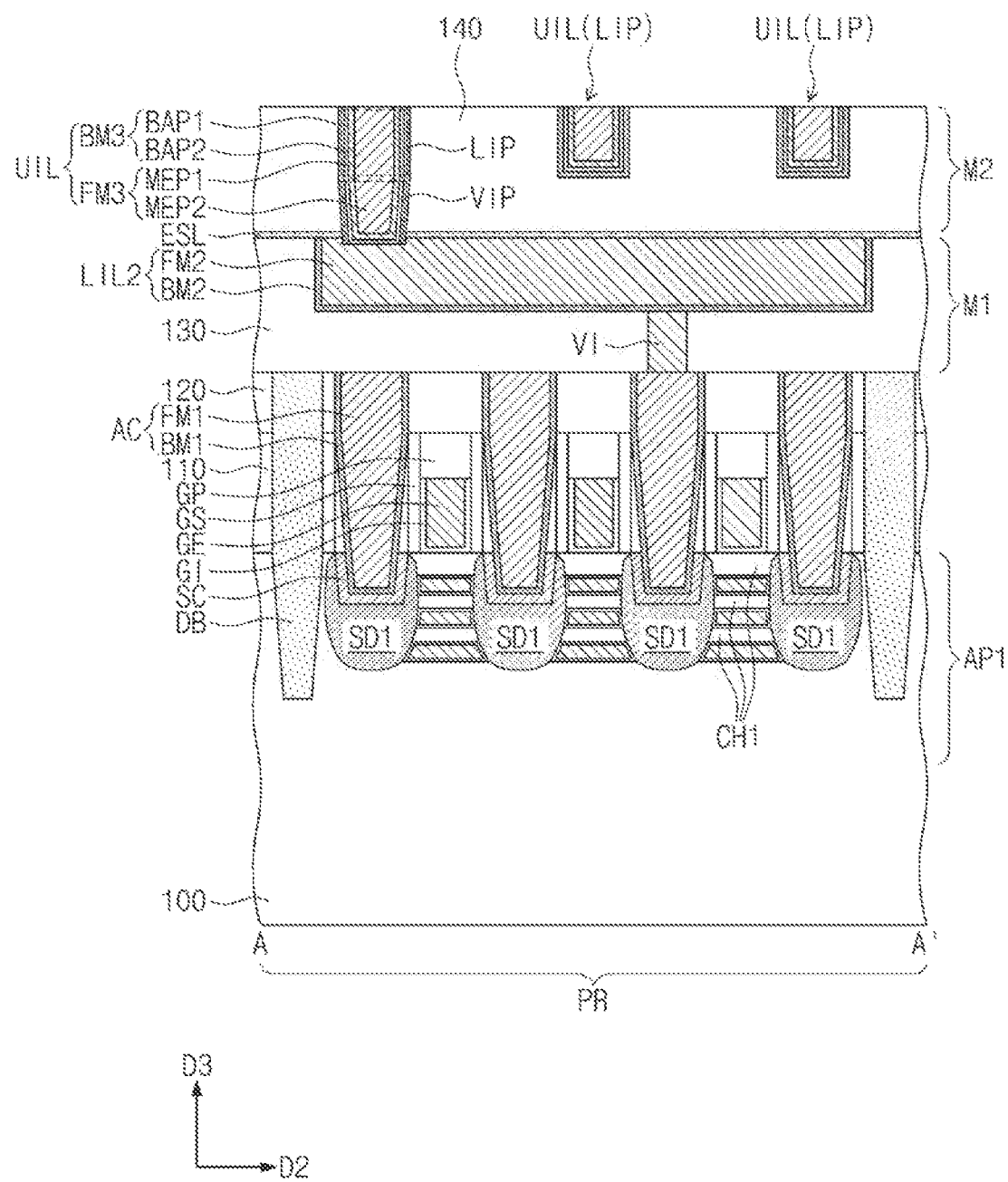
FIGS. 31A, 31B, 31C and 31D are cross-sectional views taken along the lines A-A', B-B', C-C' and D-D' of FIG. 1, respectively, to illustrate a semiconductor device according to some embodiments of the present inventive concepts.
Figure 31B:
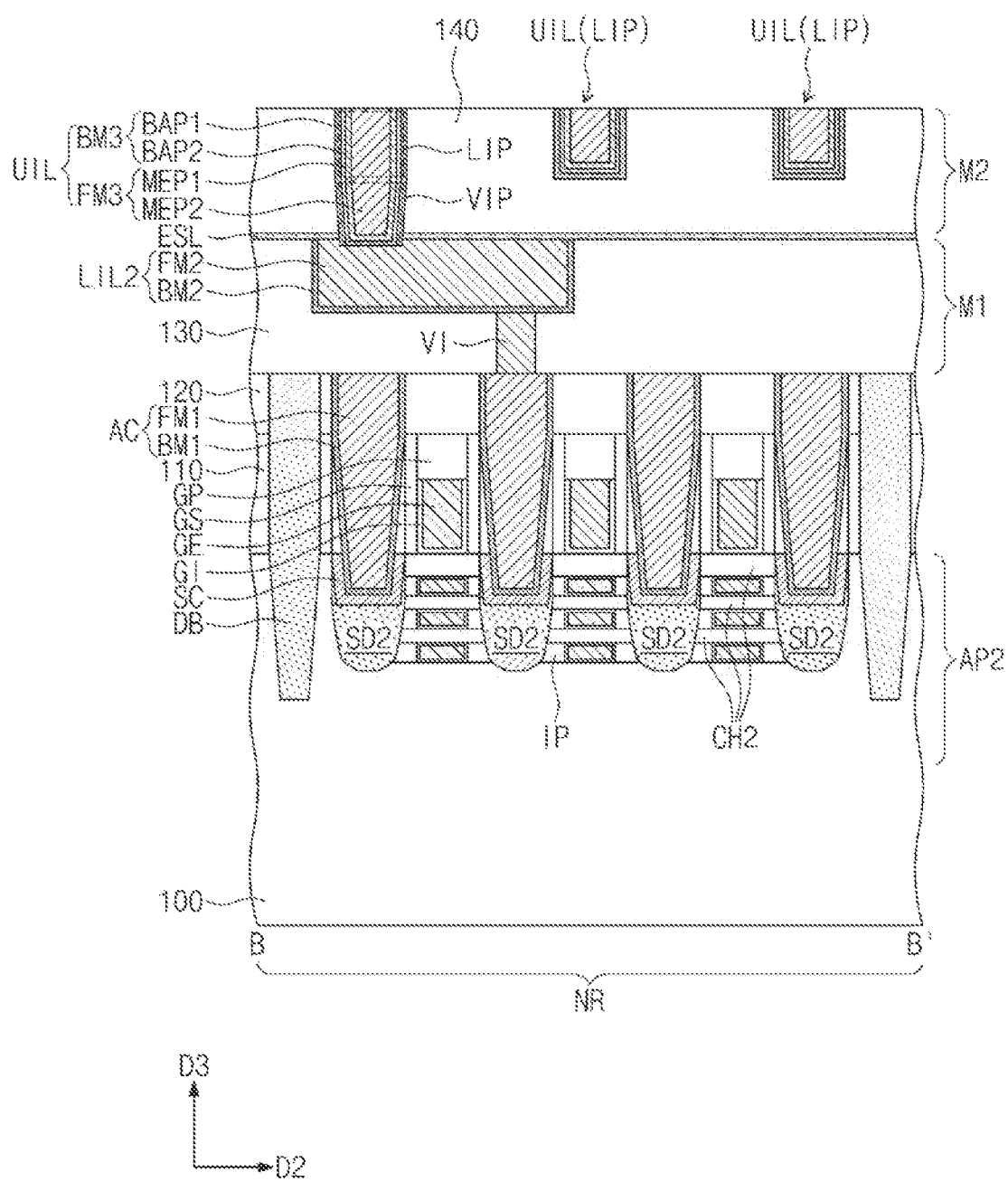
Figure 31C:
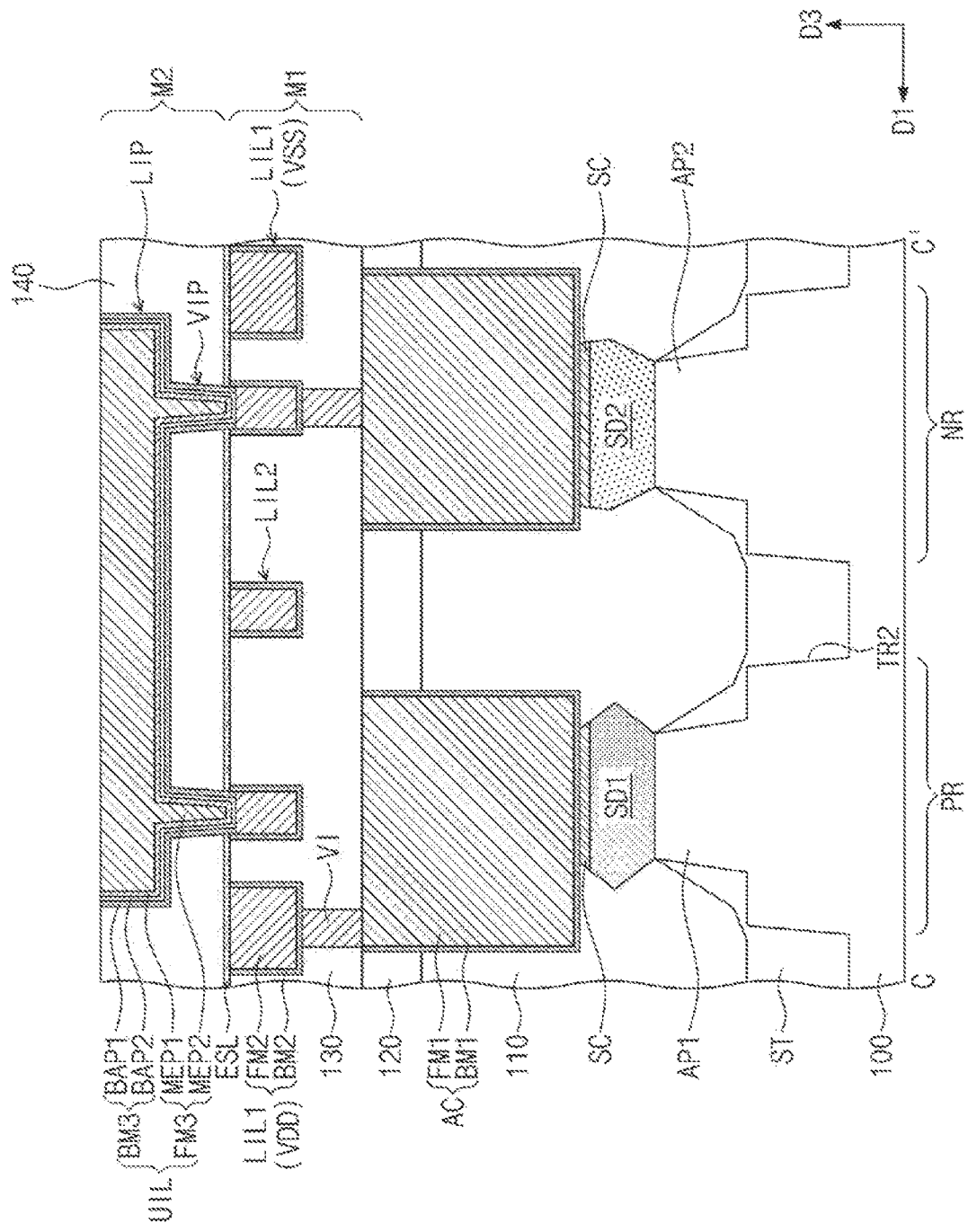
Figure 31D:
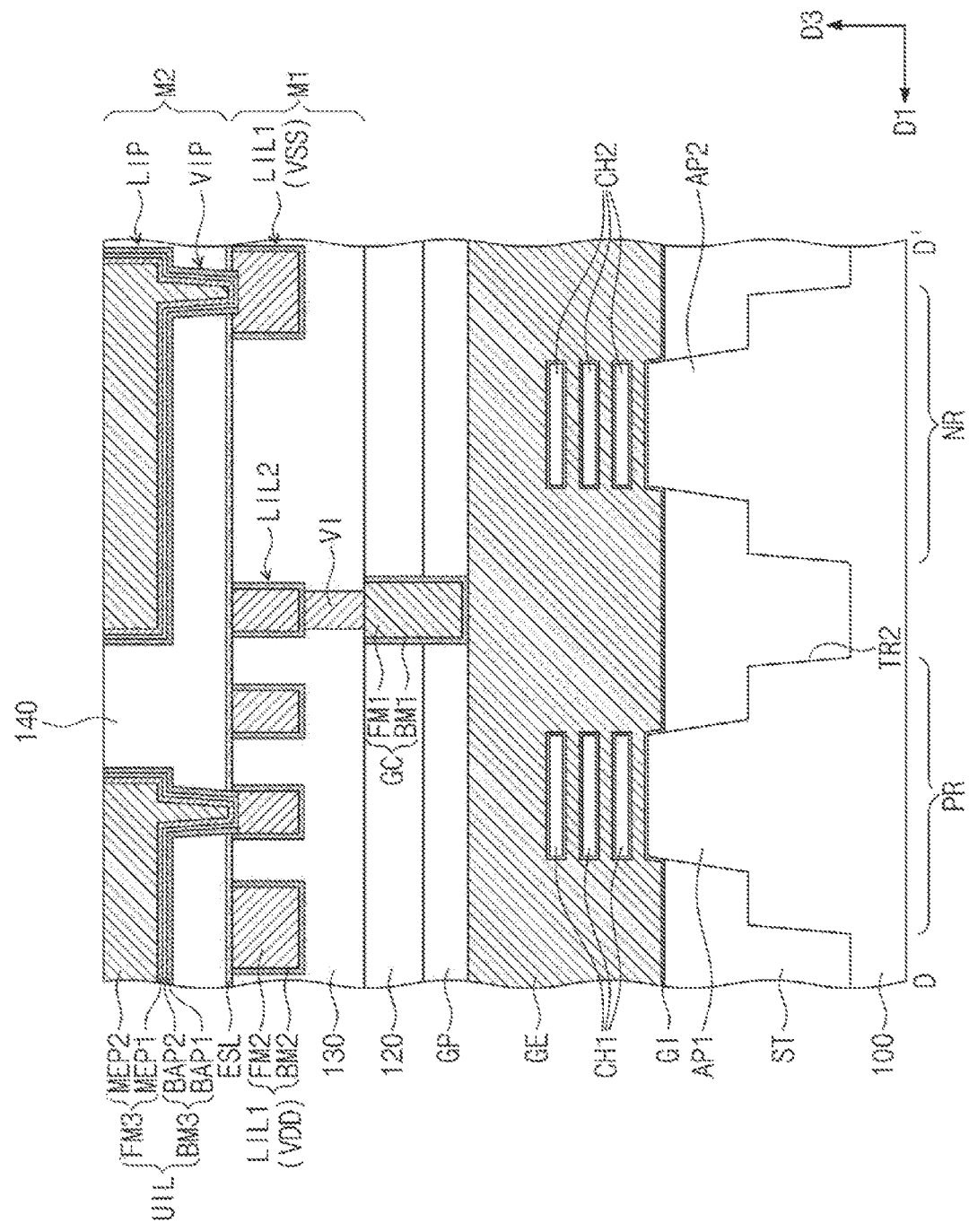

The gate electrode GE may surround each of the first and second channel patterns CH1 and CH2 (see FIG. 31D). The gate electrode GE may surround a top surface, a bottom surface and both sidewalls of each of the first and second channel patterns CH1 and CH2. Transistors according to the present embodiments may be 3D field effect transistors (e.g., MBCFETs) in which the gate electrode GE three-dimensionally surrounds channels CH1 and CH2. In some embodiments, the gate electrode GE may completely enclose each of the first and second channel patterns CH1 and CH2 as illustrated in FIG. 31D.

A gate dielectric pattern GI may be provided between the gate electrode GE and each of the first and second channel patterns CH1 and CH2. The gate dielectric pattern GI may surround each of the first and second channel patterns CH1 and CH2.

An insulating pattern IP may be disposed between the gate dielectric pattern GI and the second source/drain pattern SD2 on the second active region NR. The gate electrode GE may be spaced apart from the second source/drain pattern SD2 by the gate dielectric pattern GI and the insulating pattern IP. In some embodiments, the insulating pattern IP may be omitted on the first active region PR.

A first interlayer insulating layer 110 and a second interlayer insulating layer 120 may be provided on an entire top surface of the substrate 100. Active contacts AC may penetrate the second and first interlayer insulating layers 120 and 110 so as to be connected to the first and second source/drain patterns SD1 and SD2. A gate contact GC may penetrate the second interlayer insulating layer 120 and the gate capping pattern GP so as to be connected to the gate electrode GE.

A third interlayer insulating layer 130 may be provided on the second interlayer insulating layer 120. A fourth interlayer insulating layer 140 may be provided on the third interlayer insulating layer 130. A first metal layer M1 may be provided in the third interlayer insulating layer 130. A second metal layer M2 may be provided in the fourth interlayer insulating layer 140. The first metal layer M1 and the second metal layer M2 may be substantially the same as described above with reference to FIGS. 1, 2A to 2D and 3.

Figure 32:
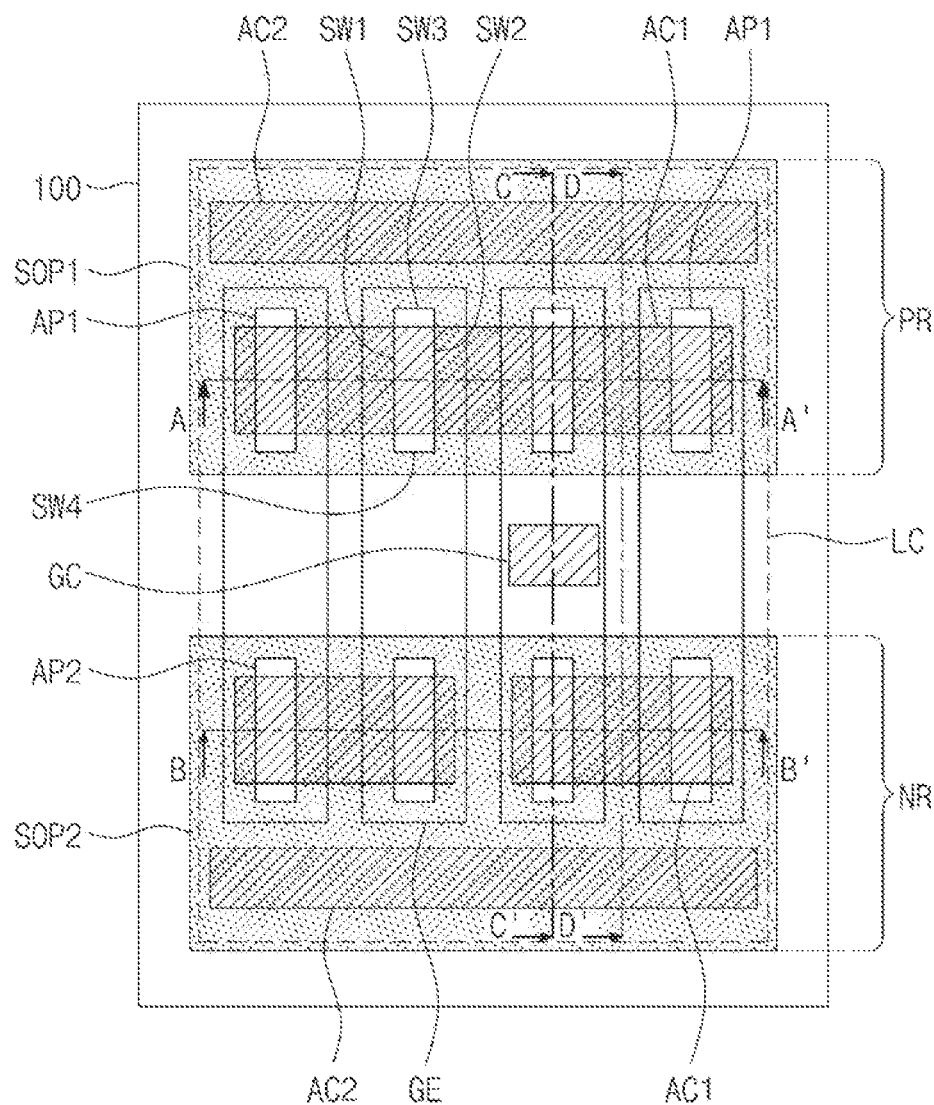
FIG. 32 is a plan view illustrating a semiconductor device according to some embodiments of the present inventive concepts.
Figure 33A:
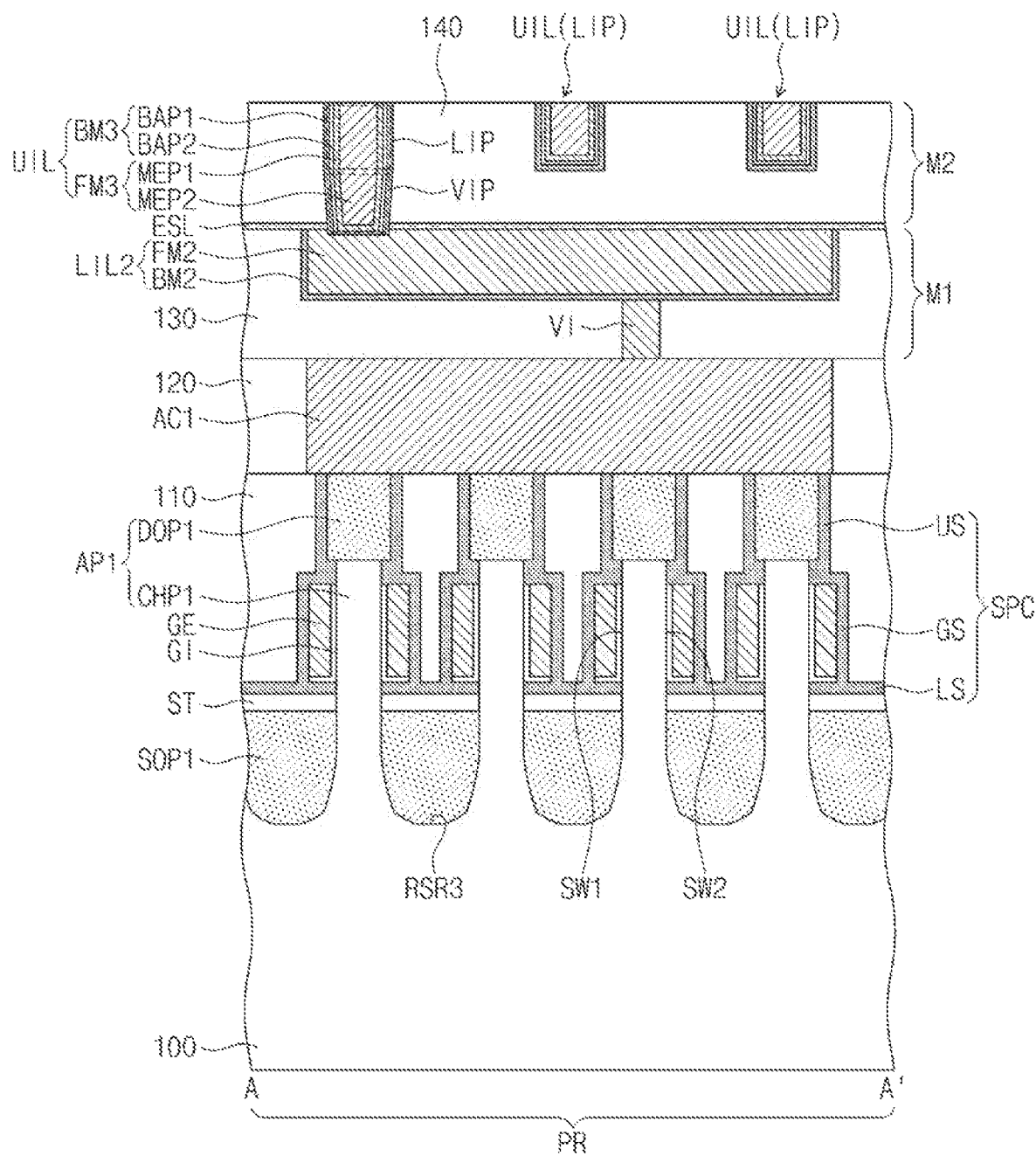
FIGS. 33A, 33B, 33C and 33D are cross-sectional views taken along lines A-A', B-B', C-C' and D-D' of FIG. 32, respectively.
Figure 33B:
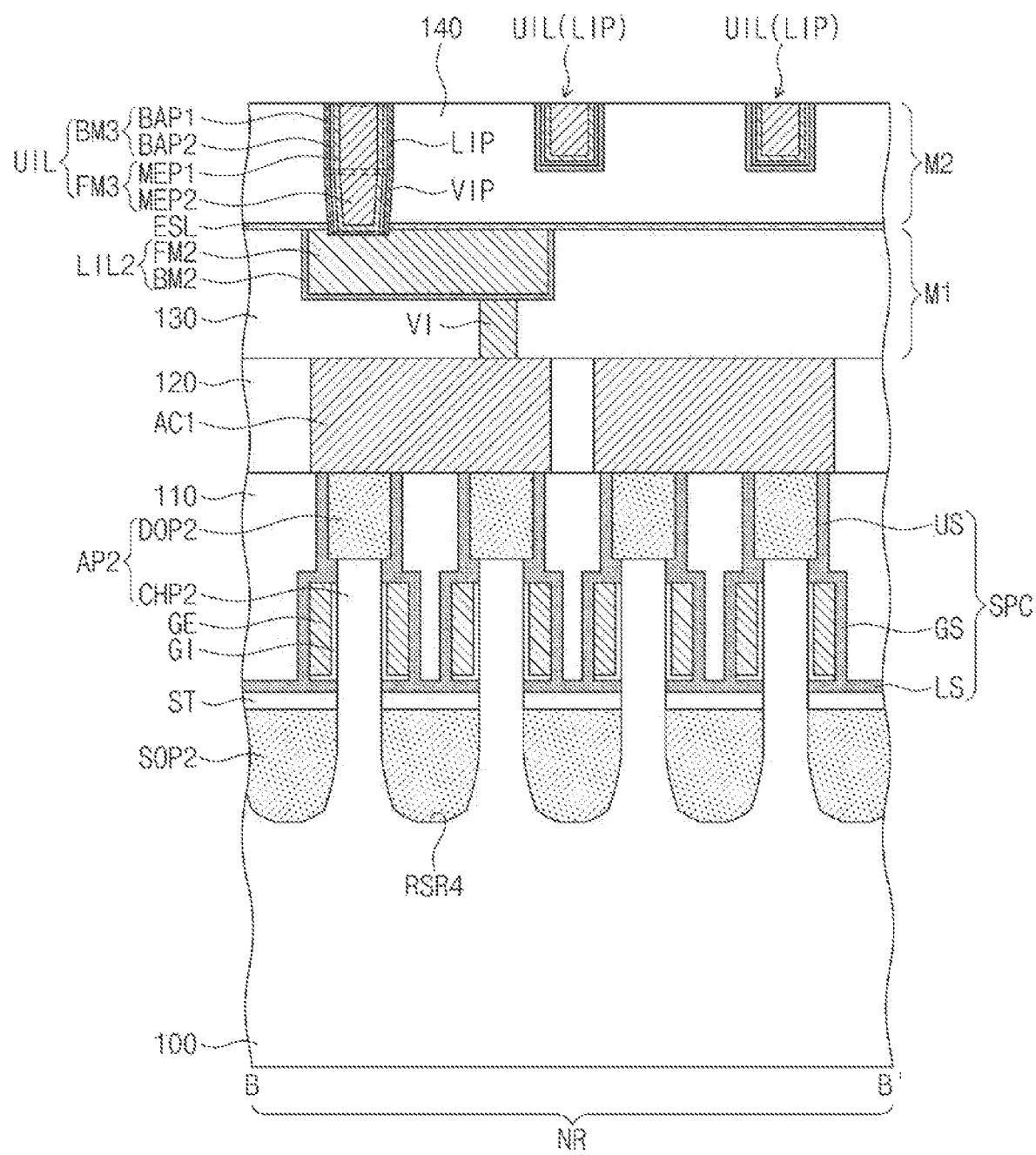
Figure 33C:
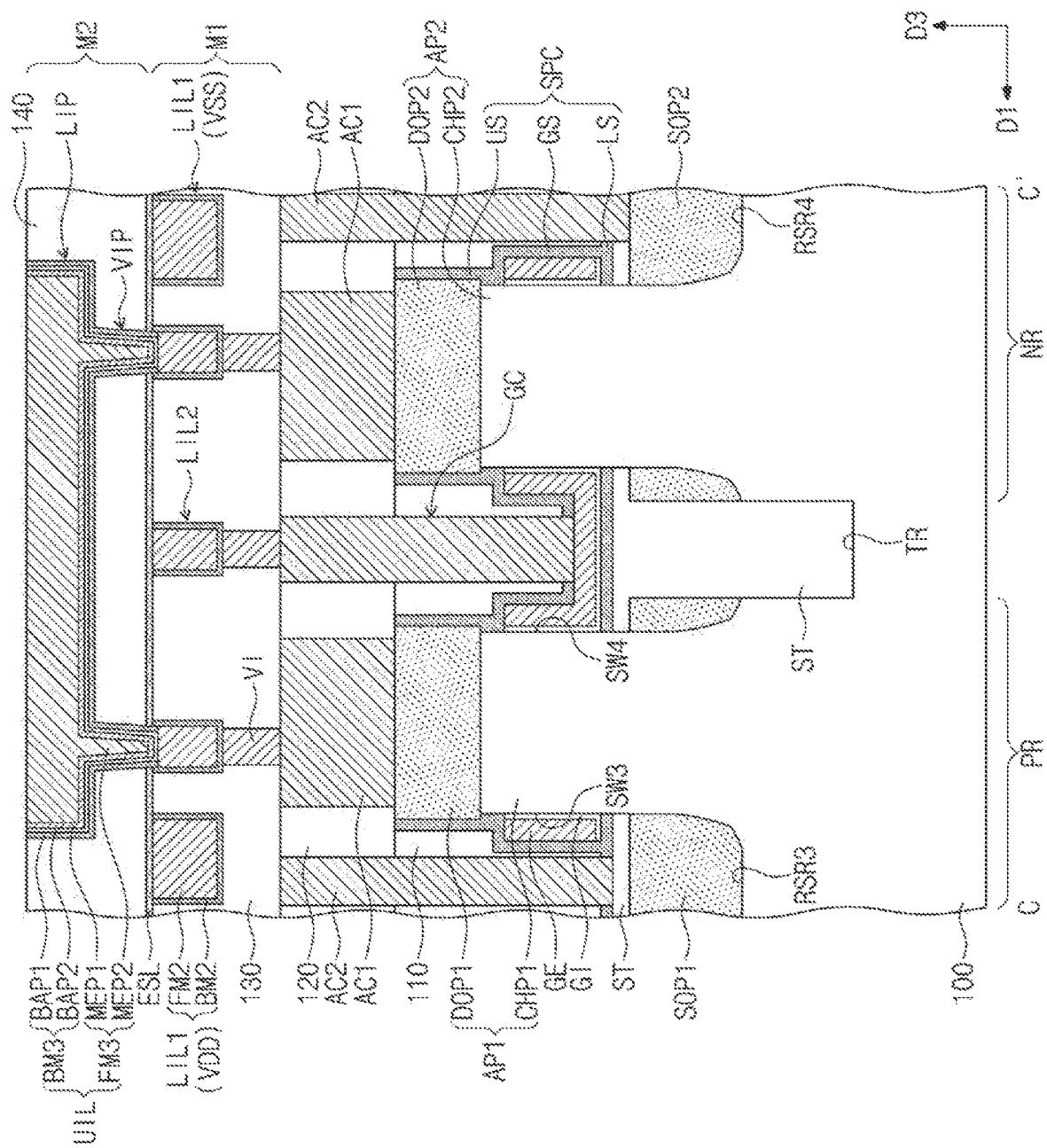
Figure 33D:
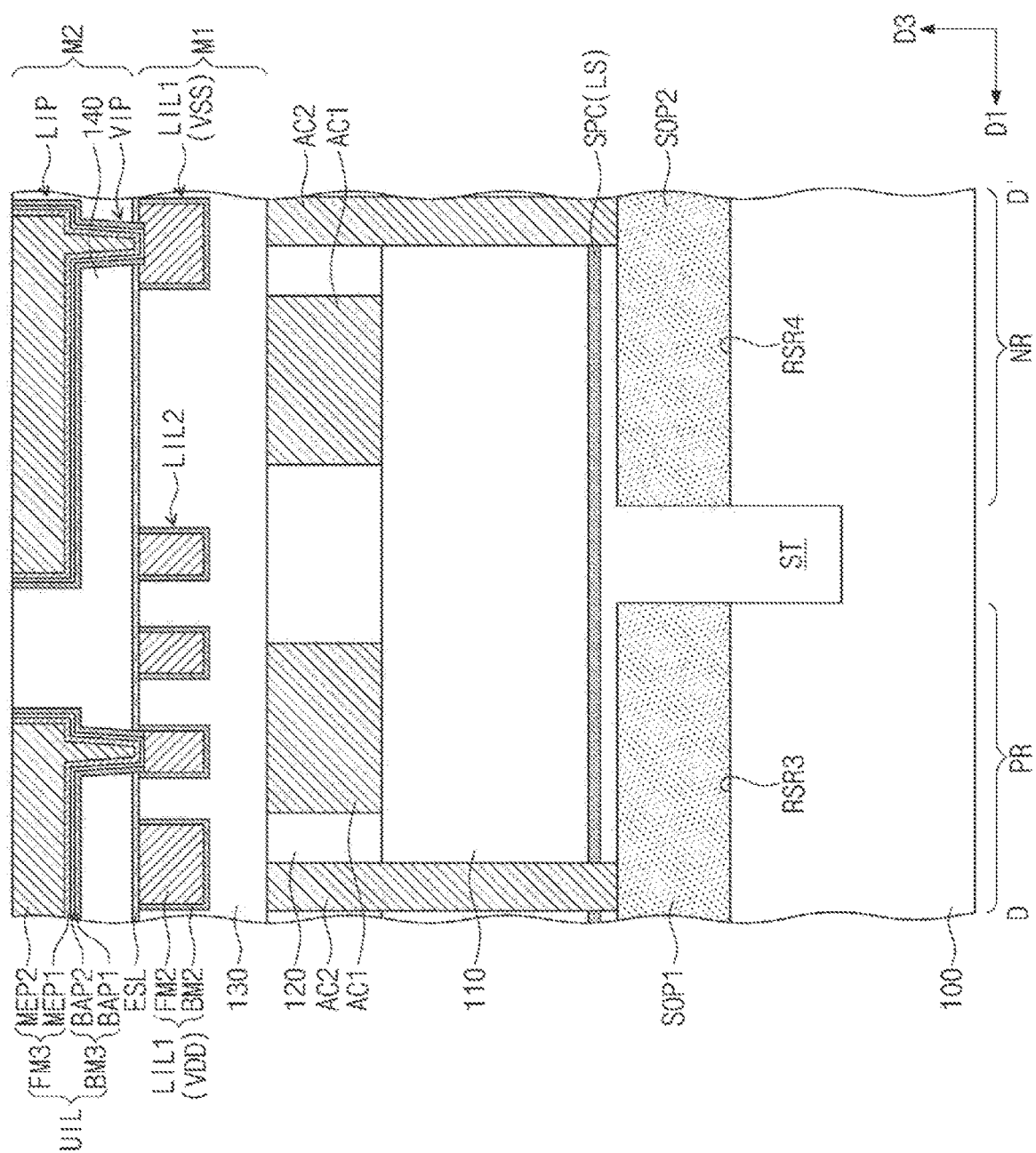

FIG. 32 is a plan view illustrating a semiconductor device according to some embodiments of the present inventive concepts. FIGS. 33A, 33B, 33C and 33D are cross-sectional views taken along lines A-A', B-B', C-C' and D-D' of FIG. 32, respectively.

Referring to FIGS. 32 and 33A to 33D, a logic cell LC may be provided on a substrate 100. The logic cell LC may include vertical field effect transistors (hereinafter, referred to as vertical transistors) and interconnection lines connecting the vertical transistors, which constitute a logic device.

The logic cell LC on the substrate 100 may include a first active region PR and a second active region NR. The first and second active regions PR and NR may be defined by a trench TR formed in an upper portion of the substrate 100. The first and second active regions PR and NR may be spaced apart from each other in a first direction D1.

A first lower epi pattern SOP1 may be provided on the first active region PR, and a second lower epi pattern SOP2 may be provided on the second active region NR. The first lower epi pattern SOP1 may overlap with the first active region PR in a plan view, and the second lower epi pattern SOP2 may overlap with the second active region NR in a plan view. The first and second lower epi patterns SOP1 and SOP2 may be epitaxial patterns formed by, for example, a selective epitaxial growth (SEG) process. The first lower epi pattern SOP1 may be provided in a third recess region RSR3 of the substrate 100, and the second lower epi pattern SOP2 may be provided in a fourth recess region RSR4 of the substrate 100.

First active patterns AP1 may be provided on the first active region PR, and second active patterns AP2 may be provided on the second active region NR. Each of the first and second active patterns AP1 and AP2 may have a vertically protruding fin shape. Each of the first and second active patterns AP1 and AP2 may have a bar shape extending in the first direction D1 when viewed in a plan view. The first active patterns AP1 may be arranged in a second direction D2, and the second active patterns AP2 may be arranged in the second direction D2. In some embodiments, the first active patterns AP1 may be spaced apart from each other in the second direction D2, and the second active patterns AP2 may be spaced apart from each other in the second direction D2 as illustrated in FIG. 32.

Each of the first active patterns AP1 may include a first channel pattern CHP1 vertically protruding from the first lower epi pattern SOP1, and a first upper epi pattern DOP1 on the first channel pattern CHP1. Each of the second active patterns AP2 may include a second channel pattern CHP2 vertically protruding from the second lower epi pattern SOP2, and a second upper epi pattern DOP2 on the second channel pattern CHP2.

A device isolation layer ST may be provided on the substrate 100 to fill the trench TR. The device isolation layer ST may cover top surfaces of the first and second lower epi patterns SOP1 and SOP2. The first and second active patterns AP1 and AP2 may vertically protrude above the device isolation layer ST.

A plurality of gate electrodes GE extending in the first direction D1 in parallel to each other may be provided on the device isolation layer ST. The gate electrodes GE may be arranged in the second direction D2. In some embodiments, the gate electrodes GE may be spaced apart from each other in the second direction D2 as illustrated in FIG. 32. The gate electrode GE may surround the first channel pattern CHP1 of the first active pattern AP1 and may surround the second channel pattern CHP2 of the second active pattern AP2. For example, the first channel pattern CHP1 of the first active pattern AP1 may have first to fourth sidewalls SW1 to SW4. The first and second sidewalls SW1 and SW2 may be opposite to each other and spaced apart from each other in the second direction D2, and the third and fourth sidewalls SW3 and SW4 may be opposite to each other and spaced apart from each other in the first direction D1. The gate electrode GE may be provided on the first to fourth sidewalls SW1 to SW4. In other words, the gate electrode GE may surround the first to fourth sidewalls SW1 to SW4. In some embodiments, the gate electrode GE may enclose the first channel pattern CHP1 and the second channel pattern CHP2.

A gate dielectric pattern GI may be disposed between the gate electrode GE and each of the first and second channel patterns CHP1 and CHP2. The gate dielectric pattern GI may cover a bottom surface of the gate electrode GE and an inner sidewall of the gate electrode GE. For example, the gate dielectric pattern GI may directly cover or directly contact the first to fourth sidewalls SW1 to SW4 of the first channel pattern CHP1.

The first and second upper epi patterns DOP1 and DOP2 may vertically protrude above the gate electrode GE. A top surface of the gate electrode GE may be lower than a bottom surface of each of the first and second upper epi patterns DOP1 and DOP2. In other words, each of the first and second active patterns AP1 and AP2 may have a structure which vertically protrudes from the substrate 100 to penetrate the gate electrode GE.

The semiconductor device according to the present embodiments may include the vertical transistors in which carriers (e.g., electrons) move in a third direction D3. For example, when the transistor is turned-on by applying a voltage to the gate electrode GE, the carriers may move from the lower epi pattern SOP1 or SOP2 to the upper epi pattern DOP1 or DOP2 through the channel pattern CHP1 or CHP2. The gate electrode GE according to the present embodiments may completely surround the sidewalls SW1 to SW4 of the channel patterns CHP1 and CHP2. The transistor according to the present embodiments may be a 3D field effect transistor (e.g., a VFET) having a gate-all-around structure. Since the gate completely surrounds the channel, the semiconductor device according to the present inventive concepts may have excellent electrical characteristics.

A spacer SPC covering the gate electrodes GE and the first and second active patterns AP1 and AP2 may be provided on the device isolation layer ST. The spacer SPC may include, for example, a silicon nitride layer or a silicon oxynitride layer. The spacer SPC may include a lower spacer LS, an upper spacer US, and a gate spacer GS between the lower and upper spacers LS and US.

The lower spacer LS may directly cover or directly contact a top surface of the device isolation layer ST. By the lower spacer LS, the gate electrodes GE may be spaced apart from the device isolation layer ST in the third direction D3. The gate spacer GS may cover the top surface and an outer sidewall of each of the gate electrodes GE. The upper spacer US may cover the first and second upper epi patterns DOP1 and DOP2. However, the upper spacer US may not cover top surfaces of the first and second upper epi patterns DOP1 and DOP2 but may expose the top surfaces.

A first interlayer insulating layer 110 may be provided on the spacer SPC. A top surface of the first interlayer insulating layer 110 may be substantially coplanar with the top surfaces of the first and second upper epi patterns DOP1 and DOP2. Second to fourth interlayer insulating layers 120, 130 and 140 may be sequentially stacked on the first interlayer insulating layer 110. The second interlayer insulating layer 120 may cover the top surfaces of the first and second upper epi patterns DOP1 and DOP2.

First active contacts AC1 may penetrate the second interlayer insulating layer 120 so as to be connected to the first and second upper epi patterns DOP1 and DOP2. Second active contacts AC2 may sequentially penetrate the second interlayer insulating layer 120, the first interlayer insulating layer 110, the lower spacer LS and the device isolation layer ST so as to be connected to the first and second lower epi patterns SOP1 and SOP2. A gate contact GC may sequentially penetrate the second interlayer insulating layer 120, the first interlayer insulating layer 110 and the gate spacer GS so as to be connected to the gate electrode GE. Top surfaces of the gate contact GC and the first and second active contacts AC1 and AC2 may be substantially coplanar with a top surface of the second interlayer insulating layer 120.

Each of the first active contacts AC1 may extend in the second direction D2 and may be connected to at least one upper epi pattern DOP1 or DOP2. Each of the second active contacts AC2 may be provided under a first lower interconnection line LIL1 and may vertically overlap with the first lower interconnection line LIL1. The second active contact AC2 may have a bar shape extending in the second direction D2.

The gate contact GC may be disposed between the first and second active regions PR and NR when viewed in a plan view. In other words, the gate contact GC may be connected to the gate electrode GE on the device isolation layer ST between the first and second active regions PR and NR.

A first metal layer M1 may be provided in the third interlayer insulating layer 130. A second metal layer M2 may be provided in the fourth interlayer insulating layer 140. The first metal layer M1 and the second metal layer M2 may be substantially the same as described above with reference to FIGS. 1, 2A to 2D and 3.

Figure 34:
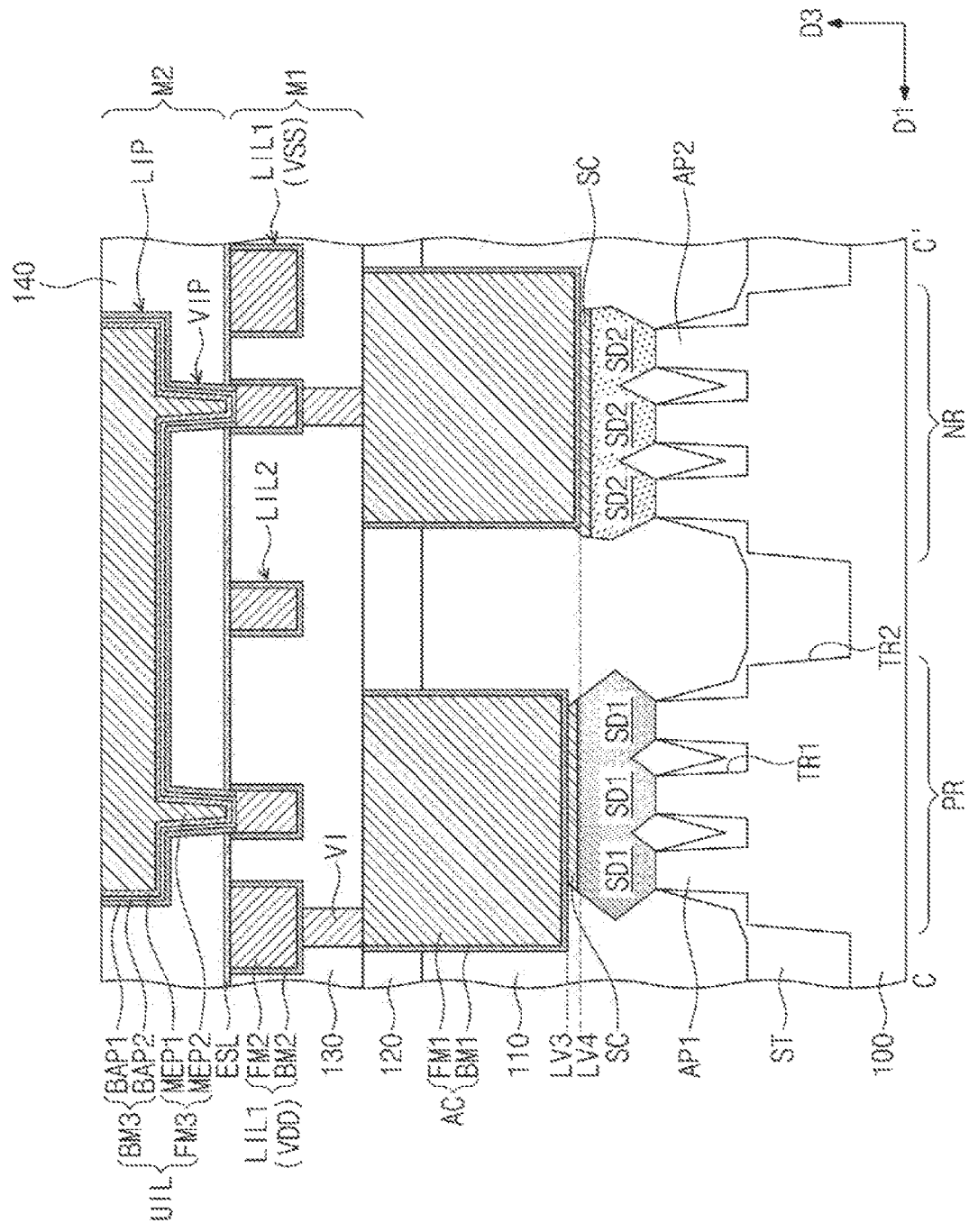
FIGS. 34 to 36 are cross-sectional views taken along the line C-C' of FIG. 1 to illustrate semiconductor devices according to some embodiments of the present inventive concepts.
Figure 35:
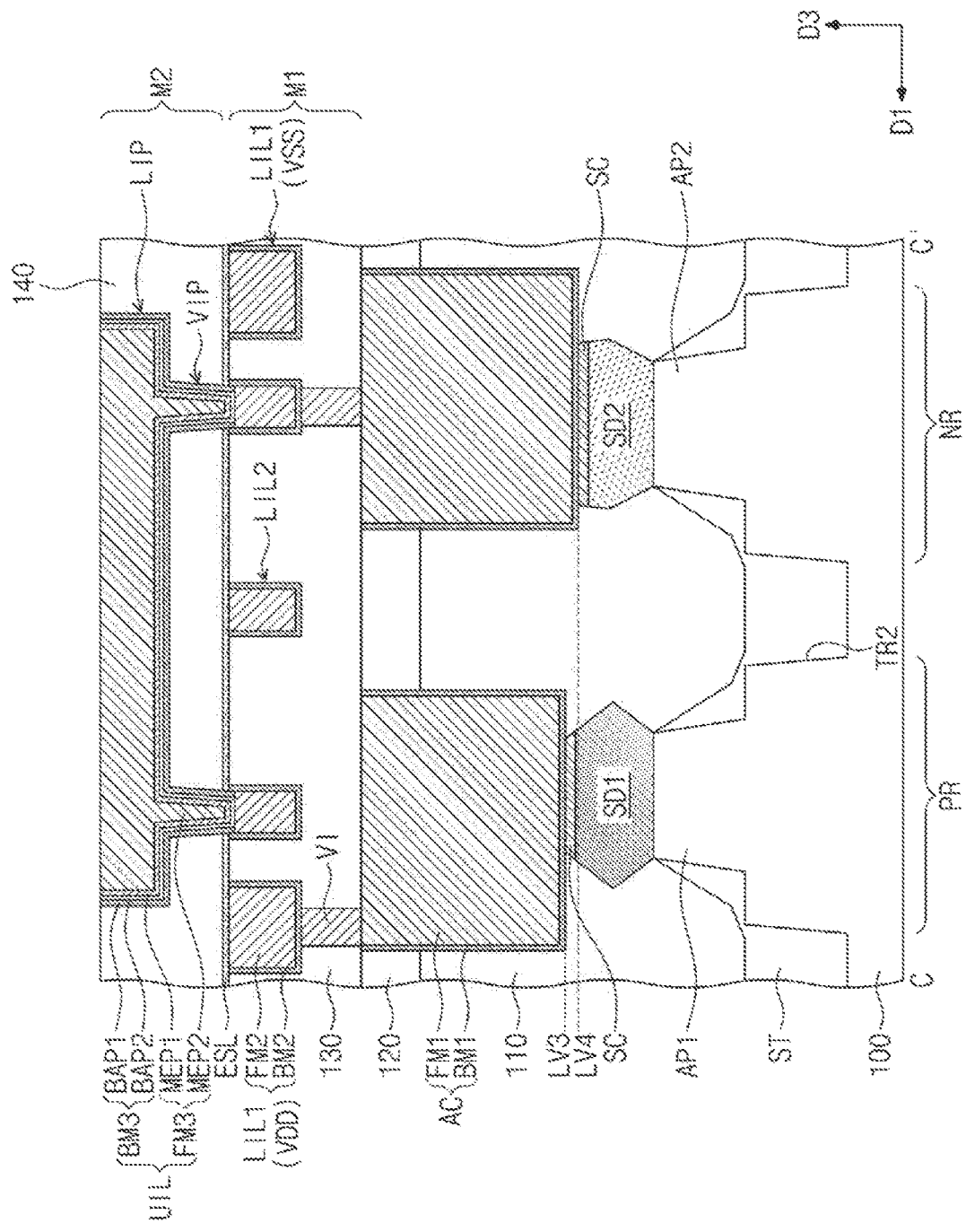

FIGS. 34 and 35 are cross-sectional views taken along the line C-C' of FIG. 1 to illustrate semiconductor devices according to some embodiments of the present inventive concepts. In the present embodiments, the descriptions to the same technical features as in the embodiments of FIGS. 1, 2A to 2D and 31A to 31D may be omitted for the purpose of ease and convenience in explanation. In other words, differences between the present embodiments and the embodiments of FIGS. 1, 2A to 2D and 31A to 31D may be mainly described hereinafter.

Referring to FIGS. 34 and 35, the lowest level of a bottom surface of the active contact AC connected to the first source/drain pattern SD1 may be a third level LV3. The lowest level of a bottom surface of the active contact AC connected to the second source/drain pattern SD2 may be a fourth level LV4. Here, the third level LV3 and the fourth level LV4 may be different from each other. For example, the third level LV3 may be higher than the fourth level LV4.

A volume of the first source/drain pattern SD1 may be different from a volume of the second source/drain pattern SD2. For example, the volume of the first source/drain pattern SD1 may be greater than the volume of the second source/drain pattern SD2. Due to a volume difference between the epitaxial patterns, recessed levels of the epitaxial patterns may be different from each other in the process for forming the active contacts AC. Thus, the bottom surface of the active contact AC on the first source/drain pattern SD1 may be higher than the bottom surface of the active contact AC on the second source/drain pattern SD2.

Figure 36:
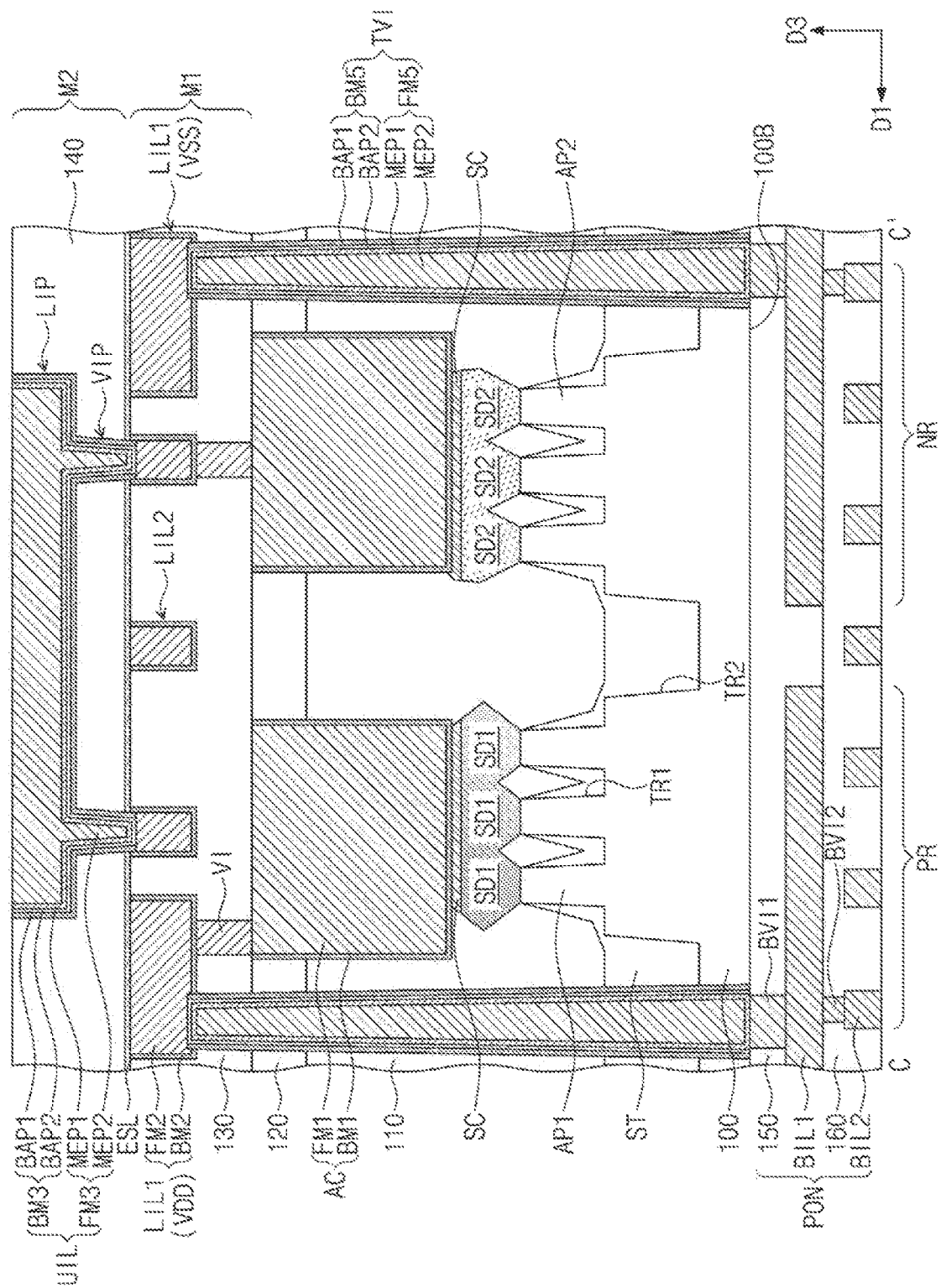

FIG. 36 is a cross-sectional view taken along the line C-C' of FIG. 1 to illustrate a semiconductor device according to some embodiments of the present inventive concepts. In the present embodiments, the descriptions to the same technical features as in the embodiments of FIGS. 1, 2A to 2D and 3 will be omitted for the purpose of ease and convenience in explanation. In other words, differences between the present embodiments and the embodiments of FIGS. 1, 2A to 2D and 3 will be mainly described hereinafter.

Referring to FIG. 36, a power delivery network PON may be provided on a bottom surface 100B of the substrate 100. The power delivery network PON may include a first backside insulating layer 150 and a second backside insulating layer 160, which are sequentially stacked on the bottom surface 100B of the substrate 100.

The power delivery network PON may further include first backside interconnection lines BIL1 and second backside interconnection lines BIL2. The first backside interconnection lines BIL1 may be provided in the first backside insulating layer 150, and the second backside interconnection lines BIL2 may be provided in the second backside insulating layer 160. A first backside via BVI1 may be provided between the first backside interconnection line BIL1 and a through-via TVI to be described later, and a second backside via BVI2 may be provided between the second backside interconnection line BIL2 and the first backside interconnection line BIL1.

The through-via TVI may extend from the bottom surface 100B of the substrate 100 to the first lower interconnection line LIL1. A bottom surface of the through-via TVI may be coplanar with the bottom surface 100B of the substrate 100. A top surface of the through-via TVI may be in contact with a bottom surface of the first lower interconnection line LIL1. The first lower interconnection line LIL1 may be connected to the power delivery network PON through the through-via TVI. The first and second backside interconnection lines BIL1 and BIL2 may constitute an interconnection network for applying a power voltage (VDD) or a ground voltage (VSS) to the first lower interconnection line LIL1.

The through-via TVI may include a fifth barrier pattern BM5 and a fifth conductive pattern FM5 on the fifth barrier pattern BM5. The fifth barrier pattern BM5 may include a first barrier layer BAP1 and a second barrier layer BAP2. The fifth conductive pattern FM5 may include a first conductive layer MEP1 and a second conductive layer MEP2. The fifth barrier pattern BM5 and the fifth conductive pattern FM5 of the through-via TVI may be substantially the same as the via portion VIP of the upper interconnection line UIL of FIG. 3.

The fifth conductive pattern FM5 of the through-via TVI may be connected to the second conductive pattern FM2 of the first lower interconnection line LIL1 through the second barrier layer BAP2 having the low resistivity. As a result, a contact resistance between the through-via TVI and the first lower interconnection line LIL1 may be reduced to improve electrical characteristics of the semiconductor device.

In the semiconductor device according to the embodiments of the present inventive concepts, an upper conductor (e.g., an interconnection line, contact or via) connected to a lower conductor may include the barrier pattern including the first barrier layer and the second barrier layer. The resistivity of the second barrier layer may be less than that of the first barrier layer. The second barrier layer, not the first barrier layer, may be disposed between the lower conductor and the upper conductor to electrically connect the lower and upper conductors. As a result, according to some embodiments of the present inventive concepts, a contact resistance between the lower and upper conductors may be reduced, and the electrical characteristics of the semiconductor device may be improved.

While the present inventive concepts have been described with reference to example embodiments, it will be apparent to those skilled in the art that various changes and modifications may be made without departing from the scopes of the present inventive concepts. Therefore, it should be understood that the above embodiments are not limiting, but illustrative. Thus, the scopes of the present inventive concepts are to be determined by the broadest permissible interpretation of the following claims and their equivalents, and shall not be restricted or limited by the foregoing description.

What is claimed is:

1. A semiconductor device comprising:
a substrate;
a first interlayer insulating layer on the substrate;
a lower interconnection line in the first interlayer insulating layer;
an etch stop layer on the first interlayer insulating layer and the lower interconnection line;
a second interlayer insulating layer on the etch stop layer; and
an upper interconnection line in the second interlayer insulating layer, the upper interconnection line including a via portion extending through the etch stop layer and contacting the lower interconnection line,
wherein the via portion comprises a barrier pattern and a conductive pattern on the barrier pattern,
wherein the barrier pattern comprises a first portion that is between the conductive pattern and the second interlayer insulating layer and a second portion that is between the conductive pattern and the lower interconnection line,
wherein the first portion of the barrier pattern has a first nitrogen concentration, the second portion of the barrier pattern has a second nitrogen concentration, and the first nitrogen concentration is greater than the second nitrogen concentration, and
wherein the first portion of the barrier pattern has a first thickness, and the second portion of the barrier pattern has a second thickness, and the first thickness is greater than the second thickness.

2. The semiconductor device of claim 1, wherein the first nitrogen concentration ranges from 10 at % to 60 at %, and
wherein the second nitrogen concentration is less than 5 at %.

3. The semiconductor device of claim 1, wherein the first portion of the barrier pattern comprises a first barrier layer, and
the second portion of the barrier pattern comprises a second barrier layer.

4. The semiconductor device of claim 3, wherein an upper surface of the lower interconnection line includes a first surface covered by the etch stop layer and a second surface contacting the via portion, wherein the second surface is lower than the first surface relative to the substrate, and the upper surface of the lower interconnection line includes a recess defined by the second surface, and wherein the second barrier layer is in the recess and is in contact with the second surface.

5. The semiconductor device of claim 4, wherein the second barrier layer includes a second bottom surface, and
wherein the second bottom surface covers at least 80% of the second surface of the lower interconnection line.

6. The semiconductor device of claim 5, wherein the first barrier layer includes a first bottom surface covering at least a portion of the second surface of the lower interconnection line, and
wherein the second bottom surface covers a remaining portion of the second surface that the first bottom surface does not cover.

7. The semiconductor device of claim 3, wherein the first barrier layer includes a tantalum nitride layer, a titanium nitride layer, and/or a manganese nitride layer, and
wherein the second barrier layer includes tantalum, titanium, tungsten, nickel, cobalt, platinum, and/or graphene.

8. The semiconductor device of claim 3, wherein an electrical resistivity of the first barrier layer is greater than an electrical resistivity of the second barrier layer.

9. The semiconductor device of claim 3, wherein a thickness of the first barrier layer is greater than a thickness of the second barrier layer.

10. The semiconductor device of claim 3, wherein a concentration of nitrogen of the first barrier layer ranges from 10 at % to 60 at %, and
wherein a concentration of nitrogen of the second barrier layer is less than 5 at %.

11. The semiconductor device of claim 1, wherein the conductive pattern comprises a first conductive layer on the barrier pattern and a second conductive layer on the first conductive layer, and
wherein the first and second conductive layers include different metals and include copper, cobalt, ruthenium, tungsten, molybdenum, aluminum, silver, and/or gold.

12. The semiconductor device of claim 1, further comprising:
an active pattern on the substrate;
a plurality of channel patterns on the active pattern, the plurality of channel patterns being vertically staked and spaced apart from each other;
a source/drain pattern on the active pattern, the source/drain pattern being connected to the plurality of channel patterns; and
an active contact on the source/drain pattern,
wherein the lower interconnection line is electrically connected to the active contact.

13. The semiconductor device of claim 12, further comprising:
a gate electrode on the plurality of channel patterns; and
a gate dielectric pattern between the gate electrode and the plurality of channel patterns,
wherein the gate electrode surrounds at least one of the plurality of channel patterns.

14. The semiconductor device of claim 12, further comprising a via that is in the first interlayer insulating layer and is between the active contact and the lower interconnection line,
wherein the via is configured to connect the active contact and the lower interconnection line.

15. The semiconductor device of claim 1, wherein the lower interconnection line comprises:
a pair of first lower interconnection lines configured to receive a drain voltage (VDD) and a source voltage (VSS), respectively; and
second lower interconnection lines that are between the pair of first lower interconnection lines,
wherein the semiconductor device comprises a single logic cell that includes a portion of each of the pair of first lower interconnection lines and the second lower interconnection lines.

* * * * *